US012669523B2

(12) United States Patent
Steuer et al.

(10) Patent No.: US 12,669,523 B2
(45) Date of Patent: Jun. 30, 2026

(54) NON-CONTACT ELECTRICAL PARAMETER MEASUREMENT DEVICE WITH RADIAL DUAL MOUNTED SENSORS

(71) Applicant: Fluke Corporation, Everett, WA (US)

(72) Inventors: Ronald Steuer, Hinterbruhl (AT); Christian K. Schmitzer, Brunn am Gebirge (AT)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 18/589,196

(22) Filed: Feb. 27, 2024

(65) Prior Publication Data

US 2024/0230722 A1 Jul. 11, 2024

Related U.S. Application Data

(63) Continuation of application No. 17/476,054, filed on Sep. 15, 2021, now Pat. No. 11,933,821.

(Continued)

(51) Int. Cl.

*G01R 15/18* (2006.01)
*G01R 19/00* (2006.01)
*G01R 33/09* (2006.01)

(52) U.S. Cl.

CPC ....... *G01R 15/181* (2013.01); *G01R 19/0092* (2013.01); *G01R 33/09* (2013.01)

(58) Field of Classification Search

CPC .... G01R 15/181; G01R 15/207; G01R 15/12; G01R 19/0092; G01R 19/16528; G01R 33/09

See application file for complete search history.

(56) References Cited

U.S. PATENT DOCUMENTS 6,717,397 B2 4/2004 Sorenson, Jr.
6,825,650 B1 * 11/2004 McCormack ........ G01R 22/065 324/126

(Continued)

FOREIGN PATENT DOCUMENTS

CN 107179434 A 9/2017
CN 209264810 U 8/2019

(Continued)

OTHER PUBLICATIONS

International Search Report and Written Opinion, mailed Jan. 18, 2022, for International Application No. PCT/US2021/050446, 13 pages.

(Continued)

*Primary Examiner* — Dominic E Hawkins
(74) *Attorney, Agent, or Firm* — Seed Intellectual Property Law Group LLP

(57) ABSTRACT

Systems and methods for operating and calibrating electrical parameter measurement devices are provided herein. The devices may include a current sensor that includes a plurality of magnetic field sensors positioned around a measurement area that receive a current carrying conductor under test. The sensor may include a plurality of concentric rings of magnetic field sensors that provide accurate measurements that ignore magnetic fields from conductors or other components outside of the measurement area. The sensors may be used to determine the position of a conductor under test, and such information may be used to produce accurate measurements by accounting for the conductor's position. A calibration system may also be provided that is operative to generate calibration data that is subsequently used to provide more accurate measurements. The calibration data may include one or more lookup tables, coefficients for one or more mathematical formulas, or other types of data.

20 Claims, 33 Drawing Sheets

Related U.S. Application Data

(60) Provisional application No. 63/078,727, filed on Sep. 15, 2020.

(56) References Cited

U.S. PATENT DOCUMENTS

| | | | | |
|---|---|---|---|---|
| 7,164,263 | B2 | 1/2007 | Yakymyshyn et al. | |
| 10,557,875 | B2 | 2/2020 | Steuer et al. | |
| 2003/0112000 | A1 | 6/2003 | Sorenson, Jr. | |
| 2005/0156587 | A1 | 7/2005 | Yakymyshyn et al. | |
| 2007/0057662 | A1 * | 3/2007 | Yakymyshyn ....... | G01R 15/207 324/117 R |
| 2010/0194384 | A1 | 8/2010 | Hammerschmidt | |
| 2011/0121827 | A1 | 5/2011 | Yakymyshyn et al. | |
| 2012/0290240 | A1 * | 11/2012 | Fukui ..................... | G01R 15/20 702/65 |
| 2013/0116955 | A1 | 5/2013 | Williams | |
| 2016/0014916 | A1 | 1/2016 | Ausserlechner et al. | |
| 2016/0047846 | A1 | 2/2016 | Sharma et al. | |
| 2017/0184635 | A1 | 6/2017 | Ugge et al. | |
| 2018/0136257 | A1 * | 5/2018 | Steuer .................. | G01R 15/125 |
| 2018/0136260 | A1 | 5/2018 | Rodriguez et al. | |
| 2019/0146009 | A1 | 5/2019 | Blanchard et al. | |
| 2019/0293689 | A1 * | 9/2019 | Lerner ................. | G01R 15/202 |
| 2019/0346484 | A1 | 11/2019 | Worones | |

FOREIGN PATENT DOCUMENTS

| | | | |
|---|---|---|---|
| CN | 111624389 | A | 9/2020 |
| DE | 10 2015 100 924 | B3 | 6/2016 |
| JP | 2007-107972 | A | 4/2007 |
| JP | 2012251993 | A | 12/2012 |
| JP | WO2016021480 | A1 | 4/2017 |
| JP | 2019215329 | A | 12/2019 |
| TW | 201830034 | A | 8/2018 |
| WO | 2019179957 | A1 | 9/2019 |

OTHER PUBLICATIONS

Meng et al., "Magnetic Sensor Array-Based AC Current Measurement for Multiconductor Cables Using Evolutionary Computation Method," *IEEE Transactions on Instrumentation and Measurement 64* (10):2747-2758, Oct. 2015.

Taiwan Search Report for Taiwan Application No. 110134443 (Mar. 24, 2025)(1 page).

* cited by examiner

2100

| X[mm] | Y[mm] | IREF1[pA] | VCAL1 | IREF2[pA] | VCAL2 | IREF3[pA] | VCAL3 |
|---|---|---|---|---|---|---|---|
| −14.00 | −14.00 | 95991 | 2.2490 | 285078 | 1.4713 | 95991 | 2.2490 |
| −12.00 | −14.00 | 97249 | 2.2080 | 422909 | 1.3576 | 97249 | 2.2080 |
| −10.00 | −14.00 | 98259 | 2.1784 | 604488 | 1.2966 | 98259 | 2.1784 |
| −8.00 | −14.00 | 99053 | 2.1582 | 738948 | 1.2715 | 99053 | 2.1582 |
| −6.00 | −14.00 | 99671 | 2.1436 | 832442 | 1.2579 | 99671 | 2.1436 |
| −4.00 | −14.00 | 99993 | 2.1363 | 907328 | 1.2487 | 99993 | 2.1363 |
| −2.00 | −14.00 | 100108 | 2.1342 | 97120 | 1.2415 | 10010 | 2.1342 |
| 0.00 | −14.00 | 100014 | 2.13951 | 1.2353 | 10001 | 10001 | 2.13951 |
| 2.00 | −14.00 | 99857 | 2.1448 | 1.2325 | 99857 | 99857 | 2.14481 |
| 4.00 | −14.00 | 99537 | 2.1559 | 1.2299 | 99537 | 99537 | 2.15591 |
| 6.00 | −14.00 | 99215 | 2.16996 | 1.2283 | 99215 | 99215 | 2.16991 |
| 8.00 | −14.00 | 99012 | 2.179 | 1.2282 | 99042 | 99042 | 2.17911 |
| 10.00 | −14.00 | 98848 | 2.18 | 1.2278 | 98848 | 98848 | 2.18581 |
| −16.00 | −12.00 | 99444 | 2.1404 | 220854 | 1.5864 | 99444 | 2.1404 |
| −14.00 | −12.00 | 101100 | 2.0982 | 262848 | 1.4951 | 101100 | 2.0982 |
| −12.00 | −12.00 | 102529 | 2.0610 | 323279 | 1.4172 | 102529 | 2.0610 |
| −10.00 | −12.00 | 103696 | 2.0358 | 393680 | 1.3630 | 103696 | 2.0358 |
| −8.00 | −12.00 | 104598 | 2.0157 | 457881 | 1.3296 | 103777 | 2.0158 |

| DIST[mm] | ref_pk[pA] | CALF |
|---|---|---|
| 1 | 331138 | 1.0725 |
| 2 | 244567 | 1.0771 |
| 3 | 197113 | 1.0813 |
| 4 | 162398 | 1.0865 |
| 5 | 140042 | 1.0912 |
| 6 | 119995 | 1.0984 |
| 7 | 105925 | 1.1057 |
| 8 | 92459 | 1.1156 |
| 9 | 82842 | 1.1256 |
| 10 | 74326 | 1.1374 |
| 11 | 68030 | 1.1489 |
| 12 | 62288 | 1.1628 |
| 13 | 57220 | 1.1787 |
| 14 | 52818 | 1.1962 |
| 15 | 48493 | 1.2177 |
| 16 | 45661 | 1.2358 |

| JAW CORDINATES | | SWEETSPOT | | CALSET | | METHOD | RESULT |
|---|---|---|---|---|---|---|---|
| X | Y | dd | ERROR | dd | DIFFERENCE | | |
| 10 | 24 | 3.2 | 1.3% | 0.3 | −0.5% | CalSet: | −0.5% |
| 12 | 24 | 5.1 | 1.5% | 0.4 | −0.2% | CalSet: | −0.2% |
| −12 | 26 | 2.9 | −1.2% | 0.1 | −1.0% | CalSet: | −1.0% |
| −10 | 26 | 2.3 | −1.6% | 0 | −0.7% | CalSet: | −0.7% |
| −8 | 26 | 2 | −1.6% | 0 | −0.6% | SwSpot: | −1.6% |
| −6 | 26 | 1.8 | −0.9% | 0 | −0.4% | SwSpot: | −0.9% |
| −4 | 26 | 1.5 | −0.4% | 0 | −0.3% | SwSpot: | −0.4% |
| −2 | 26 | 1.2 | 0.7% | 0 | −0.3% | SwSpot: | 0.7% |
| 0 | 26 | 0.9 | 0.9% | 0 | −0.4% | SwSpot: | 0.9% |
| 2 | 26 | 0.7 | 0.0% | 0 | −0.4% | SwSpot: | 0.0% |
| 4 | 26 | 0.7 | −0.5% | 0 | −0.3% | SwSpot: | −0.5% |
| 6 | 26 | 1.2 | 0.4% | 0 | −0.3% | SwSpot: | 0.4% |
| 8 | 26 | 2.3 | 1.2% | 0.1 | −0.3% | CalSet: | −0.3% |
| 10 | 26 | 4.2 | 1.6% | 0 | −0.3% | CalSet: | −0.3% |
| 12 | 26 | 7.3 | 1.1% | 0.1 | −0.1% | CalSet: | −0.1% |
| −12 | 28 | 4.3 | 0.1% | 0.3 | −0.3% | CalSet: | −0.3% |
| −10 | 28 | 3.1 | −0.3% | 0.2 | −0.4% | CalSet: | −0.4% |
| −8 | 28 | 2.3 | −0.8% | 0.1 | −0.3% | CalSet: | −0.3% |
| −6 | 28 | 1.8 | −1.0% | 0 | −0.2% | SwSpot: | −1.0% |
| −4 | 28 | 1.6 | −0.3% | 0 | 0.0% | SwSpot: | −0.3% |
| −2 | 28 | 1.2 | 0.2% | 0.1 | 0.1% | SwSpot: | 0.2% |
| 0 | 28 | 0.8 | 0.7% | 0.3 | −0.2% | SwSpot: | 0.7% |

FIG. 37

NON-CONTACT ELECTRICAL PARAMETER MEASUREMENT DEVICE WITH RADIAL DUAL MOUNTED SENSORS

BACKGROUND

Technical Field

The present disclosure generally relates to electrical parameter measurement devices, and more particularly, to non-contact electrical parameter measurement devices.

Description of the Related Art

Voltmeters are instruments used for measuring voltage in an electric circuit. Instruments which measure more than one electrical characteristic are referred to as multimeters, and operate to measure a number of parameters generally needed for troubleshooting, service, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of a particular application.

With conventional voltmeters or multimeters that measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

A general purpose multimeter employing an internal current shunt may be limited to ten amperes maximum, for example, because of the capacity of the multimeter test leads and circuitry to carry the current. Furthermore, the multimeter generally must be protected with an internal fuse to prevent excessive current levels from flowing through the multimeter, both for safety reasons and to prevent damage to the multimeter. The difficulty in removing a blown fuse, coupled with the time and cost necessary to procure a replacement fuse, make it desirable to obtain a non-contact current measuring instrument that requires no internal fuse.

Clamp-on multimeters provide improved capability for measuring current over general purpose multimeters by employing an integral current clamp that senses the current in the current-carrying conductor without having to cut the current-carrying conductor or break the circuit including the current-carrying conductor. A current clamp is typically provided in the same housing with a multimeter that measures other parameters such as voltage and resistance in the conventional manner using separate test probes. The current clamp is closed around the current-carrying conductor to sense the magnetic field created by the current flow. The current clamp provides a voltage signal for measurement by the multimeter which calculates and displays the measured current level. Because there is no current shunted from the current-carrying conductor through the clamp-on multimeter, the constraint on the maximum current that may be measured has largely been eliminated. Likewise, the internal fuse has been eliminated in clamp-on multimeters.

In order to obtain a valid current measurement, the magnetic core in the current clamp must encircle the current-carrying conductor so that the current clamp is closed. The current clamp must be mechanically actuated to open the jaws, the current-carrying conductor inserted, and the jaws then closed around the current-carrying conductor. The jaws must be aligned to complete the magnetic core for obtaining a valid current measurement. Clamp-on multimeters also tend to be physically heavy because of the substantial amount of iron used on the magnetic core. Furthermore, high levels of current may saturate the magnetic core. The current measuring capacity of the clamp-on multimeter is accordingly limited to current levels that do not saturate the magnetic core. In addition, the performance for frequency bandwidth and phase angle is also limited depending on the magnetic material.

Also other magnetic field/flux measuring methods, such as Rogowski coils, have other disadvantages, e.g., not capable of measuring DC currents and requiring an integrator to recover the original current waveform and magnitude.

Further, for some electrical parameter measurement devices, such as current clamps or split core transformers, a conductor under test may be free to be positioned at various physical locations within a front end or probe end of the measurement device. In certain instances, the variable position of the conductor under test may negatively affect the measurement of one or more electrical parameters (e.g., voltage, current, power) of the conductor under test, thereby leading to inaccurate measurement results. Thus, it would be advantageous to determine the position of the conductor under test and/or to compensate for the determined position when performing measurement of one or more electrical parameters.

BRIEF SUMMARY

An electrical parameter measurement device may be summarized as including a front end that includes an opening that is sized and dimensioned to receive a conductor under test; a plurality of magnetic field sensors disposed on a support member around the opening, the plurality of magnetic field sensors comprising a first set of equally spaced apart magnetic field sensors positioned at a first radial distance from a center of the opening, and a second set of equally spaced apart magnetic field sensors positioned a second radial distance from the center of the opening, the second radial distance being greater than the first radial distance, and each magnetic field sensor in the first set is radially aligned with a corresponding magnetic field sensor in the second set; and control circuitry operatively coupled to the plurality of magnetic field sensors, the control circuitry being configured to: receive at least one sensor signal from the plurality of magnetic field sensors; determine a physical position of the conductor under test based at least in part on the received at least one sensor signal; and determine a current parameter of the conductor based at least in part on the received at least one sensor signal and the determined physical location. The current parameter may include alternating current (AC) or direct current (DC). Each of the plurality of magnetic field sensors may include at least one of an anisotropic magnetoresistance (AMR) sensor, a giant magnetoresistance (GMR) sensor, a Hall effect sensor, a fluxgate sensor, or a coil. The control circuitry may be configured to determine the physical position of the conductor under test using sensor signals from exactly two of the magnetic field sensors. At least one of the plurality of magnetic field sensors may include a first sub-sensor and a second sub-sensor arranged at a 90 degree angle relative to the first sub-sensor. Each of the plurality of magnetic field sensors may be formed in an integrated circuit that includes at least one of the other of the magnetic field sensors. Each magnetic field sensor of the first set may be formed in an integrated circuit with its corresponding, radially aligned magnetic field sensor of the second set. Each of the magnetic field sensors of the first set of magnetic field sensors may be coupled in series with each other, and each of the magnetic field sensors of the second set of magnetic field sensors may be coupled in series with each other. Each of the magnetic field sensors may be separately coupled to the control circuitry.

The plurality of magnetic field sensors may include a third set of equally spaced apart magnetic field sensors positioned a third radial distance from the center of the opening that is great than the second radial distance, and the control circuitry may be operative to: determine that at least one of the magnetic field sensors of the first set of magnetic field sensors is saturated due to the amount of current in the conductor under test; and determine the current parameter of the conductor based at least in part on sensor signals from the second and third sets of the magnetic field sensors. To determine the current parameter of the conductor, the control circuitry may be configured to apply a calibration factor that is dependent on the determined physical position of the conductor under test. The control circuitry may be configured to determine that at least one of the magnetic field sensors is saturated, and to ignore the sensor signal from the at least one magnetic field sensor to determine the current parameter of the conductor under test. The control circuitry may be configured to determine that at least one of the magnetic field sensors is saturated, and responsive to the determination, to replace the sensor signal for the saturated magnetic field sensor with an interpolated sensor signal obtained using sensor signals from magnetic field sensors positioned adjacent the saturated magnetic field sensor.

The electrical parameter measurement device may further include a plurality of non-contact voltage sensors operatively coupled to the control circuitry, wherein the control circuitry determines the physical position of the conductor under test based at least in part on sensor signals received from the plurality of non-contact voltage sensors. The control circuitry may be configured to determine a voltage parameter of the conductor under test based at least in part on sensor signals received from the plurality of non-contact voltage sensors. Each of the plurality of magnetic field sensors may be operative to determine a direction of a magnetic field generated by the conductor under test. The control circuitry may apply a unique calibration factor for each of the plurality of magnetic field sensors.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings. Also the number of single elements, e.g., arranged in a ring in some of the drawings, is an example and depends on the required accuracy for a particular application.

FIG. 21 is a table that shows position dependent calibration factors for three conductive sensors at various positions, according to one non-limiting illustrated implementation.

FIG. 22 is a table that shows position dependent calibration factors for a single conductive sensor when a conductor under test is positioned at various distances from the conductive sensor, according to one non-limiting illustrated implementation.

FIG. 37 is a table that shows the output for various x/y positions of a conductor under test, which may be used to determine which of a plurality of calibration methods to use for the conductor under test, according to one non-limiting illustrated implementation.

DETAILED DESCRIPTION

Figure 1:
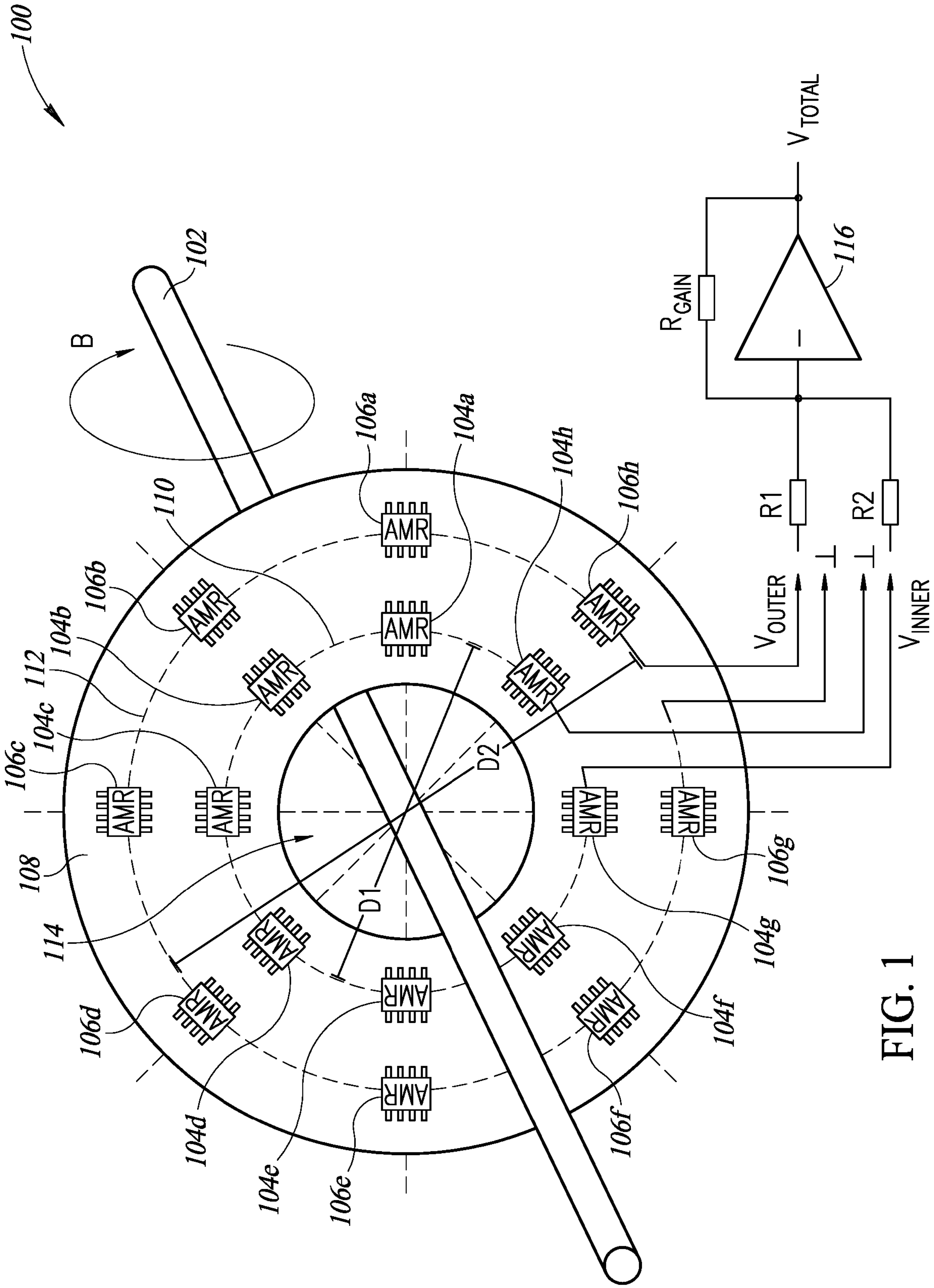
FIG. 1 is a schematic diagram of an electrical parameter measurement device that utilizes magnetic sensors to measure AC or DC currents, according to one non-limiting illustrated implementation.

Systems and methods of the present disclosure are directed to electrical parameter measurement devices that utilize magnetic sensors to measure AC and/or DC currents in a conductor without requiring galvanic contact between the electrical parameter measurement device and the conductor under test. Systems and methods of the present disclosure also advantageously provide for calibration of electrical parameter measurement devices, such as contact and non-contact "reference signal" type measurement devices, clamp meters, and split core transformers, as well as conductor position determination for such devices and other devices. Initially, with reference to FIGS. 1-10, electrical parameter measurement devices that utilize radially mounted sensors are discussed. Then, with reference to FIGS. 11A-14, various examples of reference signal type measurement devices are discussed. Further, with respect to FIGS. 15-30, various calibration systems and associated devices and methods are discussed. The various embodiments and features of the present disclosure may be combined in any suitable manner to provide electrical parameter measurement devices for various applications.

In at least some implementations, the calibration systems and methods disclosed herein may be used to calibrate non-contact measurement devices in which measurement of one or more alternating current (AC) electrical parameters in an insulated wire is performed without requiring a galvanic connection between the insulated wire and a test electrode or probe. The calibration systems and methods may also be used to calibrate conventional contact type measurement devices that generate and detect reference signals and which utilize conductive test leads or probes in galvanic contact with conductors under test. Non-limiting examples of measurement devices with which the implementations discussed herein may be used include digital multimeters, current clamps and split-core transformers.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Radial, Dual Mounted Multiple Sensor Electrical Parameter Measurement Devices

FIG. 1 shows a circuit diagram of an electrical parameter measurement device 100 that is operative to measure current in a conductor 102 under test. In the illustrated implementation, the device 100 includes 16 substantially identical sensors 104*a*-104*h* ("sensors 104) and 106*a*-106*h* ("sensors 106") that are mounted on a support member 108 of electrically insulating material, such as a circuit board. The sensors 104 are mounted on the support member 108 substantially equally spaced around a first circle of diameter D1 and are connected in series by a non-magnetic conductor 110 (e.g., wire, circuit board trace). Similarly, the sensors 106 are mounted on the support member 108 substantially equally spaced around a second circle of diameter D2 and are connected in series by a second conductor 112. The second circle is larger than and substantially concentric with the first circle. In at least some implementations, the magnetic axis of each of the sensors 104, 106 is tangential to the respective circle on which it lies, and each sensor 104 is substantially radially aligned with a respective one of the sensors 106, i.e., the sensors are radially aligned in pairs 104*a*/106*a*, 104*b*/106*b*, 104*c*/106*c*, etc. That is, each pair includes a sensor 104 that is linearly arranged in a radial direction with a respective sensor 106. In the illustrated example, since there are eight equally spaced sensors in each ring of sensors, each of the sensors in the ring is spaced apart by 45 degrees. In other implementations, depending on the number of sensors, the sensors in a ring may be spaced apart by a different angle (e.g., 90 degrees for 4 sensors in a ring, 60 degrees for 6 sensors in a ring, 30 degrees for 12 sensors in a ring).

In at least some implementations, such as the implementation of FIG. 3 discussed below, the support member 108 may include a slot extending from its periphery to a point beyond the center region 114. Such a slot allows the conductor 102 under test to be introduced into the center region 114 with the axis of the conductor normal to the plane containing the sensors 104 and 106 (i.e., normal to the plane of FIG. 1).

The device 100 of FIG. 1 is operative to measure AC and DC currents, depending on the sensor technology, with minimal influence from the position of the conductor 102 under test and with minimal impact from external current sources that are outside of the measurement area or central region 114. This is achieved by the symmetrical arrangement of the sensor pairs 104, 106 that measure the magnetic field produced by the conductor 102 at defined symmetrical locations (e.g., angle and distance from the center region 114). The device 100 utilizes dual compensation, as discussed further below. The sensors 104, 106 may be any of a number of types of magnetic sensing devices, including distributed coils, planar magnetics sensors (e.g., PCA coils), Hall effect sensors, flux gate sensors, anisotropic magnetoresistive (AMR) sensors (as shown), or any other suitable types of sensors.

As noted above, the sensors 104 may be operatively coupled together in series with each other such that their output voltages are summed together. Similarly, the sensors 106 may be operatively coupled together in series with each other. Depending on the relative distance between the inner circle and outer circle, a factor λ for subtracting the inner-outer voltage may be determined according to Equation (1) below:

$$v_{total} = v_{inner} \frac{v_{outer}}{\lambda} = v_{inner} \times \left(1 - \frac{v_{outer}}{v_{inner}} \times \frac{1}{\lambda}\right) \quad (1)$$

This technique may be used for any magnetic sensor, including distributed "air coils," as discussed further below. An advantage of this magnetic field sensing technology is that measurement is done non-invasively and the sensors reject interference from other external fields injected from adjacent conductors outside the sensors. Further, this measurement method offers significantly lower cost, with higher performance/accuracy levels than other conventional measurement solutions. For instance, there is no need for a "magnetic concentrator," such as an iron core, in at least some of the implementations discussed herein.

To provide an accurate measurement, the output signal from each sensor 104, 106 for a given magnetic field for a wire in the center should be the same. This can be achieved by calibrating each of the sensors 104, 106 individually, or by calibrating each set of sensors together. There is a wire position influence for the output magnitude of each sensor. The summed output voltages partially compensate/reduce this position influence depending on the number of sensors.

For an external parasitic stray current source, the ratio of the summed output voltages in each loop of sensors 104 and 106 is nearly constant irrespective of the magnitude or position of the external source. This ratio may be expressed as $V_{OUTER}/V_{INNER}$. As a result, the external field effects are canceled if the correct proportion of the output voltage in the outer loop, $V_{OUTER}$ is subtracted from the voltage of the inner loop, $V_{INNER}$, e.g., by selecting $\lambda = V_{OUTER}/V_{INNER}$, which implies that $V_{total}=0$.

To measure the current in the conductor 102 under test, and optimized transducer design provides a $V_{OUTER}/V_{INNER}$ of λ/2, again irrespective of the position of the conductor 102. As a result, the usable signal for the measurement is approximately $V_{TOTAL}=V_{INNER}/2$, which results in approximately half of the signal collected by one concentric chain of sensors 104, 106 being used for the measurement. Thus, this arrangement allows for the cancellation of the signals due to external current sources, and uses approximately 50 percent of the potentially available signal for the measurement. The more sensors that are used, the greater the suppression of external currents is achieved.

The device 100 includes a differential amplifier circuit 116 that is operative to subtract the outer voltage $V_{OUTER}$ from the inner voltage $V_{INNER}$. The total output voltage $V_{TOTAL}$, is derived by applying the voltages $V_{OUTER}$ and $V_{INNER}$ over resistors R1 and R2, respectively, in common to the inverting input of the differential amplifier circuit 116 having a feedback resistor $R_{GAIN}$. Optionally, a capacitor may also be placed in parallel with the feedback resistor $R_{GAIN}$ to remove the frequency dependency of the input voltages. The proportion of the outer voltage $V_{OUTER}$ that is subtracted from the inner voltage $V_{INNER}$ at the output of the amplifier circuit 116 is directly proportional to the ratio of the resistor values R2/R1, so that by appropriate choice of R1 and R2 the desired value for $V_{TOTAL}$ can be obtained. In at least some implementations, the value of R2 is equal to R1×λ.

Figure 2:
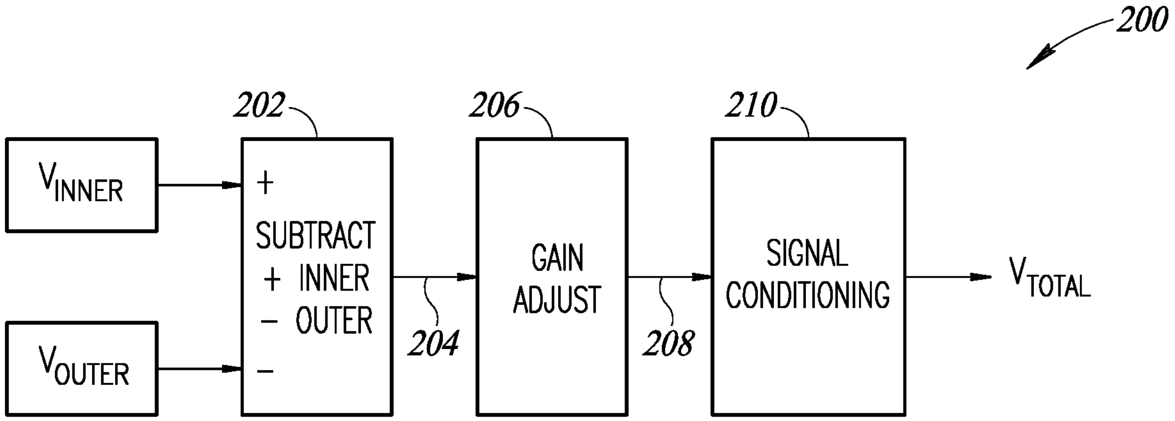
FIG. 2 is a block diagram that illustrates various front-end components of the electrical parameter measurement device of FIG. 1.

FIG. 2 shows a block diagram 200 of the components of a circuit that comprises a transducer or probe of the device 100. As shown, the input voltage $V_{OUTER}$ is subtracted from the input voltage $V_{INNER}$ by a summer/integrator 202, which may be similar or identical to the amplifier circuit 116 of FIG. 1. The resulting signal 204 is directly proportional to the current of the conductor 102 under test. The signal 204 is provided to a gain adjust circuit or stage 206, which is operative to adjust the gain of the signal 204 to a suitable level. The gain adjust circuit 206 may be provided because it may be difficult or impossible to integrate the input signals and adjust the gain to calibrate the unit in a single stage without affecting the inner/outer signal ratio. The signal 208 output from the gain adjust circuit 206 may be provided to a signal conditioning circuit or component 210, which is operative to generate various output types, such as instantaneous current, RMS current, etc., with various ranges or types of output levels (e.g., 0 to 20 mA, 4 to 20 mA, millivolts, volts).

Figure 3:
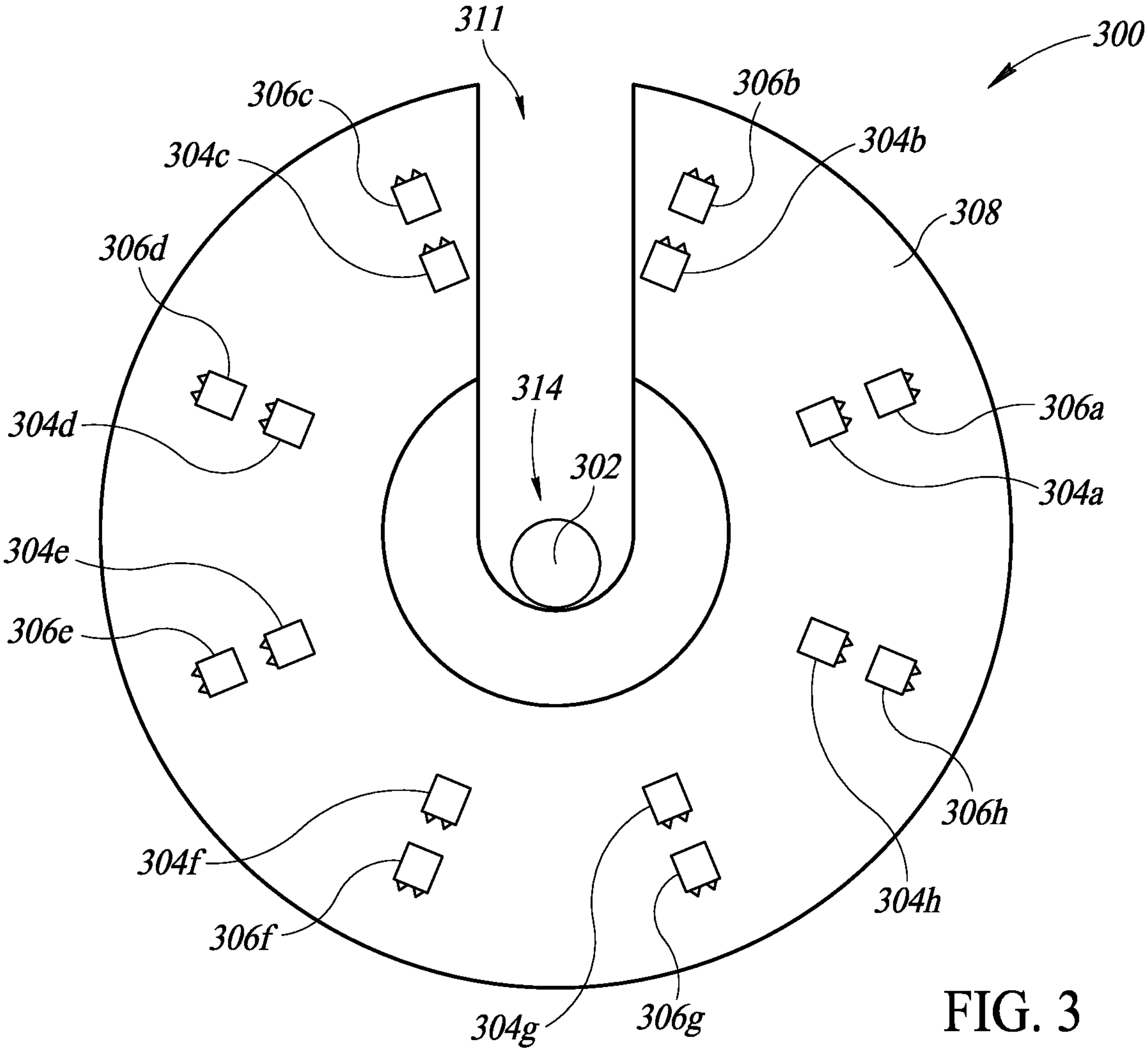
FIG. 3 is a pictorial view of a front end or probe portion of an electrical parameter measurement device, showing an example sensor arrangement thereof.

FIG. 3 is a pictorial view of a portion of an electrical parameter measurement device 300, showing an example sensor arrangement thereof. In the illustrated implementation, the device 300 includes 16 substantially identical sensors 304*a*-304*h* ("sensors 304) and 306*a*-306*h* ("sensors 306") that are mounted on a support member 308 of electrically insulating material, such as a circuit board. The sensors 304 and 306 may be similar or identical to the sensors 104 and 106, respectively, discussed above with respect to FIG. 1. Although not shown for the sake of clarity, the sensors 304 and 306 may be coupled to appropriate circuitry to obtain measurements therefrom, as discussed above.

The support member 308 may include a slot 311 extending from its periphery to a point beyond a center region 314. Such a slot allows a conductor 302 under test to be introduced into the center region 314 with the axis of the conductor normal to the plane containing the sensors 304 and 306 (i.e., normal to the plane of FIG. 3).

Since at least some of the implementations of the present disclosure utilizes magnetic field sensors without field concentrators as a sensing element, there is no impact from a field concentrator, such as magnetic hysteresis or non-linearity, as is present in a current transformer with a magnetic core, for example. As discussed above, the current from the conductor 302 under test generates a voltage in the sensors 304 and 306 that is proportional to the magnetic field, depending on the sensor type and internal sensor compensation (e.g., a bridge circuit), which allows DC currents to be measured in addition to AC currents.

For AMR sensors or other types of sensors that have a relatively low saturation level, additional concentric rings of sensors may be provided in some implementations, which allows the device to switch to a larger concentric ring of sensors with a lower magnetic field in the case of high current in the conductor under test. As an example, the device 300 may include three or more concentric rings of sensors, and two of the three or more rings may be used for the actual measurement to avoid saturation dependent on the magnitude of the current being measured. For larger currents, pairs of concentric rings of sensors toward an outer periphery of the support member 308 may be used, whereas pairs of concentric rings of sensors toward the center of the support member may be used for smaller currents.

The aperture formed by the slot may be sized and dimensioned in any suitable manner, and the slot may be fixed or selectively opened and closed (e.g., clamp-on meter with "jaws"). In at least some implementations, the slot is sized and dimensioned to provide an opening in the center region 314 that has a diameter that is between 20 mm and 160 mm, although other sizes may be provided.

Figure 4:
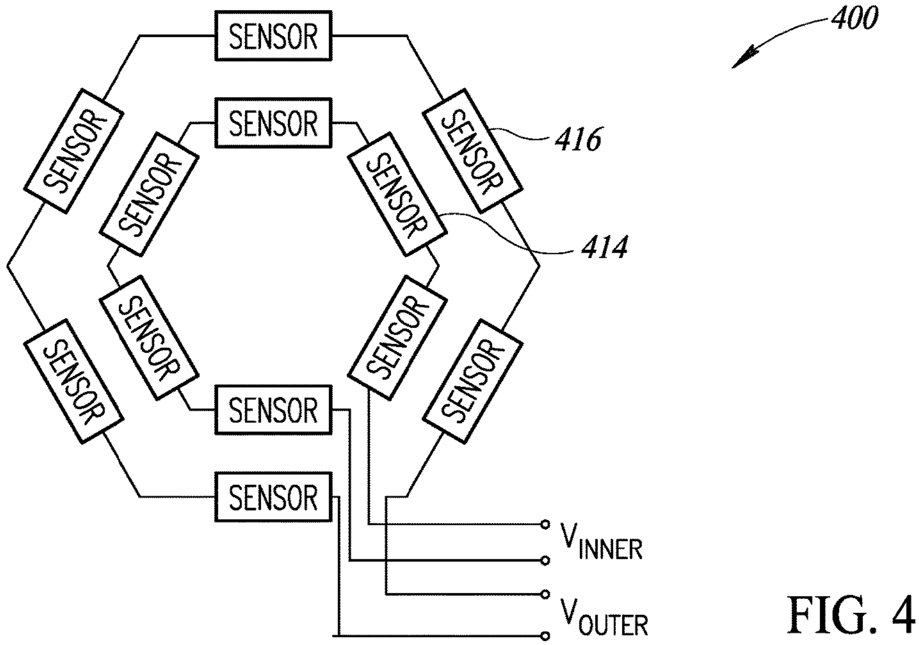
FIG. 4 is a schematic diagram that illustrates a physical arrangement of a plurality of magnetic sensors of an electrical parameter measurement device.
Figure 5A:
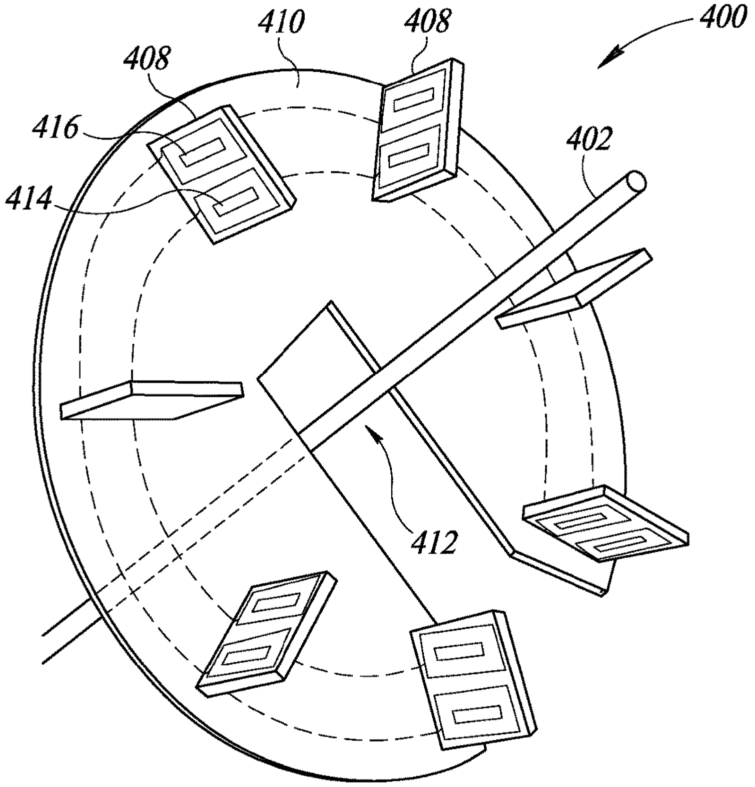
FIG. 5A is a perspective view of an electrical parameter measurement device that includes dual magnetic radial sensors, according to one non-limiting illustrated implementation.
Figure 5B:
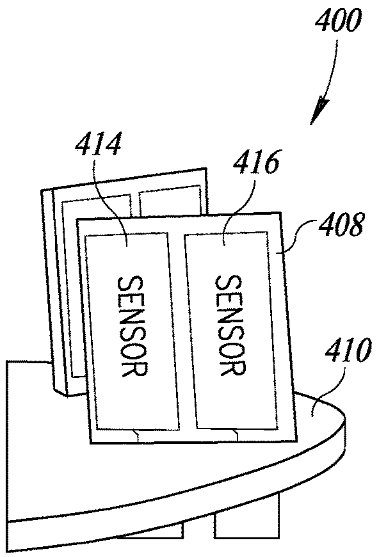
FIG. 5B is an enlarged view of a portion the electrical parameter measurement device of FIG. 5A that shows two radially spaced magnetic sensors of the electrical parameter measurement device.

FIGS. 4, 5A and 5B illustrate another example implementation of a device 400 that utilizes a multilayer printed circuit board for positioning magnetic sensors. As shown in FIG. 4, schematically, a plurality of inner sensors 414 may be arranged in an inner concentric ring and connected in series with each other, and a plurality of outer sensors 416 may be arranged in an outer concentric ring and connected in series with each other. The number of sensors in each ring may be any suitable number of sensors, such as 4 sensors, 6 sensors, 8 sensors, 20 sensors, etc. The number of sensor PCBs 408 may be selected by the required accuracy, position sensitivity, or external field rejection performance desired for a particular application.

As shown in FIGS. 5A and 5B, the device 400 includes a plurality of sensor PCBs 408 mounted to a base or support PCB 410 in a circle that surrounds a central portion 412 that receives a conductor 402 under test. Each sensor PCB 408 includes two separate sensors, one inner sensor 414 and one outer sensor 416 constructed on the multilayered PCB 408. The sensor PCBs 408 are mounted to the base PCB 410 at right angles to the PCB 410. The output of the sensors 414 are connected in series with each other to provide the inner voltage $V_{INNER}$, and the output of the sensors 416 are connected in series with each other to provide the outer voltage $V_{OUTER}$.

Advantages of the implementations of the present disclosure are that measurement is done non-invasively and the sensors reject interference from other external fields injected from adjacent conductors outside the sensors. This measurement method offers significantly lower cost, with higher performance and accuracy levels than other conventional measurement solutions. Moreover, at least some of the implementations discussed herein have at least some of the following benefits: capable of measuring AC or pulsed DC currents using coils as sensors and capable of measuring DC current using AMR sensors, Hall effect sensors, flux gate sensors, etc.; provide low positional error, which is dependent on the number of planar sensors; lightweight in comparison with current transformers; capable of handling high current overloads; provide low current consumption requirements; and provide an isolated output signal because of complete galvanic sensor isolation. These features make the implementations discussed herein suitable for portable applications and power quality monitoring where weight and battery life are an important design factor. Further, in at least some implementations, an air cored coil, such as a Rogowski coil, may be used as the sensing element, which means there is no magnetic hysteresis, saturation, or non-linearity, as is present for example in a current transformer with a magnetic core.

As discussed above, the use of semiconductor-based magnetic field sensors allows for DC current measurements in addition to AC current measurements. Any type of technology for measuring magnetic fields may be used, including Hall effect, flux gate, AMR, GMR, etc.

Figure 6:
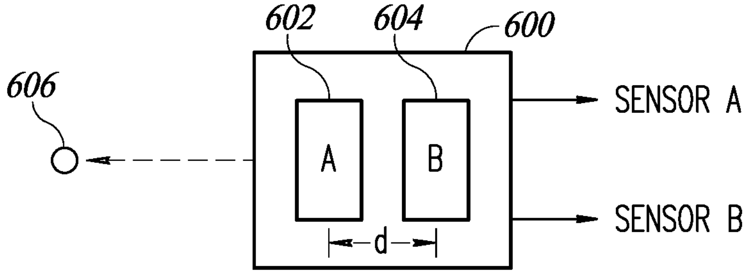
FIG. 6 is a diagram illustrating an example integrated dual sensor of an electrical parameter measurement device.

FIG. 6 is a diagram illustrating an example integrated dual sensor 600 of an electrical parameter measurement device, such as any of the electrical parameter measurement devices discussed herein. As an example, the dual sensor 600 may be used in place of each pair of radially spaced sensors 104 and 106 of the electrical parameter measurement device 100 of FIG. 1. In this implementation, the sensor 600 includes an inner sensor 602 ("sensor A") that is positioned relatively near a central region 606 of the device where a conductor (not shown) under test may be positioned during measurement. The sensor 600 also includes an outer sensor 604 ("sensor B") that is positioned farther from the central region 606 than the inner sensor 602. A distance 'd' between the sensors 602 and 604 is fixed. Thus, although in this integrated sensor implementation the sensitivity/suppression of external currents cannot be optimized or adjusted, the size and cost of the sensor 600 is significantly reduced compared to two separate sensors that are radially separated from each other, such as the sensors 104*a* and 106*a* of FIG. 1.

In at least some implementations, the individual sensor outputs may be used to determine the location of the conductor under test within the measurement area. Using the magnetic field detected from at least three sensors 600, triangulation may be used to determine the location of the conductor under test. If the location of the conductor is known, the wire influence can be compensated to further increase the accuracy. Also, a combination of other sensors, such as non-contact voltage sensors, in this arrangement can be used to determine the position or a combination of both triangulation results to verify the position accuracy or even compensate for other influences like non-perpendicular wires to the sensor plane.

Figure 7:
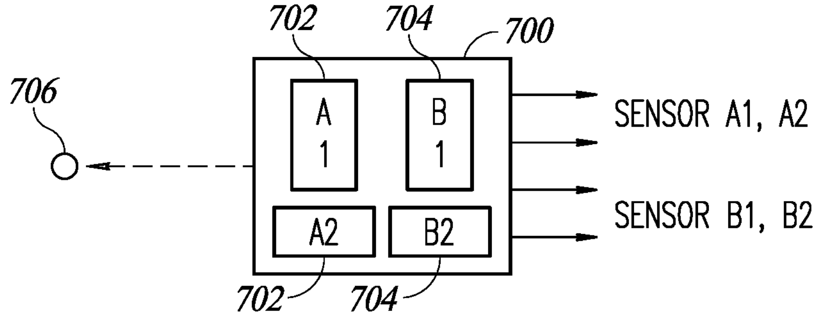
FIG. 7 is a diagram that illustrates an example integrated dual sensor of an electrical parameter measurement device that includes sensors rotated by 90 degrees to enable determination of the position of a conductor under test within a measurement area of the electrical parameter measurement device.

FIG. 7 is a diagram that illustrates an example integrated dual sensor 700 of an electrical parameter measurement device that enables determination of the position of the conductor under test using only two sensors. The sensor 700 includes an inner sensor 702 spaced relatively near a central measurement region 706 and an outer sensor 704 spaced further from the central region relative to the inner sensor 702. The inner sensor 702 includes sub-sensors A1 and A2 rotated by 90 degrees with respect to each other. The sensor 700 also includes an outer sensor 704 that includes sub-sensors B1 and B2 rotated by 90 degrees with respect to each other. Using the sine and cosine functions, the magnetic vector direction can be derived, as discussed below with reference to FIG. 8. Although the sensors 702 and 704 are shown as integrated into the sensor 700, in at least some implementations the sensors 702 and 704 may be independent sensors, which improves design flexibility but may increase the size and cost of the sensor.

Figure 8:
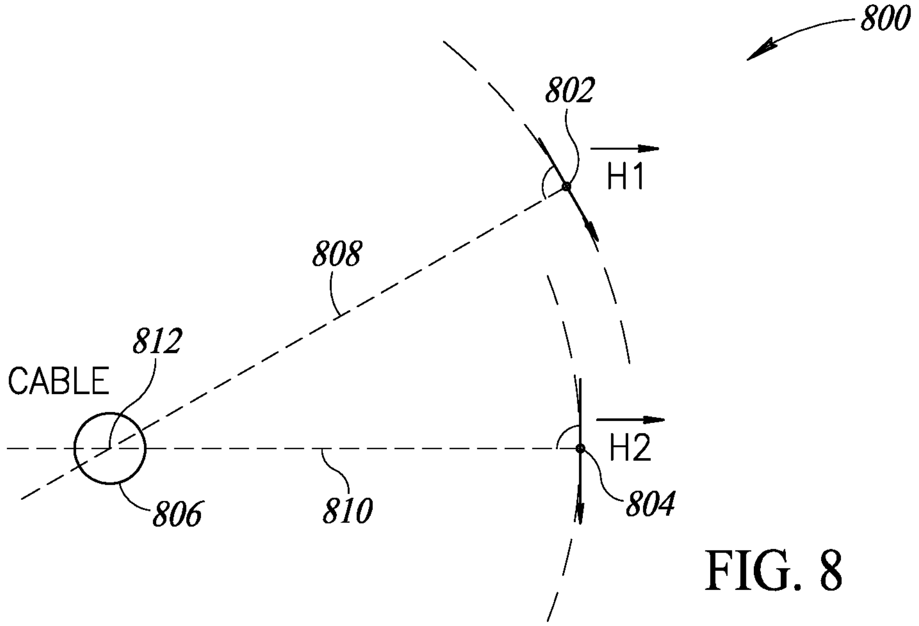
FIG. 8 is a diagram that illustrates use of two sensor pairs in an electrical parameter measurement device to determine the position of a conductor under test within a measurement area.

FIG. 8 is a diagram 800 that illustrates a technique in which two sensors 802 and 804, which may be similar or identical to the sensors 702 and 704, respectively, may be used to determine the position of a conductor 806 under test within a measurement area of an electrical parameter measurement device. As shown, using the dual sensors that indicate the direction of the magnetic field (H1, H2), perpendicular lines 808 and 810 to the fields H1 and H2, respectively, may be calculated, and the intersection point 812 of the lines indicates the position of the conductor 806 under test.

The physical position of the conductor may be determined by a mechanical means as well. For instance, a wire positioning mechanism may include a wire provided through a small opening in the electrical parameter measurement device to a predetermined position. Accordingly, in the event one or more sensors fail, the mechanical means may be used to determine a physical position of the conductor.

Figure 9:
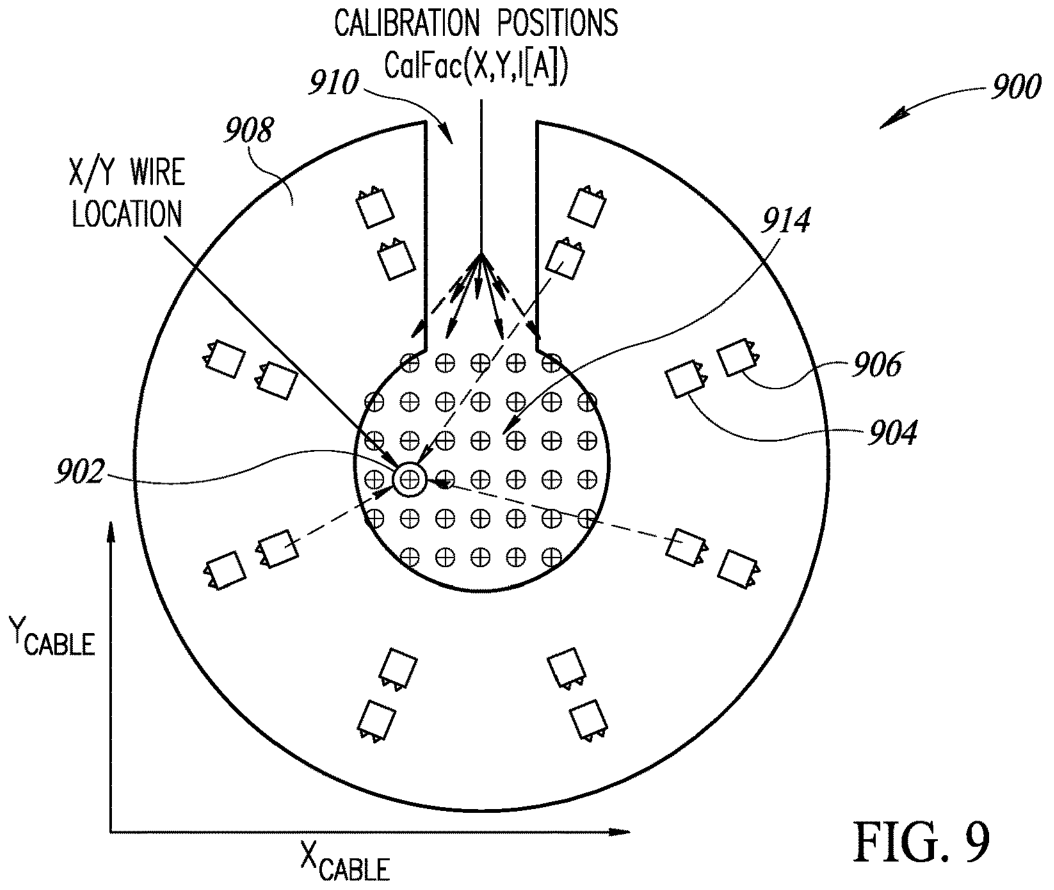
FIG. 9 is a pictorial diagram of a front end of an electrical parameter measurement device, showing the position of multiple sensors that may be used to determine the position of a conductor under test or to determine one or more calibration factors to be used to improve measurement accuracy, according to one non-limiting illustrated implementation.

FIG. 9 is a pictorial diagram of a front end of an electrical parameter measurement device 900, showing the position of multiple inner sensors 904 and outer sensors 906 that may be used to determine the position of a conductor 902 under test or to determine one or more calibration factors depending on the position to be used to improve measurement accuracy, according to one non-limiting illustrated implementation. In this case the individual sensor output signals are required for the triangulation. The sensors 904 and 906 may be mounted to a support member 908, as described above, and a slot 910 may be provided to allow the conductor 902 to be positioned within a central measurement area 914.

If the position of the conductor 902 is known, any position dependent deviations of the conductor may be corrected by one or more position dependent calibration factors. Additionally, signals from outside of the measurement area 914 may be suppressed. The technique for determining the position of the conductor 902 and generating calibration factors is discussed further below with reference to non-contact voltage implementations of the present disclosure. However, in this implementation, no voltage reference is needed to generate a reference current since the magnitude of the current measured by the sensors 904 and 906 can be directly used.

To generate the calibration factors, the conductor 902 conducting a known current may be moved about the measurement area 914. The current generates a measured signal in a plurality of the sensors 904 and 906, for example, at least three of the sensors. For each location, the plurality of sensor signals and a calibration factor is stored in a table. This process may be repeated for a plurality of different current values in the conductor 902. Then, during operation when measuring an unknown current, the tables are used to find the location of the conductor due to the ratio of the at least three measured sensor signals which then provides the calibration factor. Between the defined discrete magnitudes (e.g., x/y positions used for calibration), the calibration factor can be interpolated. This concept can be used for one or more (e.g., 2, 3, 4) sensor rings of an electrical parameter measurement device.

Figure 10:
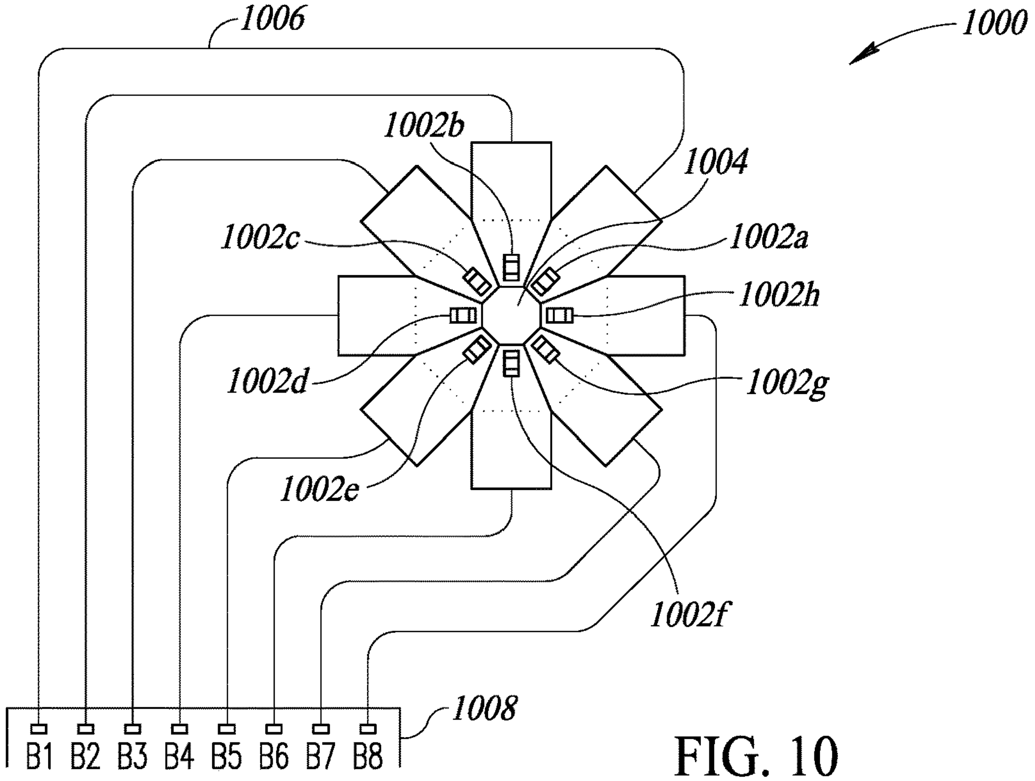
FIG. 10 is a pictorial diagram of an electrical parameter measurement device that includes multiple independent sensors that are each calibrated and measured independently from the other sensors, according to one non-limiting illustrated implementation.

FIG. 10 is a pictorial diagram of a front end portion an electrical parameter measurement device 1000 that includes multiple independent sensors 1002*a*-1002*h* that surround a measurement area 1004 and are each calibrated and measured independently from the other sensors. This configuration may further increase performance (e.g., accuracy, linearity, position sensitivity) by individually calibrating each sensor 1002 to deliver precise calibrated output signal in relation to the magnetic field. In the illustrated example, each of the sensors 1002*a*-1002*h* is coupled to a different input B1-B8 of circuit 1008 via conductor 1006. The circuit 1008 may be a microcontroller or other suitable circuit that includes input circuitry (e.g., A/D converter, etc.) capable of receiving signals output from the sensors 1002*a*-1002*h*. Each of the sensors 1002 is measured independent from the others. That is, the sensors 1002 not connected together in series in an inner and outer ring, as discussed above for other implementations. Although eight sensors 1002 are shown in FIG. 10 as an example, in other implementations fewer or more sensors may be used, and two or more concentric rings of sensors may be provided. Further, the measurements for the sensors (e.g., in a ring) may be summed or averaged, as discussed above, to produce the desired measurement outputs.

In at least some implementations, the range of the sensors 1002, such as AMR sensors, may be extended to compensate for saturation effects at high magnetic fields. Individual sensors close to the conductor that are running into high saturation may be excluded from the measurement integration and the value may be interpolated by both adjacent sensors.

The summing up of all sensor information of the outer sensor ring and the inner sensor ring may be more precise if each sensor is already calibrated and not just the total output signal. If the saturation effect of an individual sensor is too high to achieve a reasonable result, the signal from that sensor may be ignored and/or interpolated from adjacent sensors.

The example below shows the interpolation calculation for a saturated "sensor 2" that is positioned in a sensor ring between a "sensor 1" and a "sensor 3":

$$Sensor2[A] = \frac{W(sensor1)\cdot Sensor1_{result[A]} + W(sensor3)\cdot Sensor3_{result[A]}}{W(sensor1) + W(sensor3)} * W(sensor2)$$

wherein W(sensorX) is the calibration factor for the determined conductor location for sensor X (e.g., sensor 1, 2, 3, . . . , 8).

Using at least three sensor signals out of eight possible sensor signals in this example implementation, triangulation allows for determination of the position of the conductor under test based on the magnetic field distribution. This feature also results in recognition of whether a conductor is positioned inside or outside the measurement area, such that conductors positioned outside the measurement area may be ignored.

The features discussed above may be combined with the non-contact voltage sensors discussed below to deliver more information about the positions of the conductor under test and to also improve the reliability of position information.

The circular magnetic field of the wire inside the sensors might be influenced by adjacent additional external wires running a current. But the non contact voltage information for the wire position is more accurate than the current measurement not being impacted by external electrical fields due to easier shielding of e-fields compared to B-fields.

Additionally, the position of more than one conductor may be calculated. The actual number of conductors that can be identified simultaneously may be dependent on the number of the voltage and/or current sensors used for a particular application.

Reference Signal Type Non-Contact Voltage Measurement Devices

The following discussion provides examples of systems and methods for measuring alternating current (AC) voltage of an insulated (e.g., insulated wire) or blank uninsulated conductor (e.g., bus bar) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement device is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise. Although the discussion below focuses on non-contact reference signal type measurement devices, it should be appreciated that the calibration systems and methods disclosed herein may additionally or alternatively be used to calibration contact reference signal voltage measurement devices (e.g., a digital multimeter (DMM) that generates and detects reference signals). Thus, the discussion below may apply to calibration subsystems of measurement devices which may be used to determine one or more calibration factors and/or the position of a conductor under test, as well as measurement subsystems of measurement devices that are used to obtain the measurements of one or more electrical parameters (e.g., voltage, current, power).

Figure 11A:
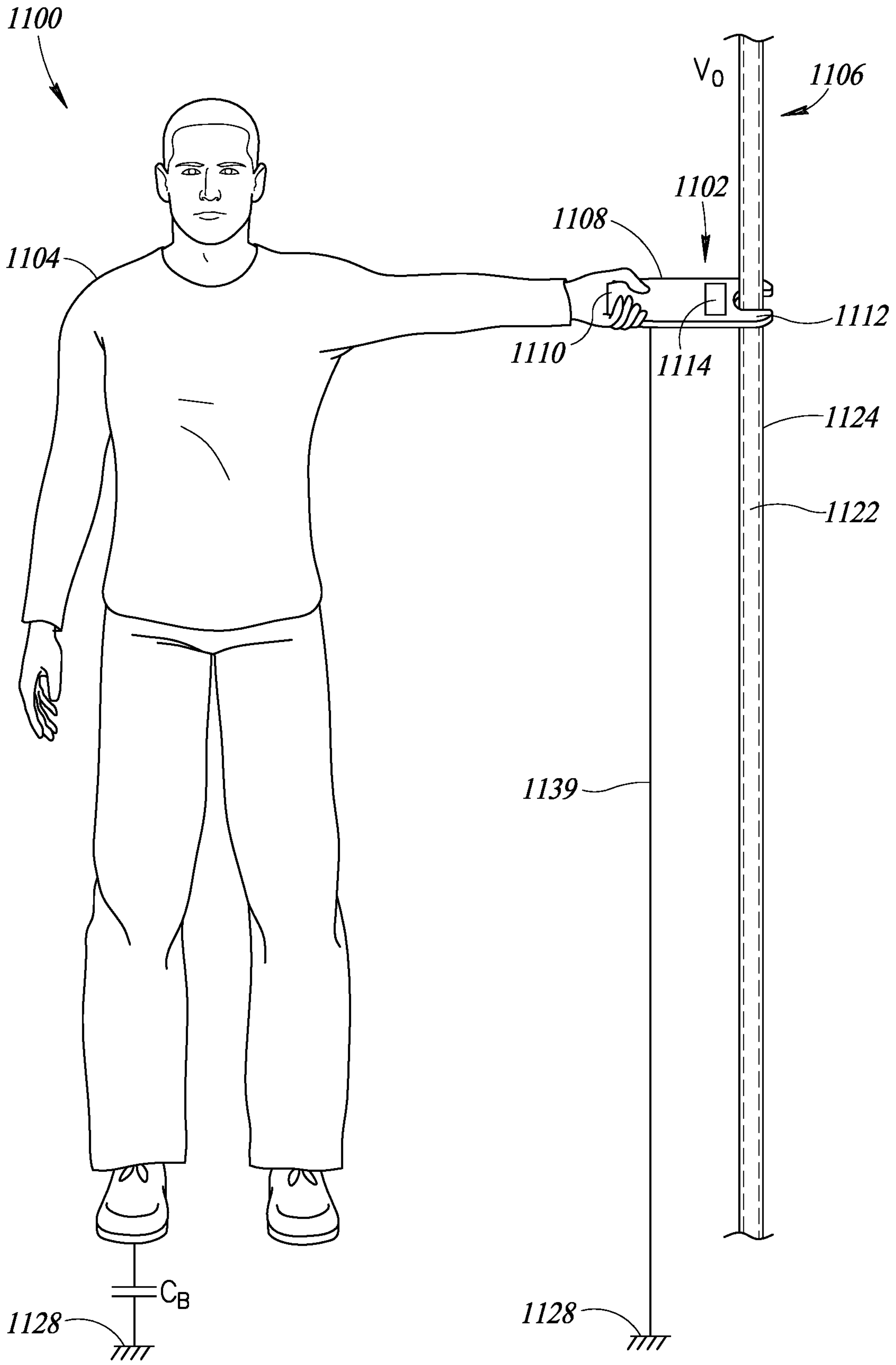
FIG. 11A is a pictorial diagram of an environment in which a non-contact voltage measurement device including a reference signal type voltage sensor may be used by an operator to measure AC voltage present in an insulated wire without requiring galvanic contact with the wire, according to one illustrated implementation.
Figure 11B:
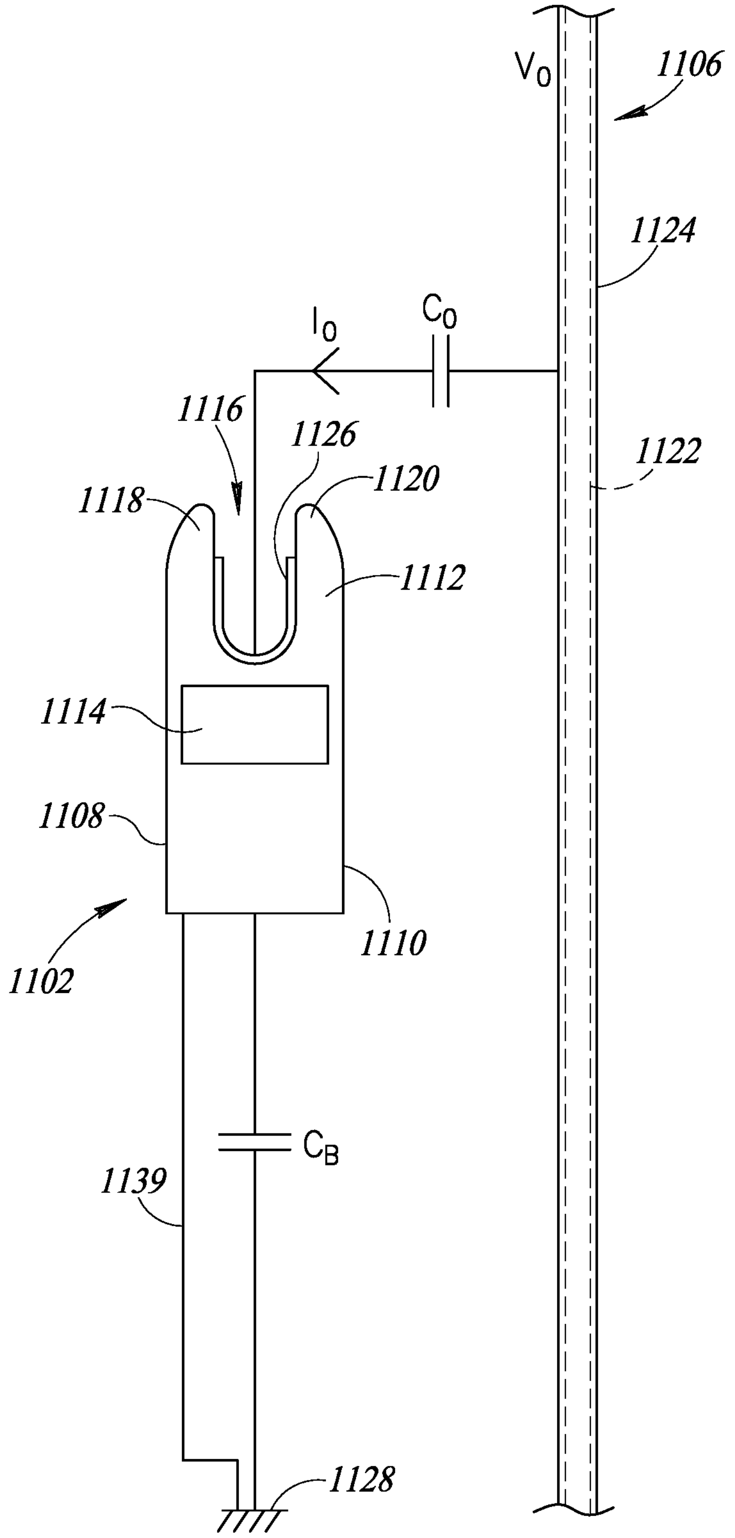
FIG. 11B is a top view of the non-contact voltage measurement device of FIG. 11A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 11A is a pictorial diagram of an environment 1100 in which a non-contact voltage measurement device 1102 that includes a reference signal type voltage sensor or system may be used by an operator 1104 to measure AC voltage present in an insulated wire 1106 without requiring galvanic contact between the non-contact voltage measurement device and the wire 1106. FIG. 11B is a top plan view of the non-contact voltage measurement device 1102 of FIG. 11A, showing various electrical characteristics of the non-contact voltage measurement device during operation. The non-contact voltage measurement device 1102 includes a housing or body 1108 which includes a grip portion or end 1110 and a probe portion or end 1112, also referred to herein as a front end, opposite the grip portion. The housing 1108 may also include a user interface 1114 which facilitates user interaction with the non-contact voltage measurement device 1102. The user interface 1114 may include any number of inputs (e.g., buttons, dials, switches, touch sensor) and any number of outputs (e.g., display, LEDs, speakers, buzzers). The non-contact voltage measurement device 1102 may also include one or more wired and/or wireless communications interfaces (e.g., USB, Wi-Fi®, Bluetooth®).

In at least some implementations, as shown best in FIG. 11B, the probe portion 1112 may include a recessed portion 1116 defined by first and second extended portions 1118 and 1120. The recessed portion 1116 receives the insulated wire 1106 (see FIG. 11A). The insulated wire 1106 includes a conductor or wire 1122 and an insulator 1124 surrounding the conductor 1122. The recessed portion 1116 may include a sensor or electrode 1126 which rests proximate the insulator 1124 of the insulated wire 1106 when the insulated wire is positioned within the recessed portion 1116 of the non-contact voltage measurement device 1102. Although not shown for clarity, the sensor 1126 may be disposed inside of the housing 1108 to prevent physical and electrical contact between the sensor and other objects. Further, although a single sensor 1126 is depicted in this example, in other implementations a plurality of spaced apart sensors may be provided, as discussed below.

As shown in FIG. 11A, in use the operator 1104 may grasp the grip portion 1110 of the housing 1108 and place the probe portion 1112 proximate the insulated wire 1106 so that the non-contact voltage measurement device 1102 may accurately measure the AC voltage present in the wire with respect to earth ground (or another reference node). Although the probe end 1112 is shown as having the recessed portion 1116, in other implementations the probe portion 1112 may be configured differently. For example, in at least some implementations the probe portion 1112 may include a selectively movable clamp, a hook, a flat or arcuate surface which includes the sensor, or other type of interface which allows a sensor of the non-contact voltage measurement device 1102 to be positioned proximate the insulated wire 1106. Examples of various probe portions and sensors are discussed below.

The operator's body acting as a reference to earth/ground may only be in some implementations. Alternatively a direct connection to earth or ground 1128 via a test lead 1139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 1102 may utilize the body capacitance ($C_B$) between the operator 1104 and ground 1128 during the AC voltage measurement. Although the term ground is used for the node 1128, the node is not necessarily earth/ground but could be connected in a galvanically isolated manner to any other reference potential by capacitive coupling.

The particular systems and methods used by the non-contact voltage measurement device 1102 to measure AC voltage are discussed below with reference to FIGS. 12-14.

Figure 12:
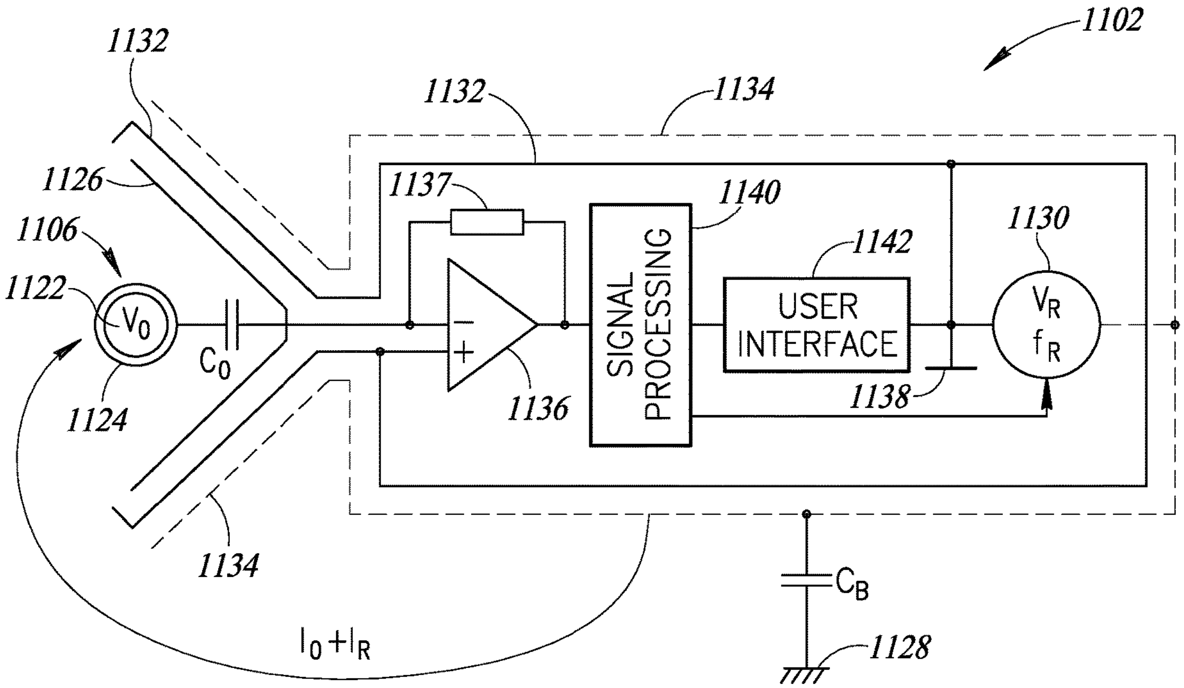
FIG. 12 is a schematic diagram of various internal components of a non-contact voltage measurement device, according to one illustrated implementation.

FIG. 12 shows a schematic diagram of various internal components of the non-contact voltage measurement device 1102 also shown in FIGS. 11A and 11B. In this example, the conductive sensor 1126 of the non-contact voltage measurement device 1102 is substantially "V-shaped" and is positioned proximate the insulated wire 1106 under test and capacitively couples with the conductor 1122 of the insulated wire 1106, forming a sensor coupling capacitor ($C_O$). The operator 1104 handling the non-contact voltage measurement device 1102 has a body capacitance ($C_B$) to ground. Also a direct conductive ground coupling by a wire (e.g., test lead 1139) can be used as shown in FIGS. 11A and 11B. Thus, as shown in FIGS. 11B and 12, the AC voltage signal ($V_O$) in the wire 1122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 1122 to be measured has a connection to an external ground 1128 (e.g., neutral). The non-contact voltage measurement device 1102 itself also has a capacitance to ground 1128, which consists primarily of the body capacitance ($C_B$) when the operator 1104 (FIG. 11) holds the non-contact voltage measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 1126 and loops back to the external ground 1128 through the housing 1108 of the non-contact voltage measurement device and the body capacitor ($C_B$) to ground 1128. The current signal ($I_O$) is dependent on the distance between the conductive sensor 1126 of the non-contact voltage measurement device 1102 and the insulated wire 1106 under test, the particular shape of the conductive sensor 1126, and the size and voltage level ($V_O$) in the conductor 1122.

To compensate for the distance variance and consequent coupling capacitor ($C_O$) variance which directly influences the signal current ($I_O$), the non-contact voltage measurement device 1102 includes a common mode reference voltage source 1130 which generates an AC reference voltage ($V_R$) which has a reference frequency ($f_R$) different from the signal voltage frequency ($f_O$).

To reduce or avoid stray currents, at least a portion of the non-contact voltage measurement device 1102 may be surrounded by a conductive internal ground guard or screen 1132 which causes most of the current to run through the conductive sensor 1126 that forms the coupling capacitor ($C_O$) with the conductor 1122 of the insulated wire 1106.

The internal ground guard 1132 may be formed from any suitable conductive material (e.g., copper) and may be solid (e.g., foil) or have one or more openings (e.g., mesh).

Further, to avoid currents between the internal ground guard 1132 and the external ground 1128, the non-contact voltage measurement device 1102 includes a conductive reference shield 1134. The reference shield 1134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 1130 is electrically coupled between the reference shield 1134 and the internal ground guard 1132, which creates a common mode voltage or reference signal having the reference voltage ($V_R$) and the reference frequency ($f_R$) for the non-contact voltage measurement device 1102. Such AC reference voltage ($V_R$) drives an additional reference current ($I_R$) through the coupling capacitor ($C_O$) and the body capacitor ($C_B$).

The internal ground guard 1132 which surrounds at least a portion of the conductive sensor 1126 protects the conductive sensor against direct influence of the AC reference voltage ($V_R$) causing an unwanted offset of reference current ($I_R$) between the conductive sensor 1126 and the reference shield 1134. As noted above, the internal ground guard 1132 is the internal electronic ground 1138 for the non-contact voltage measurement device 1102. In at least some implementations, the internal ground guard 1132 also surrounds some or all of the electronics of the non-contact voltage measurement device 1102 to avoid the AC reference voltage ($V_R$) coupling into the electronics.

As noted above, the reference shield 1134 is utilized to inject a reference signal onto the input AC voltage signal ($V_O$) and, as a second function, minimizes the guard 1132 to earth ground 1128 capacitance. In at least some implementations, the reference shield 1134 surrounds some or all of the housing 1108 of the non-contact voltage measurement device 1102. In such implementations, some or all of the electronics see the reference common mode signal which also generates the reference current ($I_R$) between the conductive sensor 1126 and the conductor 1122 in the insulated wire 1106. In at least some implementations, the only gap in the reference shield 1134 may be an opening for the conductive sensor 1126 which allows the conductive sensor to be positioned proximate the insulated wire 1106 during operation of the non-contact voltage measurement device 1102.

The internal ground guard 1132 and the reference shield 1134 may provide a double layer screen around the housing 1108 (see FIGS. 11A and 11B) of the non-contact voltage measurement device 1102. The reference shield 1134 may be disposed on an outside surface of the housing 1108 and the internal ground guard 1132 may function as an internal shield or guard. The conductive sensor 1126 is shielded by the guard 1132 against the reference shield 1134 such that any reference current flow is generated by the coupling capacitor ($C_O$) between the conductive sensor 1126 and the conductor 1122 under test. The guard 1132 around the sensor 1126 also reduces stray influences of adjacent wires close to the sensor.

As shown in FIG. 12, the non-contact voltage measurement device 1102 may include an input amplifier 1136 which operates as an inverting current-to-voltage converter. The input amplifier 1136 has a non-inverting terminal electrically coupled to the internal ground guard 1132 which functions as the internal ground 1138 of the non-contact voltage measurement device 1102. An inverting terminal of the input amplifier 1136 may be electrically coupled to the conductive sensor 1126. Feedback circuitry 1137 (e.g., feedback resistor) may also be coupled between the inverting terminal and the output terminal of the input amplifier 1136 to provide feedback and appropriate gain for input signal conditioning.

The input amplifier 1136 receives the signal current ($I_O$) and reference current ($I_R$) from the conductive sensor 1126 and converts the received currents into a sensor current voltage signal indicative of the conductive sensor current at the output terminal of the input amplifier. The sensor current voltage signal may be an analog voltage, for example. The analog voltage may be fed to a signal processing module 1140 which, as discussed further below, processes the sensor current voltage signal to determine the AC voltage ($V_O$) in the conductor 1122 of the insulated wire 1106. The signal processing module 1140 may include any combination of digital and/or analog circuitry.

The non-contact voltage measurement device 1102 may also include a user interface 1142 (e.g., display) communicatively coupled to the signal processing module 1140 to present the determined AC voltage ($V_O$) or to communicate by an interface to the operator 1104 of the non-contact voltage measurement device.

Figure 13:
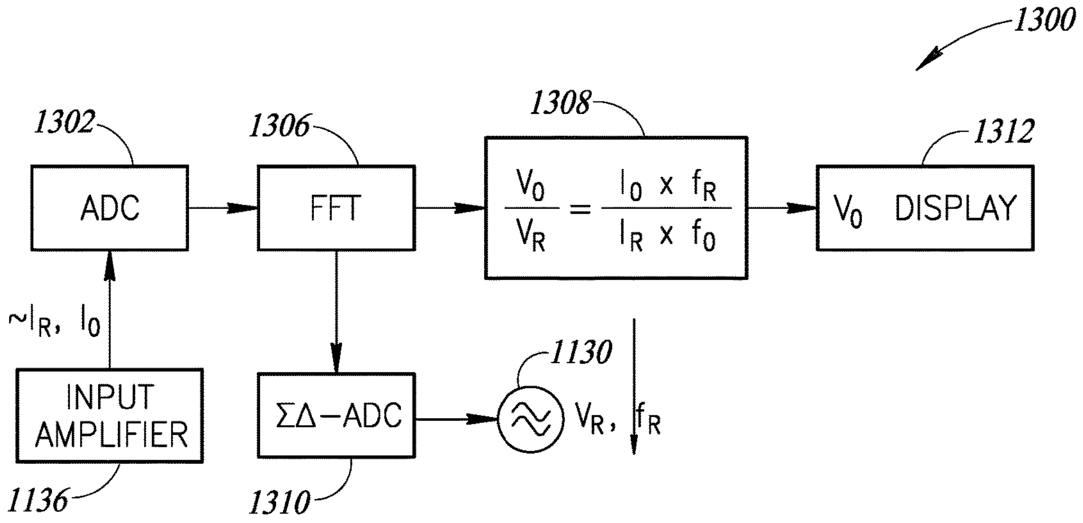
FIG. 13 is a block diagram which shows various signal processing components of a non-contact voltage measurement device, according to one illustrated implementation.
Figure 14:
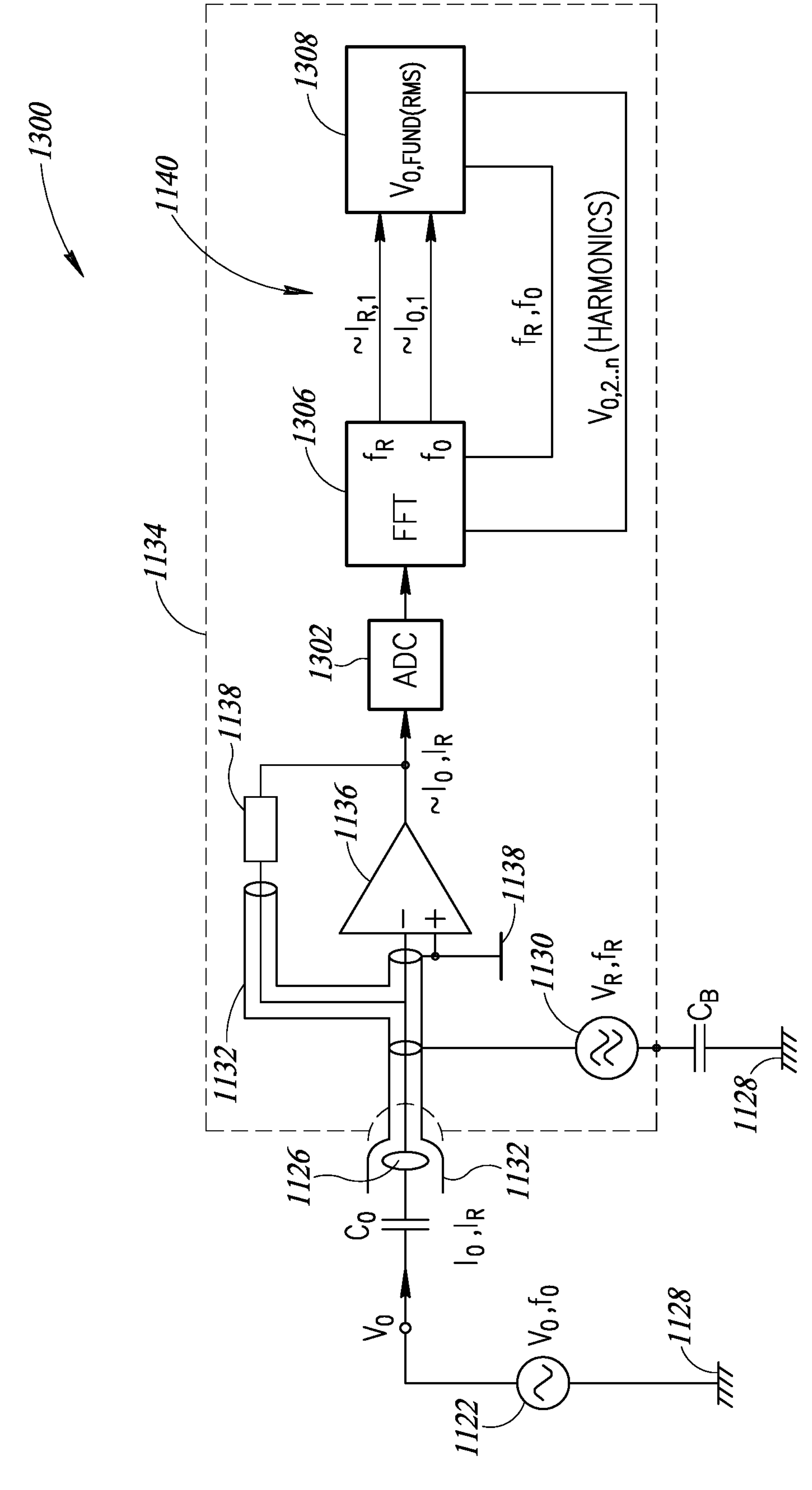
FIG. 14 is a schematic diagram of a non-contact voltage measurement device which implements a fast Fourier transform (FFT), according to one illustrated implementation.

FIG. 13 is a block diagram of a non-contact voltage measurement device 1300 which shows various signal processing components of the non-contact voltage measurement device. FIG. 14 is a more detailed diagram of the non-contact voltage measurement device 1300 of FIG. 13.

The non-contact voltage measurement device 1300 may be similar or identical to the non-contact voltage measurement device 1102 discussed above. Accordingly, similar or identical components are labeled with the same reference numerals. As shown, the input amplifier 1136 converts the input current ($I_O+I_R$) from the conductive sensor 1126 into a sensor current voltage signal which is indicative of the input current. The sensor current voltage signal is converted into digital form using an analog-to-digital converter (ADC) 1302.

The AC voltage ($V_O$) in the wire 1122 is related to the AC reference voltage ($V_R$) by Equation (2):

$$\frac{V_O}{V_R} = \frac{I_O \times f_R}{I_R \times f_O} \tag{2}$$

where ($I_O$) is the signal current through the conductive sensor 1126 due to the AC voltage ($V_O$) in the conductor 1122, ($I_R$) is the reference current through the conductive sensor 1126 due to the AC reference voltage ($V_R$), ($f_O$) is the frequency of the AC voltage ($V_O$) that is being measured, and ($f_R$) is the frequency of the reference AC voltage ($V_R$).

The signals with indices "O," which are related to the AC voltage ($V_O$), have different characteristics like frequencies than the signals with indices "R," which are related to the common mode reference voltage source 1130. In the implementation of FIG. 14, digital processing, such as circuitry implementing a fast Fourier transform (FFT) 1306, may be used to separate signal magnitudes with different frequencies. In other implementations, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 1122 under test needs either to be measured to determine the ratio of the reference frequency ($f_R$) to the signal frequency ($f_O$), which is utilized in Equation (2) listed above or the reference frequency is already known because it is generated by the system itself.

Figure 17:
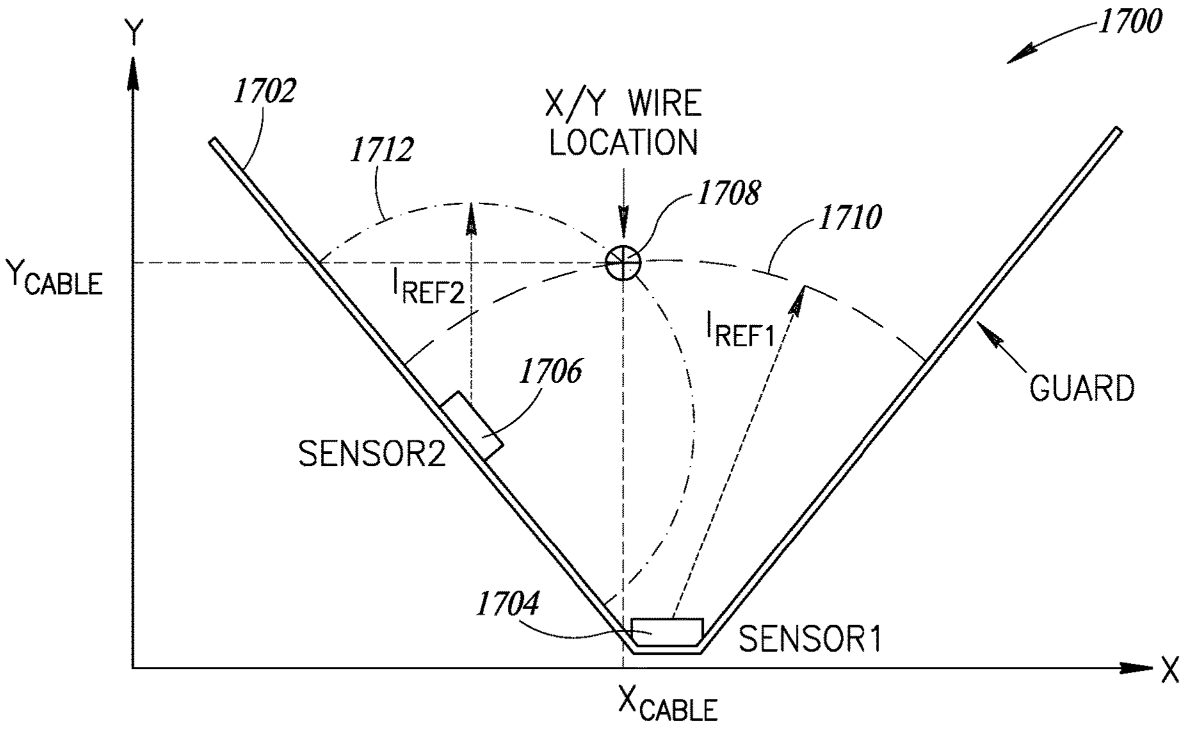
FIG. 17 is a schematic diagram of a V-shaped front end of an electrical parameter measurement device, showing two conductive sensors that may be used to determine the position of a conductor under test, wherein the positions of the two conductive sensors allow for accurate position determination for the conductor under test, according to one non-limiting illustrated implementation.

After the input current ($I_O+I_R$) has been conditioned by the input amplifier 1136 and digitized by the ADC 1302, the frequency components of the digital sensor current voltage signal may be determined by representing the signal in the frequency domain using the FFT 1306 (see FIG. 17). When both of the frequencies ($f_O$) and ($f_R$) have been measured, frequency bins may be determined to calculate the fundamental magnitudes of the currents ($I_O$) and ($I_R$) from the FFT 1306.

The magnitude of the current ($I_R$) and/or the current ($I_O$) may vary as a function of distance between the reference signal sensor or electrode (e.g., electrode 1126) and the conductor 1122 of the insulated wire 1106. Thus, the system may compare the measured current ($I_R$) and/or the current ($I_O$) to expected respective currents to determine the distance between the reference signal sensor or electrode and the conductor 1122.

Next, as indicated by a block 1308 of FIG. 13, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 1122, which is done by calculating the square root of the squared harmonics sum, and which may be presented to the user on a display 1312.

The coupling capacitor ($C_O$) may generally have a capacitance value in the range of approximately 0.02 pF to 1 pF, for example, depending on the distance between the insulated wire 1106 and the conductive sensor 1126, as well as the particular shape and dimensions of the sensor 1126. The body capacitance ($C_B$) may have a capacitance value of approximately 20 pF to 200 pF, for example.

From Equation (2) above, it can be seen that the AC reference voltage ($V_R$) generated by the common mode reference voltage source 1130 does not need to be in the same range as the AC voltage ($V_O$) in the conductor 1122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 1120 VRMS AC voltage ($V_O$) having a signal frequency ($f_O$) of 60 Hz. In such case, the AC reference voltage ($V_R$) may be selected to be only 2.4 V (i.e., 1120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 1122 to produce currents ($I_R$) and ($I_O$) that are in the same range as each other to achieve a similar uncertainty for $I_R$ and $I_O$ and to avoid mathematical inaccuracies for the ratio $I_O/I_R$ Any suitable signal generator may be used to generate the AC reference voltage ($V_R$) having the reference frequency ($f_R$). In the example illustrated in FIG. 13, a Sigma-Delta digital-to-analog converter (Σ-Δ DAC) 1310 is used. The Σ-Δ DAC 1310 uses a bit stream to create a waveform (e.g., sinusoidal waveform) signal with the defined reference frequency ($f_R$) and AC reference voltage ($V_R$). In at least some implementations, the Σ-Δ DAC 1310 may generate a waveform that is in phase with the window of the FFT 1306 to reduce jitter. Any other reference voltage generator can be used, such as a PWM which may use less computing power than a Σ-Δ DAC.

In at least some implementations, the ADC 1302 may have 14 bits of resolution. In operation, the ADC 1302 may sample the output from the input amplifier 1136 at a sampling frequency of 10.24 kHz for nominal 50 Hz input signals to provide 2" samples (2024) in 1100 ms (10 Hz bins for the FFT 1306) ready for processing by the FFT 1306. For 60 Hz input signals, the sampling frequency may be 12.288 kHz, for example, to get the same number of samples per cycle. The sampling frequency of the ADC 1302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 1306 and use a Hanning window function for further calculations to suppress phase shift jitter caused by incomplete signal cycles captured in the aggregation interval.

In one example, the common mode reference voltage source 1130 generates an AC reference voltage ($V_R$) which has a reference frequency ($f_R$) of 2419 Hz. This frequency is in between the $40^{th}$ harmonic and the $41^{st}$ harmonic for 60 Hz signals, and between the $48^{th}$ harmonic and $49^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 1130 is selected to be a frequency that is least likely to be affected by harmonics of an AC voltage ($V_O$) in the conductor 1122 under test. As an example, the common mode reference voltage source 1130 may be switched off when the reference current ($I_R$) exceeds a limit, which may indicate that the conductive sensor 1126 is approaching the conductor 1122 under test. A measurement (e.g., 1100 ms measurement) may be taken with the common mode reference voltage source 1130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

To avoid gaps in the measurement sequence when the reference voltage source is switched off, the previous measured reference magnitude may be used together with the actual signal magnitude. A further improvement can be done if the difference of the actual signal compared to the previously measured signal is applied with the same ratio to the reference signal used for the switched off reference measurement. With the assumption that the sliding average value is not changing from one measurement to the other, only the distance sensor-wire (coupling capacitor) can change, therefore impacting both signals (reference, input signal) with the same ratio.

Calibration Systems and Methods

As discussed above, the reference voltage ($V_R$) and the reference frequency ($f_R$) generated by the voltage measurement device are known and may be measured at the output of the reference voltage source 1130 (FIG. 12). The output voltage ($V_O$) is defined by Equation (2) above. In an ideal situation, if the reference voltage ($V_R$) is known, and all other parameters needed are the ratios $I_O/I_R$ and $f_R/f_O$, then no calibration of the voltage measurement device would be required. However, in practice, there are several influencing factors, such as the bandwidth of signal processing circuitry, leakage capacitances, and the particular position of the conductor under test relative to the measurement device, which lead to a deviation in output voltage measurements from the actual output voltage in a conductor under test. One factor is stray leakage capacitance between the sensor 1126 (or sensors) and the environment, which tends to cause an increase in the reference current ($I_R$) and therefore a reduction in the ratio $I_O/I_R$. Also, direct capacitive coupling between the sensor 1126 and the reference shield 1134 leads to an offset which further increases the reference current ($I_R$). Such an increase in the reference current ($I_R$) from the ideal situation results in a calculation of the output voltage ($V_O$) that is less than the actual output voltage in a conductor under test. Accordingly, the calibration systems and methods discussed herein allow for accurate measurement of output voltage ($V_O$) or other parameter in a conductor under test using determined calibration parameters or factors that are dependent on the coupling capacitance ($C_O$) or, equivalently, the distance between each of one or more sensors and the conductor under test. As discussed further below, in at least some implementations a plurality of sensors is utilized, and the position of a conductor under test is determined by triangulation of reference currents measured by the plurality of sensors.

Figure 15:
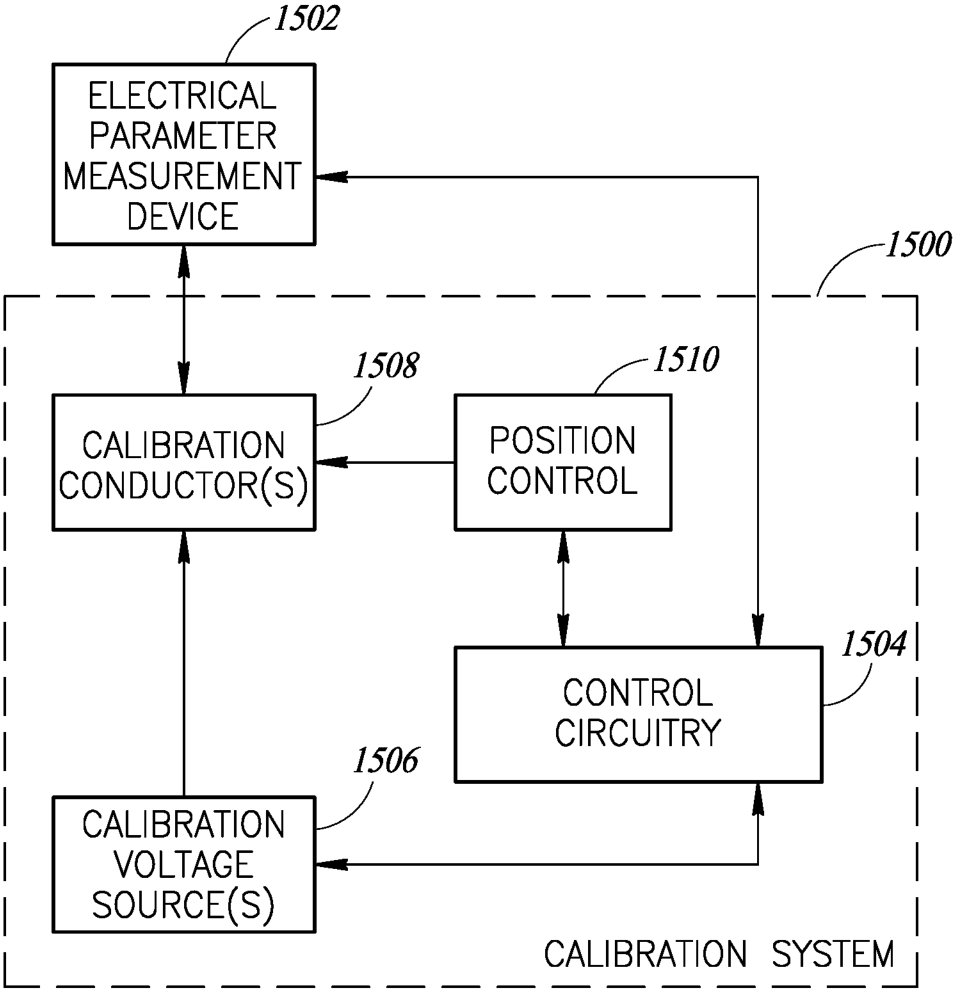
FIG. 15 is a schematic block diagram of a calibration system for an electrical parameter measurement device, such as the voltage measurement devices shown in FIGS. 11A-14, according to one illustrated implementation.

FIG. 15 shows a schematic block diagram of an example calibration system 1500 that may be used to calibrate an electrical parameter measurement device 1502 (e.g., DMM, current clamp, split core transformer). The electrical parameter measurement device 1502 may be any non-contact or contact measurement device, such as a measurement device that generates and senses a reference signal. The calibration system 1500 may include control circuitry 1504 which controls the various functionality of the calibration system. The calibration system 1500 may also include a calibration voltage source 1506 that is operative to selectively output calibration or test voltages to a calibration conductor 1508. The control circuitry 1504 may be operatively coupled to the calibration voltage source 1506 to control the operation thereof. The calibration system 1500 may also include a position control subsystem 1510 that is operative to selectively mechanically control the position of the calibration conductor 1508 relative to the electrical parameter measurement device 1502 during a calibration process. The calibration conductor 1508 may be an insulated conductor for use in calibrating non-contact electrical parameter measurement devices, or may be an uninsulated conductor for use in calibrating contact type electrical parameter measurement devices.

The control circuitry 1504 of the calibration system 1500 may be operatively coupled to the electrical parameter measurement device 1502 by any suitable wired or wireless connection. As discussed further below, the control circuitry 1504 may be operative to send instructions or data to the electrical parameter measurement device 1502 or to receive instructions or data therefrom. The control circuitry 1504 controls the position control subsystem 1510 to selectively adjust the position of the calibration conductor 1508 within an opening or receiving portion of a front end or measurement end of the electrical parameter measurement device such that the capacitive coupling $C_O$ between each of the plurality of sensors and the calibration conductor is varied to modify the respective reference currents $I_R$ for the plurality of sensors to obtain different calibration points for a plurality of physical locations of the calibration conductor 1508.

Generally, the control circuitry 1504 may include at least one processor communicatively coupled to the calibration voltage source 1506, the position control subsystem 1510, and to at least one nontransitory processor-readable storage medium that stores at least one of processor-executable instructions or data. The control circuitry 1504 may include any type of processing unit, such as one or more central processing units (CPUs), digital signal processors (DSPs), application-specific integrated circuits (ASICs), field programmable gate arrays (FPGAs), programmable logic controllers (PLCs), artificial neural network circuits or systems, or any other discrete or integrated logic components. The nontransitory processor-readable storage medium coupled to the control circuitry 1504 may include any type of nontransitory volatile and/or non-volatile memory.

In at least some implementations, the control circuitry 1504 may include a communications interface or a user interface. The user interface may facilitate user interaction with the calibration system 1500. The user interface may include any number of inputs (e.g., buttons, dials, switches, touch sensor) and any number of outputs (e.g., display, LEDs, speakers, buzzers). For example, the user interface may include inputs that allow an operator to modify one or more adjustable settings of the calibration system 1500 or the electrical parameter measurement device 1502. The communications interface may implement one or more wired and/or wireless communications technologies (e.g., USB, Wi-Fi®, Bluetooth®) that allow the calibration system 1500 to communicate with the electrical parameter measurement device 1502 or with one or more local or remote external processor-based devices.

In at least some implementations, the output voltage ($V_O$) measurements of the electrical parameter measurement device 1502 may be dependent on measured reference current signals ($I_R$) and/or the actual output voltage in the conductor under test. Thus, in at least some implementations, the calibration systems and methods discussed herein provide compensation for one or both of such parameters to allow for accurate measurement of the output voltage ($V_O$) at various voltages and various positions of the conductor under test relative to the electrical parameter measurement device 1502, which various positions correspond to various combinations of levels of reference current ($I_R$) for the plurality of sensors (e.g., 2 sensors, 3 sensors) of the electrical parameter measurement device 1502.

Generally, during a calibration process, the control circuitry 1504 controls the calibration voltage source 1506 to output a known calibration voltage (e.g., 110 VAC, 250 VAC, 1800 VAC) to the calibration conductor 1508 and controls the position control system 1510 to move the calibration conductor to a known position (e.g., X/Y position) within a front end or measurement portion of the electrical parameter measurement device 1502. The control circuitry 1504 then receives data from the electrical parameter measurement device 1502 obtained by the electrical parameter measurement device during measurement of the calibration voltage in the calibration conductor 1508. Such data may include measured reference current signals ($I_R$) for a plurality of sensors, determined output voltages ($V_O$), etc. The electrical parameter measurement device 1502 may obtain such data in the manner discussed above with reference to FIGS. 11A-14, for example. This process may be repeated a number of times when the calibration conductor 1508 is located at different positions, and optionally at different calibration voltages.

For each of the plurality of positions of the calibration conductor 1508 and for each of one or more calibration voltages (e.g., 110 VAC, 250 VAC, 1000 VAC), the control circuitry 1504 may obtain a plurality of calibration points associated with the calibration voltage. In at least some implementations, each of the calibration points includes reference current signal data points for each of the respective plurality of sensors of the electrical parameter measurement device and a calibration factor. A reference current signal data point is a measurement obtained from a sensor of the electrical parameter measurement device 1502 that is indicative of the reference current signal that is measured by the sensor of the electrical parameter measurement device when the calibration voltage source 1506 outputs the calibration voltage in the calibration conductor 1508. The calibration factor may be a value indicative of a ratio of the known calibration voltage to a measured uncalibrated output voltage ($V_O$) data point obtained from a sensor of the electrical parameter measurement device that is determined by the electrical parameter measurement device based at least in part on the reference current signal data point (e.g., using Equation (2) above) for the sensor. For example, if the control circuitry 1504 causes the calibration voltage source 1506 to output 1100 VAC in the calibration conductor 1508, and a sensor of the electrical parameter measurement device 1502 measures an output voltage of 1110 VAC, then the calibration factor would be 1100/1110=0.909. For a particular measurement, the uncalibrated output voltage measured by the electrical parameter measurement device 1502 may be multiplied by the calibration factor to provide the correct output voltage. Continuing with the example above, the uncalibrated output voltage of 1110 VAC may be multiplied by the calibration factor of 0.909 to provide the actual output voltage of 1100 VAC in the conductor under test.

As discussed further below, after obtaining calibration points, the control circuitry 1504 may determine calibration data for the electrical parameter measurement device 1502 based on the obtained plurality of calibration points. The calibration data may be dependent on the reference current signals measured by the plurality of sensors of the electrical parameter measurement device. In at least some implementations, the calibration data may also be dependent on a plurality of calibration voltages. The control circuitry 1504 may then store the calibration data on at least one nontransitory processor-readable storage medium associated with the electrical parameter measurement device 1502 for use by the electrical parameter measurement device or other electrical parameter measurement devices (e.g., with the same or similar physical characteristics) during subsequent operation thereof. The calibration data may include one or more lookup tables and/or coefficients for one or more mathematical formulas, for example.

Figure 16:
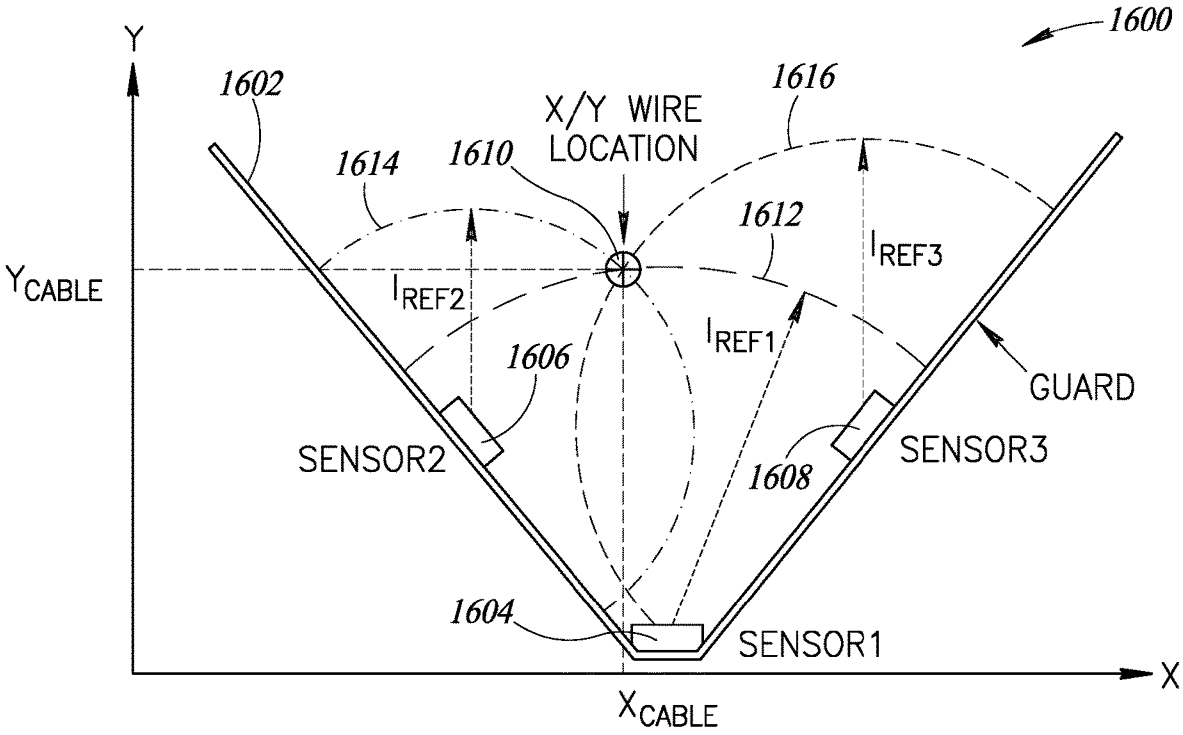
FIG. 16 is schematic diagram of a V-shaped front end of an electrical parameter measurement device, showing three conductive sensors that may be used to determine the position of a conductor under test, according to one non-limiting illustrated implementation.

FIG. 16 is schematic diagram of a V-shaped front end 1600 of an electrical parameter measurement device, showing three conductive sensors 1604, 1606, and 1608 disposed on a guard 1602 that may be used to determine the position of a conductor 1610 under test. Also shown are the magnitudes of reference currents 1612, 1614, and 1616 measured by the sensors 1604, 1606, and 1608, respectively, wherein each constant magnitude reference current is represented as an arcuate dashed line that has a specific distance that is indicative of the constant magnitude of the reference current, which indicates the possible positions of the conductor 1610 under test determined by of the sensors. As shown, the three reference currents 1612, 1614, and 1616 intersect at the X/Y location of the conductor 1610 under test. Thus, using triangulation of the reference currents 1612, 1614, and 1616 for the three sensors 1604, 1606, and 1608, the location of the conductor 1610 under test may be accurately determined.

As discussed further below, the location determination may be used to select or derive a calibration factor to be applied to an electrical parameter measurement of the electrical parameter measurement device. For example, a prior calibration process may be implemented to define a set of discrete data points, such as a calibration grid, that specify the calibration factor for any possible position of the conductor under test. The calibration process may result in position coordinates, the reference currents $I_{REF1}$, $I_{REF2}$, $I_{REF3}$ for each of the sensors 1604, 1606, and 1608, respectively, and a calibration factor (e.g., $V_{CAL1}$, $V_{CAL2}$, $V_{CAL3}$) that indicates an amount of correction to be applied to a measurement of an electrical parameter (e.g., current, voltage, power). Similar to Equation (2) above, an unknown signal voltage $V_O$ may be calculated as follows:

$$V_O = \frac{I_{OX} \times f_R}{I_{RefX} \times f_{OX}} \times V_{Ref} \times V_{CALX} \quad (3)$$

where $V_{CALX}$ is the calibration factor for a sensor X (i.e., X=1, 2, 3), Iox is the signal current from each sensor, $f_{OX}$ is the signal frequency (e.g., 50 Hz, 60 Hz) measured by each of the three sensors, $V_{REF}$ is the common mode reference voltage generated inside the electrical parameter measurement device, and $f_R$ is the frequency of the reference voltage.

FIG. 17 is a schematic diagram of a V-shaped front end 1700 of an electrical parameter measurement device, showing two conductive sensors 1704 and 1706 disposed on a guard 1702 that may be used to determine the position of a conductor 1708 under test, wherein the positions of the two conductive sensors allow for accurate position determination for the conductor under test. In contrast, FIG. 18 is a schematic diagram of a V-shaped front end 1800 of an electrical parameter measurement device, showing two conductive sensors 1804 and 1806 disposed on a guard 1802 that may be used to determine the position of a conductor 1808 under test, wherein the positions of the two conductive sensors may cause ambiguous or inaccurate position determination for the conductor under test.

Referring to FIG. 17, the sensor 1704 is positioned at a bottom or base portion of the guard 1702, and the sensor 1706 is positioned on a left side or portion (as shown) of the guard. A first curved dashed line 1710 represents a constant reference current magnitude detected by the sensor 1704, and a second curved dashed line 1712 represents a constant reference current magnitude detected by the sensor 1706. As shown, the curves 1710 and 1712 intersect in only one location, which is the location of the conductor 1708 under test. That is, the other theoretical intersection of the curves 1710 and 1712 would be outside of the V-shaped guard 1702 and can therefore be ignored by the measurement device since that location is not a possible location for the conductor 1708 under test. Thus, since there is only one possible intersection of the curves 1710 and 1712, the measurement device can accurately determine the location of the conductor 1708 under test.

Figure 18:
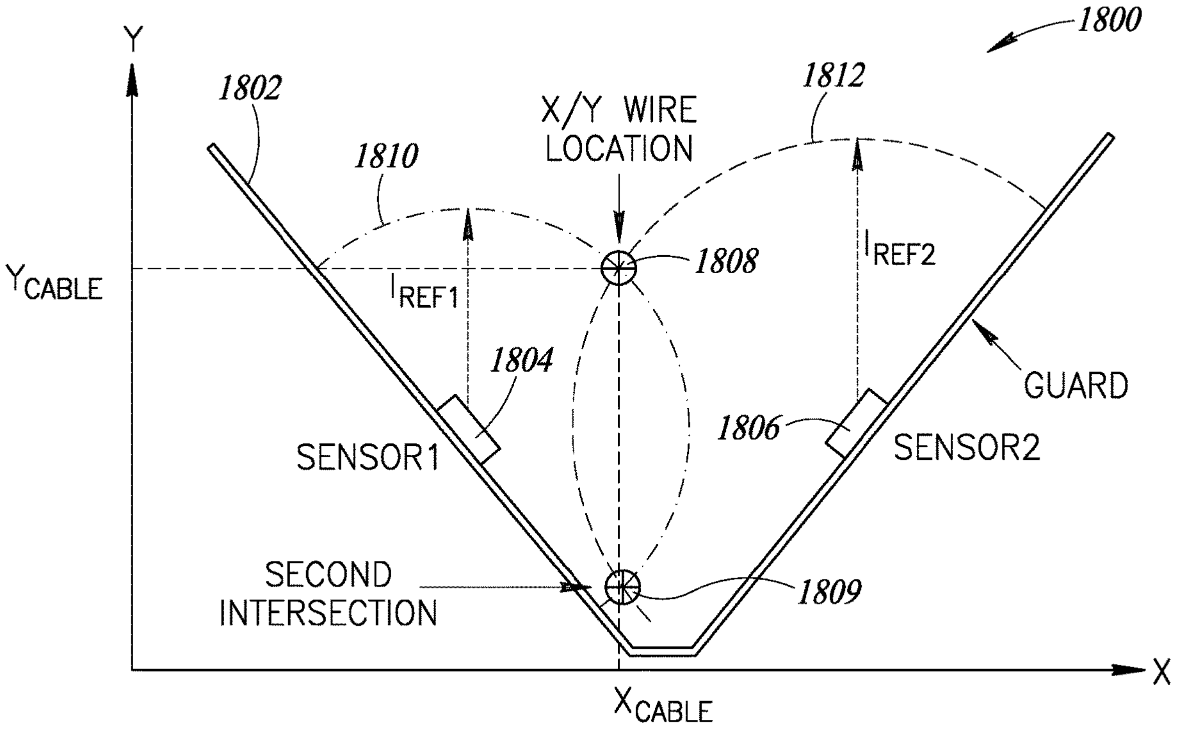
FIG. 18 is a schematic diagram of a V-shaped front end of an electrical parameter measurement device, showing two conductive sensors that may be used to determine the position of a conductor under test, wherein the positions of the two conductive sensors may cause inaccurate position determination for the conductor under test, according to one non-limiting illustrated implementation.

Referring now to FIG. 18, the sensor 1804 is positioned at a left side or portion (as shown) of the guard 1802, and the sensor 1806 is positioned on a right side or portion (as shown) of the guard opposite the left side. A first curved dashed line 1810 represents a constant reference current magnitude detected by the sensor 1804, and a second curved dashed line 1812 represents a constant reference current magnitude detected by the sensor 1806. As shown, the curves 1810 and 1812 intersect at two locations, namely, the actual location of the conductor 1808 under test and a second location 1809 toward the base of the guard. In this scenario, the measurement device may have difficulty determining in which location the conductor 1808 is positioned since there are two intersection points. This issue can be remedied by carefully selecting the locations of the two sensors, as in the example of FIG. 17, so that there is only one intersection of the curves inside the guard, or by using 3 sensors, as in the example of FIG. 16 discussed above.

Figure 19:
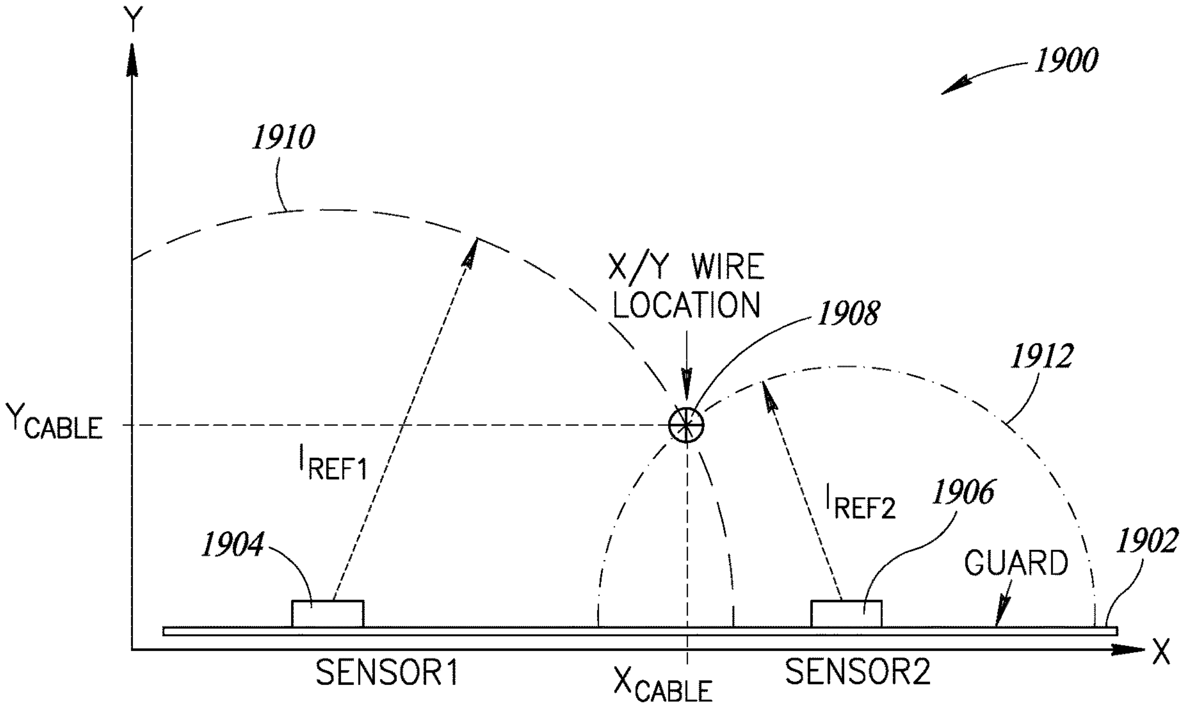
FIG. 19 is a schematic diagram of a front end of an electrical parameter measurement device, showing two conductive sensors that are coplanar with each other and that may be used to determine the position of a conductor under test, according to one non-limiting illustrated implementation.

FIG. 19 is a schematic diagram of a front end 1900 of an electrical parameter measurement device, showing two conductive sensors 1904 and 1906 that are coplanar with each other on a planar guard 1902 and that may be used to determine the position of a conductor 1908 under test. Constant reference current curves 1910 and 1912 are also shown for the sensors 1904 and 1906, respectively. By placing the sensors 1904 and 1906 coplanar with respect to each other, the curves 1910 and 1912 intersect each other at only one permissible location (i.e., above the guard 1902), thereby avoiding ambiguity that may be caused by two sensors arranged such that the constant reference current curves intersect at two permissible locations, as in the example shown in FIG. 18.

Figure 20:
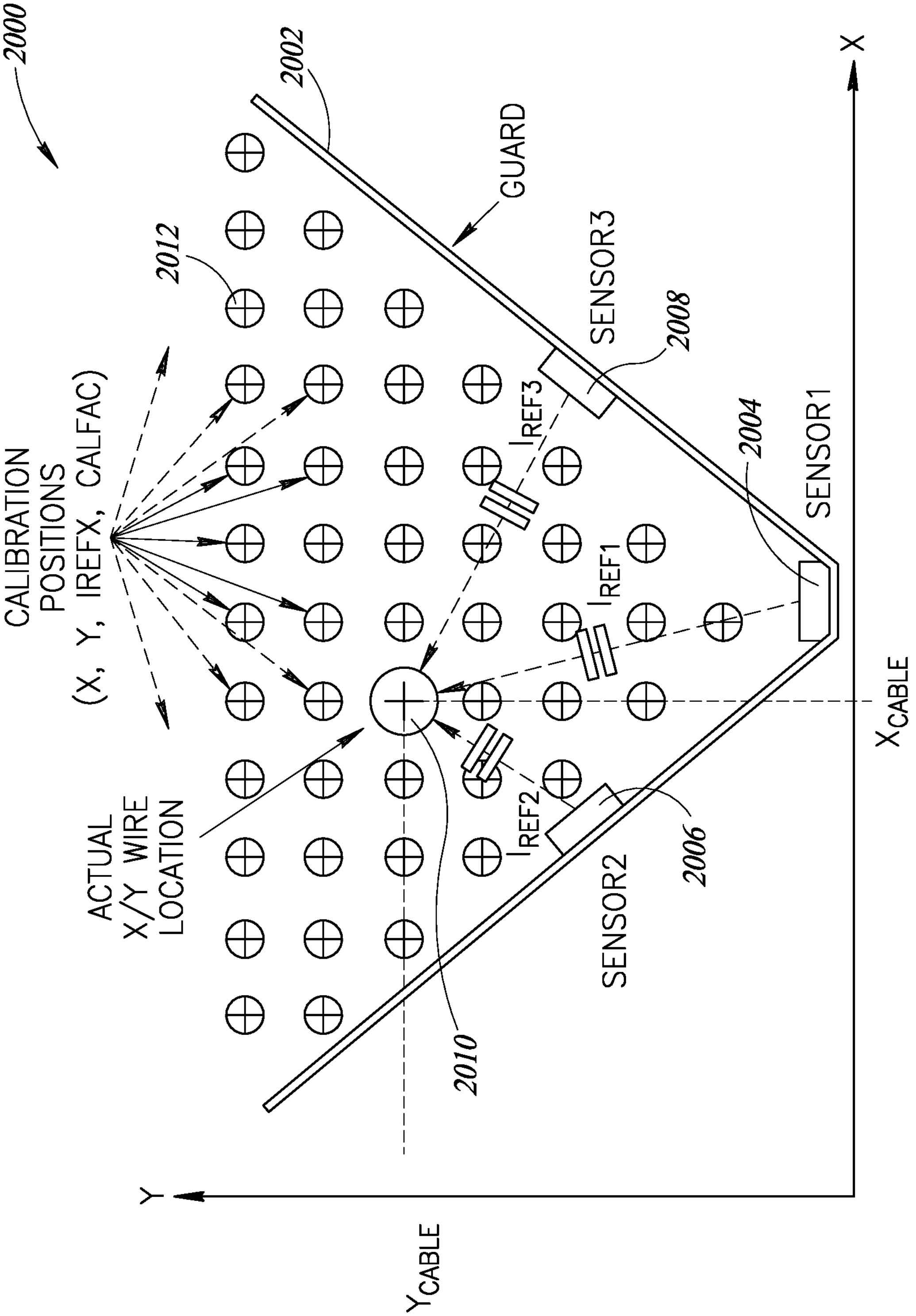
FIG. 20 is a schematic diagram of a V-shaped front end of an electrical parameter measurement device that includes three conductive sensors, showing various possible positions for a conductor under test to determine a calibration factor for every position derived by triangulation of three reference currents (Iref1, Iref2, Iref3), according to one non-limiting illustrated implementation.

FIG. 20 is a schematic diagram of a V-shaped front end 2000 of an electrical parameter measurement device that includes three conductive sensors 2004, 2006, and 2008 disposed on a guard 2002, showing various possible positions 2012 for a conductor 2010 under test. The various positions 2012 may be calibration positions or points that may be used during a calibration process to obtain calibration data. For example, when a calibration conductor is positioned at each of the calibration positions 2012, the electrical parameter measurement device may obtain the X/Y position of the calibration conductor, the reference currents $I_{REFX}$ for each of the sensors 2004, 2006, and 2008, and a calibration factor CALFAC that indicates a correction to be applied to obtain an accurate parameter measurement.

FIG. 21 is a table 2100 that shows position dependent calibration factors for the three conductive sensors 2004 (Sensor 1), 2006 (Sensor 2), and 2008 (Sensor 3) of FIG. 20 at various X/Y positions. As shown, for each X/Y position, a reference current IREFX and a calibration factor VCALX are determined for each of the three sensors 2004 (Sensor 1), 2006 (Sensor 2), and 2008 (Sensor 3).

Figure 23:
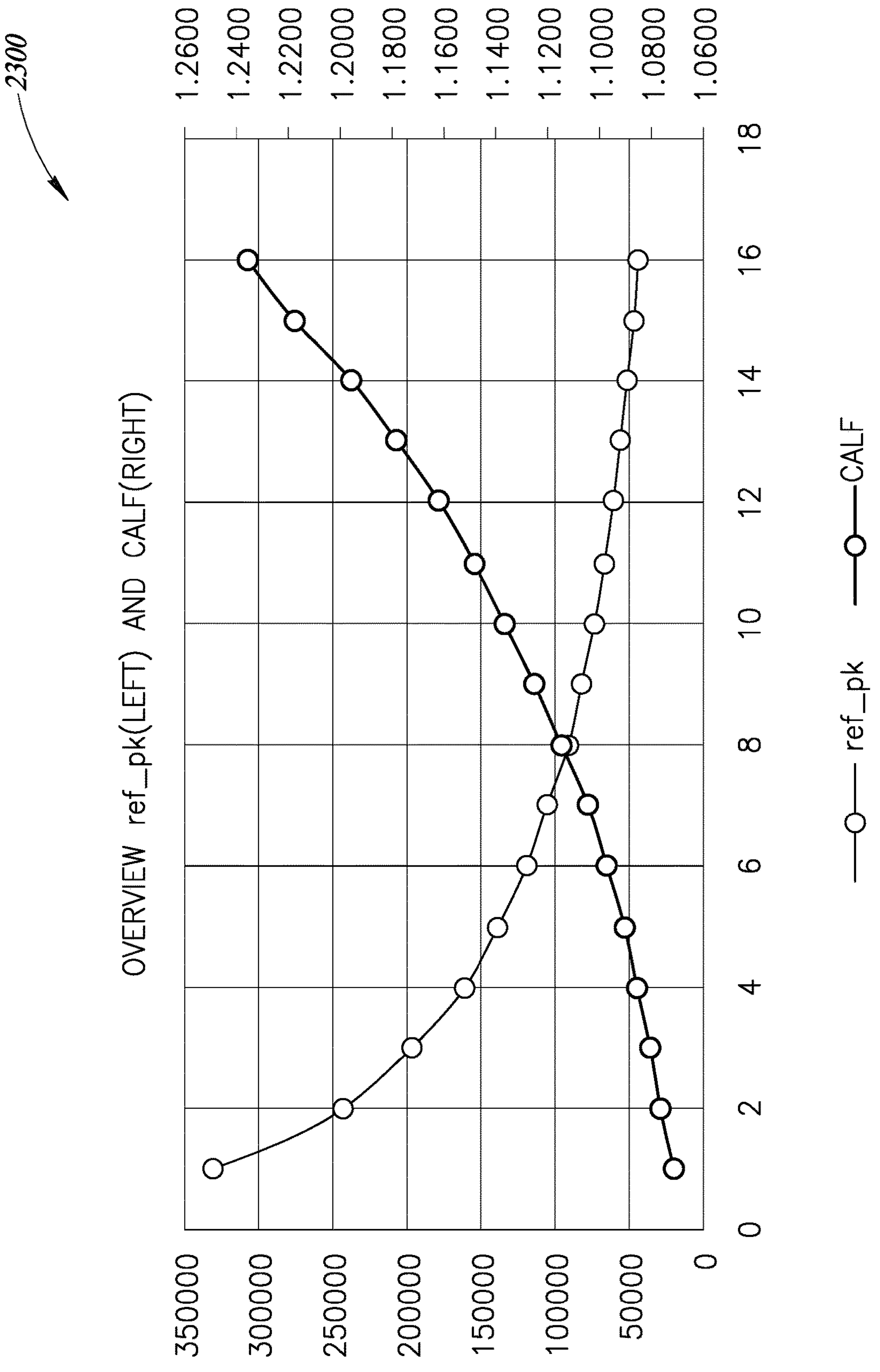
FIG. 23 is a graph that shows a reference current signal of a conductive sensor and a calibration factor as a function of distance, according to one non-limiting illustrated implementation.

FIG. 22 is a table 2200 that shows position dependent calibration factors (CALF) and reference current signals (ref_pk) for a single conductive sensor (e.g., one of the sensors 2004, 2006, or 2008) when a conductor under test is positioned at various distances (DIST) from the conductive sensor. FIG. 23 is a graph 2300 that graphically shows the reference current signal (ref_pk) and calibration factor (CALF) as a function of distance in millimeters (mm). As shown, the reference signal rapidly decreases with distance, and the calibration factor increases with distance.

Figure 24:
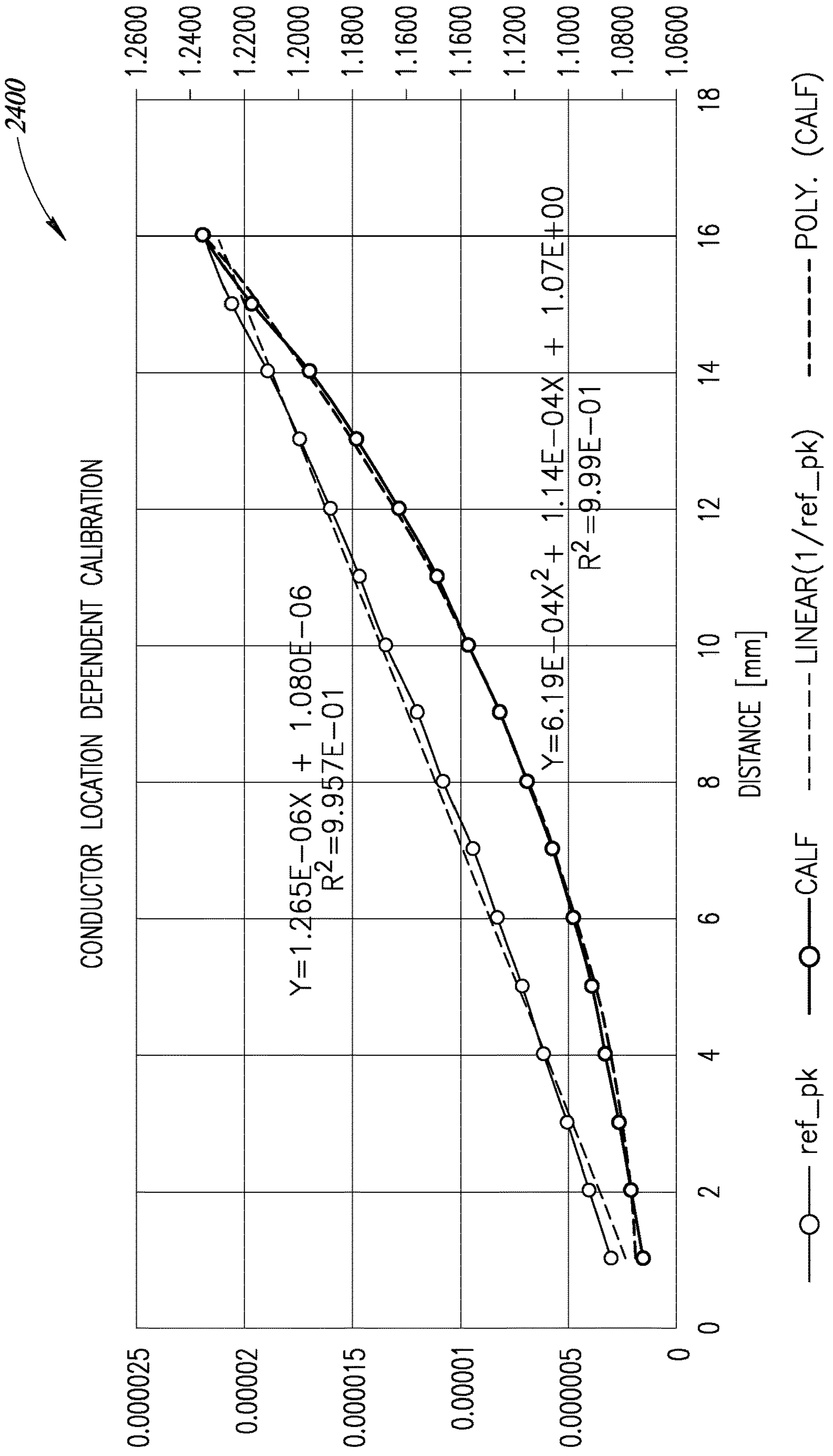
FIG. 24 is a graph that shows a linear approximation of the inverse of a reference current signal and a polynomial approximation of a calibration factor as a function of distance, according to one non-limiting illustrated implementation.

From the graph 2300, it is apparent that the reference current (ref_pk) exhibits some form of 1/x behavior. It may therefore be advantageous to chart the reciprocal value of the reference current, i.e., 1/ref_pk, to derive a simplified and suitably accurate representation. FIG. 24 is a graph 2400 that shows a linear approximation of the inverse of the reference current signal, i.e., 1/ref_pk, and a quadratic approximation of the calibration factor CALF as a function of distance. As shown by the $R^2$ values of 0.9957 and 0.999 for the linear and quadratic approximations, respectively, each of the approximations accurately represent the respective inverse of the reference current signal and the calibration factor as a function of distance.

Figure 25:
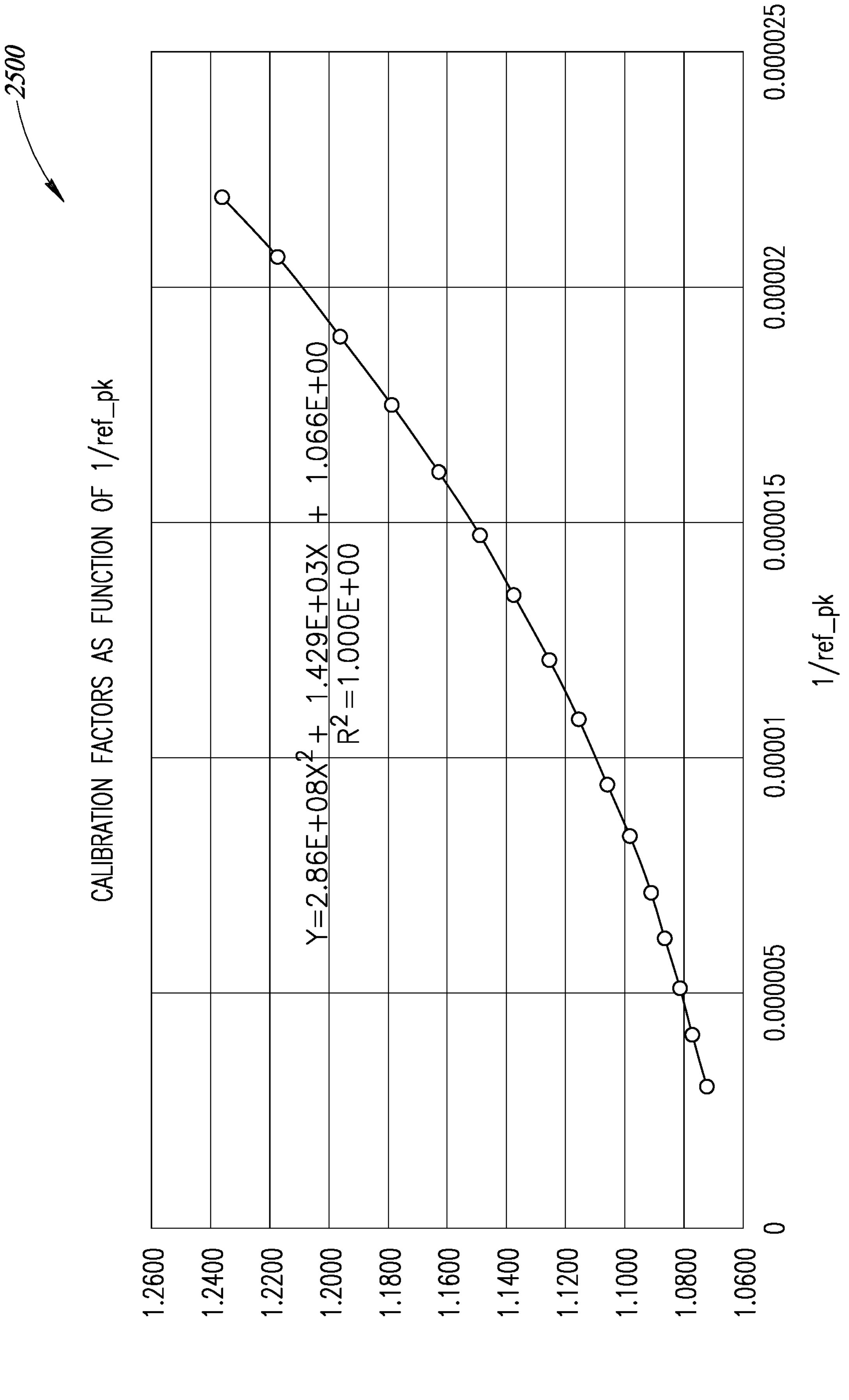
FIG. 25 is a graph that shows a calibration factor as a function of the inverse of a reference current signal detected by a conductive sensor, according to one non-limiting illustrated implementation.

FIG. 25 is a graph of the calibration factor (CALF) as a function of the inverse of the reference current signal, i.e., 1/ref_pk. As shown, the points are approximated by a closely fitting quadratic function that has an $R^2$ value of 1.000.

Figure 26A:
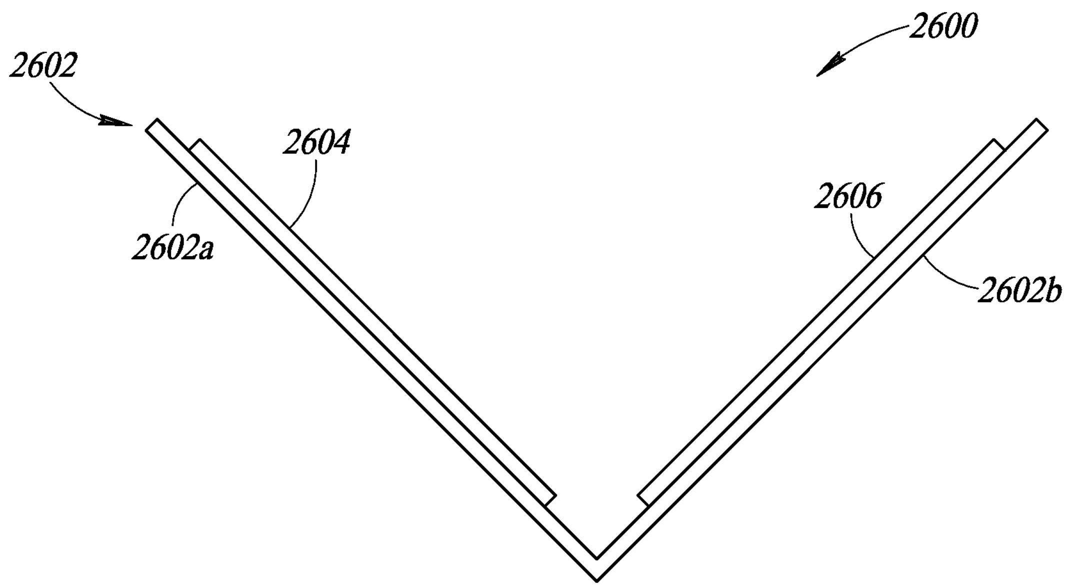
FIG. 26A is a side elevational view of a portion of a front end of an electrical parameter measurement device, showing a V-shaped guard that supports two conductive sensors, according to one non-limiting illustrated implementation.
Figure 26B:
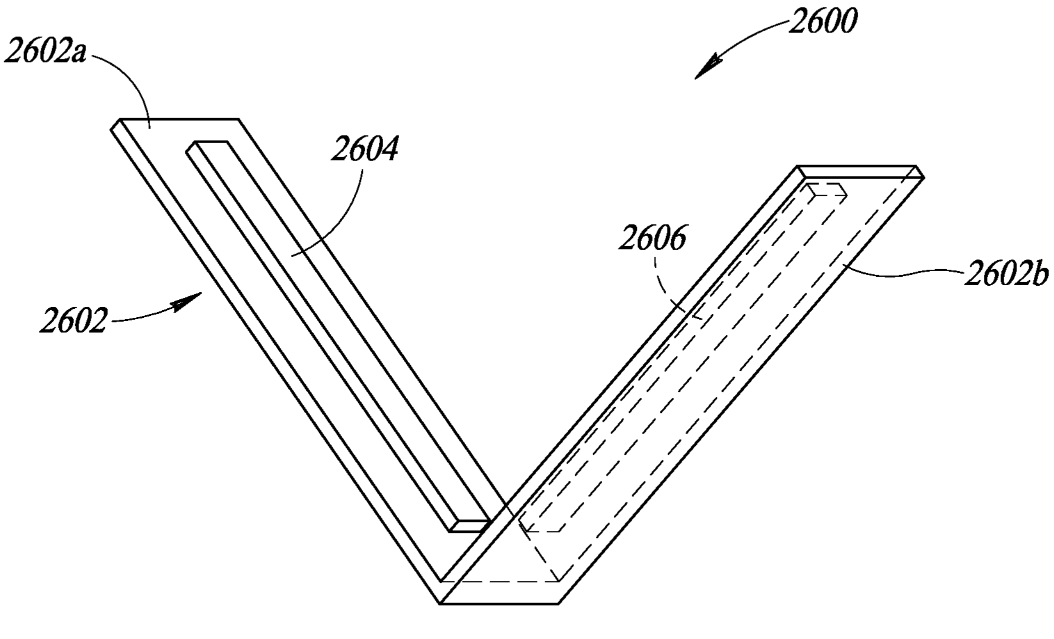
FIG. 26B is a perspective view of the portion of the front end of the electrical parameter measurement device shown in FIG. 26A.

FIGS. 26A and 26B show a portion of a front end 2600 of an electrical parameter measurement device that includes a V-shaped guard 2602 that supports two elongated conductive sensors 2604 and 2606, designated the left sensor and right sensor, respectively, for explanatory purposes. In particular, the guard 2602 includes a left portion 2602*a* (as shown) that supports the left sensor 2604 and a right portion 2602*b* that supports the right sensor 2606. Each of the sensors 2604 and 2606 has a length dimension and a width dimension, and the length dimension is larger than the width dimension. As non-limiting example, the length to width ratio may be 1.5:1, 2:1, 4:1, 8:1, 20:1, 1100:1, etc. Since the sensors 2604 and 2606 are elongated, it may be assumed or estimated that the only variation in detected signals originates from the normal distance between the conductor under test and each of the sensors, such that influences caused by lateral movement at a constant normal distance may be ignored.

Figure 27:
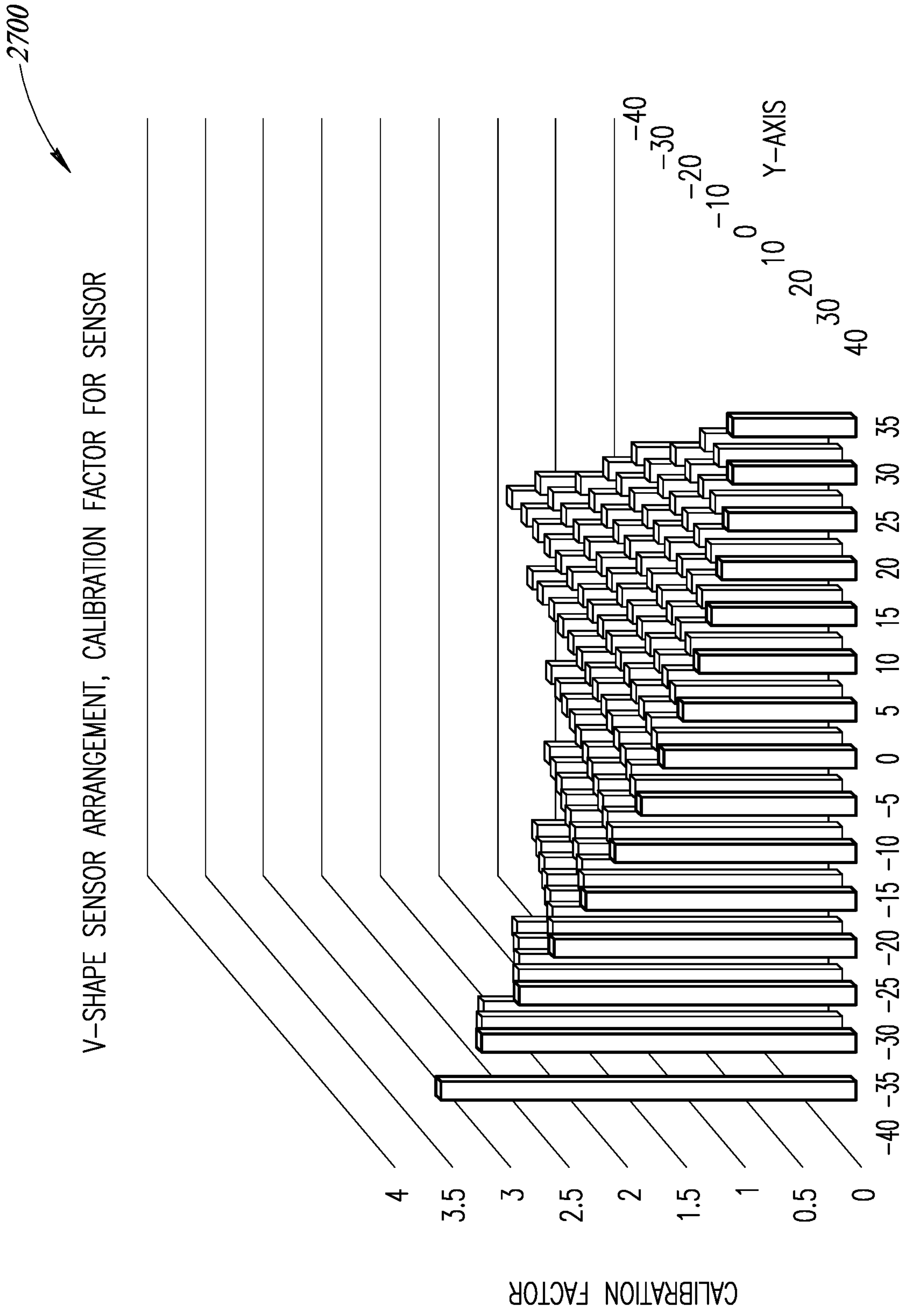
FIG. 27 is a graph that illustrates a schematic representation of the two dimensional normal distance dependence of calibration factors for one of the sensors of the front end shown in FIGS. 26A and 26B, according to one non-limiting illustrated implementation.

Based on the mathematical simplification in representing the distance dependence of the reference current ref_pk and the calibration factor CALF, a measurement grid can be generated that fits within the area of the v-shaped front end 2600. In one example, the sensor 2604 is assumed to be a straight line segment that extends from point A (X=−2; Y=−35) to point B (X=−35; Y=+45) in an X/Y coordinate system, and the sensor 2606 is assumed to be a straight line segment that extends from point A'(X=+2; Y=−35) to point B' (X=+35; Y=+45) in the X/Y coordinate system. For every point, the normal distance to the left sensor 2604 and the right sensor 2606 can be calculated, and the reference current ref_pk and calibration factor CALF derived. A three dimensional representation of the resulting calibration factors for the right sensor 2606 is shown in the graph of FIG. 27.

Figure 28:
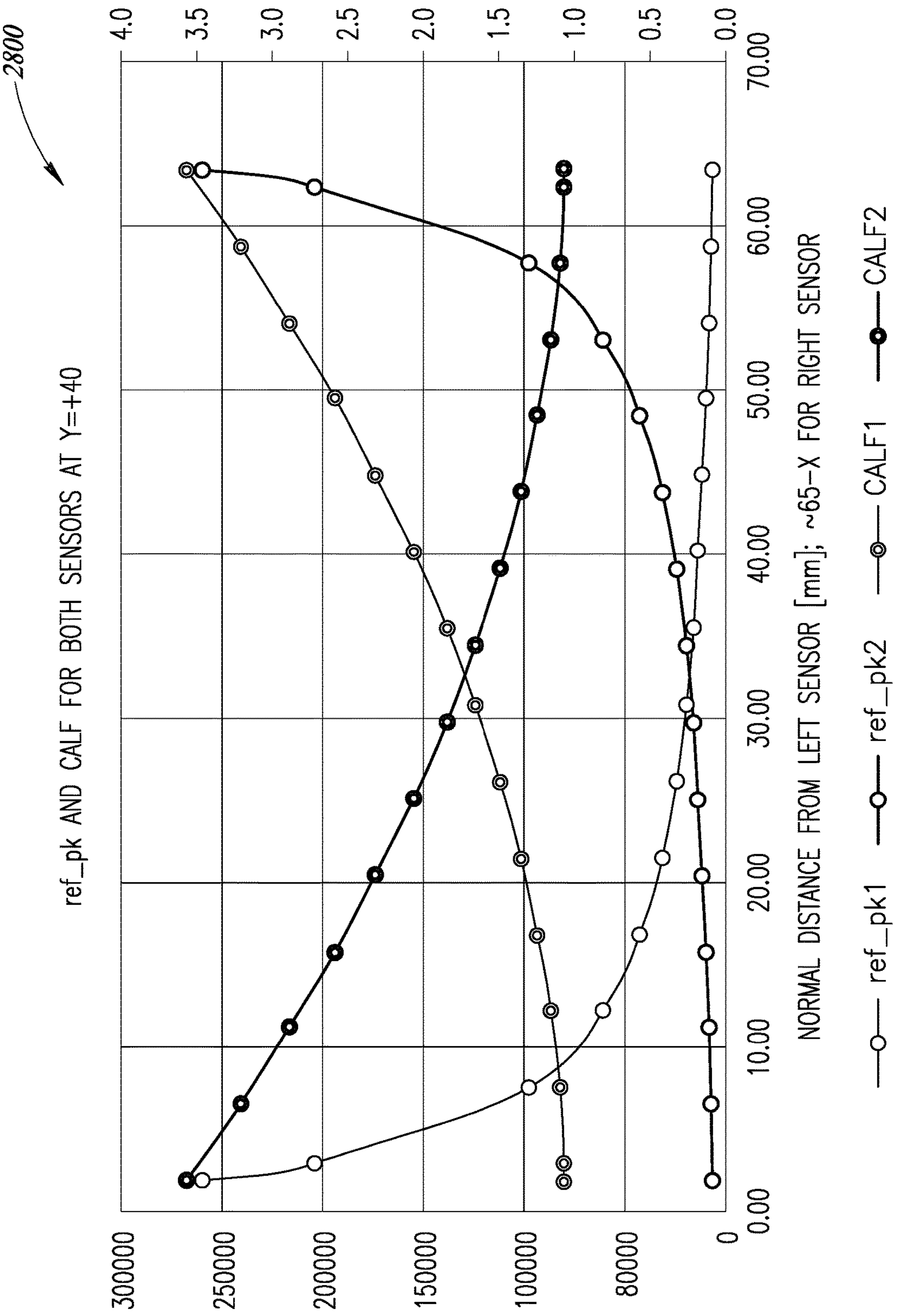
FIG. 28 is a graph that illustrates reference current signals and calibration factors for the two conductive sensors of the front end shown in FIGS. 26A and 26B as a function of normal distance, according to one non-limiting illustrated implementation.

FIG. 28 is a graph 2800 that illustrates reference current signals ref_pk1 and ref_pk2 and calibration factors CALF1 and CALF2 for the sensors 2604 and 2606, respectively, as a function of normal distance, for various X positions when the Y position is fixed at Y=+40.

With a 2D sensor arrangement such as the one shown in FIGS. 26A and 26B, any measurement will provide one value per sensor for the reference current and the corresponding signal measurement. Using such information, the measurement device may determine a suitable calibration factor to compensate for varying distance (e.g., normal distance) to the sensors. Additionally, in at least some implementations, the measurement device may utilize such information to determine the particular X/Y position of a conductor under test.

Figure 29:
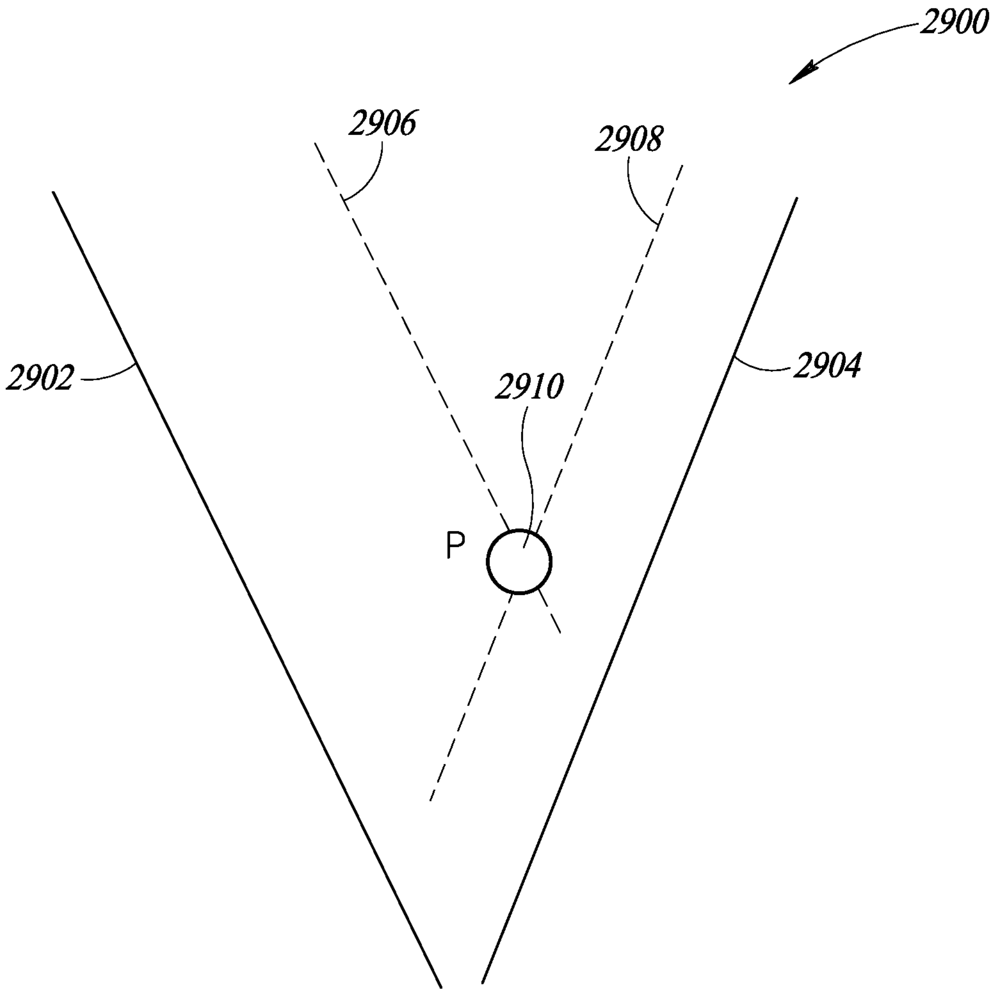
FIG. 29 is a schematic diagram that illustrates position determination for a conductor under test using normal distances derived from reference current signals, according to one non-limiting illustrated implementation.

FIG. 29 shows an example of position determination for a conductor under test using normal distances derived from reference current signals. In FIG. 29, a sensor arrangement 2900 is shown that includes a left sensor 2902 and a right sensor 2904 arranged in a V-shape. A conductor 2910 under test is shown at a position P between the sensors 2902 and 2904. As indicated in the graph 2800 of FIG. 28, the reference current ref_pk can be calculated using the known normal distance. Here, the goal is to derive normal distance information from a measured reference current signal, which requires an inverse function to what is shown in FIG. 28. Since the original functions (ref_pk1 and ref_pk2) are strictly monotonic, respective unique inverse functions can be determined. Then, the inverse functions may be applied to the measured reference currents to obtain normal distance information. In the example shown, a dashed line 2906 indicates the normal distance determined from the sensor 2902, and the dashed line 2908 indicates the normal distance determined from the sensor 2904. The intersection of the lines 2906 and 2908 indicate the location P of the conductor 2910 under test. The location may be used for a variety of purposes including, but not limited to, determining one or more position dependent calibration factors to apply to a measurement of the electrical parameter measurement device to improve its accuracy.

For any given point within the V-shaped arrangement of the sensors discussed herein, one reference current value can be derived for a first sensor (ref_pk1) and one reference current value can be derived for a second sensor (ref_pk2). Based on these values, separate calibration factors can be determined, either through interpolation or by utilizing previously approximated fit functions or other mathematical formulas. Using the two (or more) calibration factors, two (or more) results for the measurement value (e.g., voltage) may be calculated.

In the case of using more than one sensor, there are also additional $V_0$ results available which may be used to calculate an arithmetic average. In at least some implementations, the measurement device may utilize a weighted combination of the results, or may use only one result if one of the calibration factors is outside a determined range. The weighted combination may be a linear weighted combination, exponential weighted combination, etc. The weighted value may prioritize the highest Iref current, which equals the shortest distance sensor to the wire under test and reduces the more unreliable impact of lower Iref currents, e.g., due to stray currents, noise, etc.

As a non-limiting example, the device may be configured to ignore calibration factors that are greater than 1.5 since larger calibration factors indicate larger distances and more inaccurate measurements. In such example, useful calibration factors may be determined to range between 1.0 and 1.5, with calibration factors closer to 1.0 deemed to be better than calibration factors closer to 1.5. Thus, a linear or other weighting may be applied such that a weight of 1.0 is applied to a calibration factor of 1.0 and a weight of 0.0 is applied to a calibration factor of 1.5. For example, the weighted measurement result may be found using the following equation:

$$\text{weighted result [V]} = \frac{W(calf1)\cdot \text{Sns1\_result[V]} + W(calf2)\cdot \text{Sns2\_result[V]}}{W(calf1) + W(calf2)}$$

where the weight for each calibration factor is linearly weighted using the formula W(calfX)=2×(1.5−calfX), and the measurement results for the two sensors are Sns1_result and Sns2_result. In practice, appropriate limits for the calibration factors may be determined using the actual calibration data obtained for a specific instrument or type of instrument.

Figure 30:
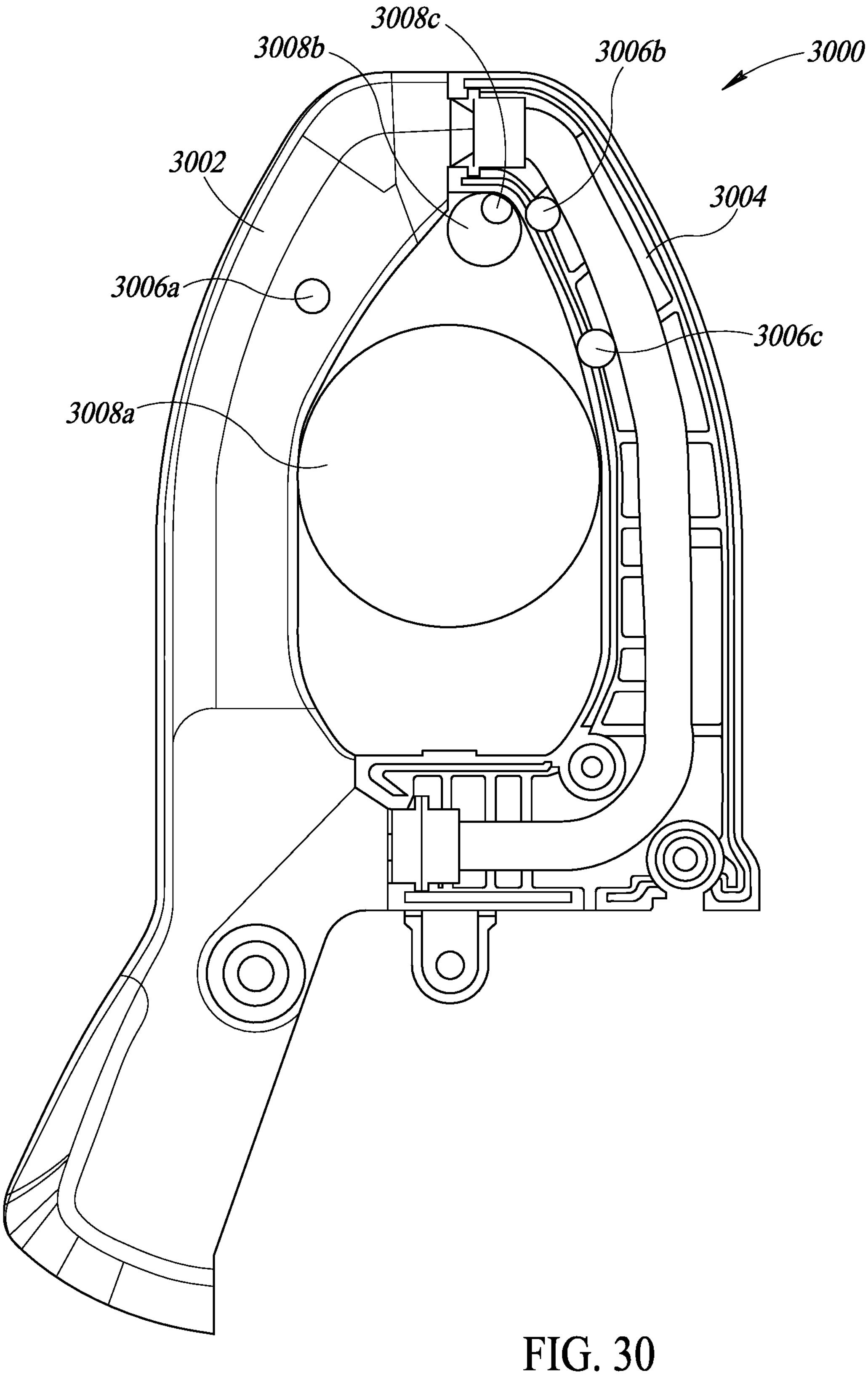
FIG. 30 is a pictorial diagram of a front end of a clamp meter, showing the position of three conductive sensors that may be used to determine the position of a conductor under test and/or to determine one or more calibration factors to be used to improve measurement accuracy, according to one non-limiting illustrated implementation.

FIG. 30 is a pictorial diagram of a front end 3000 of a clamp meter that includes a first clamp portion 3002 and a second clamp portion 3004 that selectively close to form an opening therebetween that is sized and dimensioned to receive a conductor under test, such as the example conductors 3008*a*, 3008*b*, and 3008*c* shown in FIG. 30. In this example, the front end 3000 includes three "point" sensors 3006*a*, 3006*b*, and 3006*c* that may be used to determine the precise location of the conductors 3008 under test, and/or to determine one or more calibration factors to apply to improve measurements of the clamp meter. In the illustrated implementation, the sensors 3006 may be relatively small (e.g., 3×3 mm), which provides an substantially radial variation of detected signals rather than the linear variation provided by the linear sensors 2604 and 2606 shown in FIGS. 26A and 26B. The sensors 3006 may be strategically positioned at locations where the position of a conductor under test may be most accurately determined.

If the area where the wire is located is either mechanically limited or by a defined marked region referred to herein as a "sweet spot" as further discussed below, instead of triangulation another algorithm may be applied to calculate a from all sensors to derive a result with less mathematical effort than the multidimensional triangulation calibration discussed above.

Using the techniques described above, reference current signals may be obtained for each of the sensors 3006*a*, 3006*b*, and 3006*c*, and signals may be processed as discussed above to determine the X/Y location of a conductor under test, which information may be used for calibration or other purposes. For example, an interpolation process may be used to determine the X/Y location and/or calibration factors using obtained reference current signals and previously determined calibration points, as discussed above.

FIGS. 31-37 illustrate various techniques for determining a "sweet spot" location for a conductor or wire under test, which is a defined position within a clamp of a clamp meter where the wire is guided and located by an appropriate mechanical shape, such as a V-shape type structure. The sweet spot position is defined by the center of the wire diameter circle.

Figure 31:
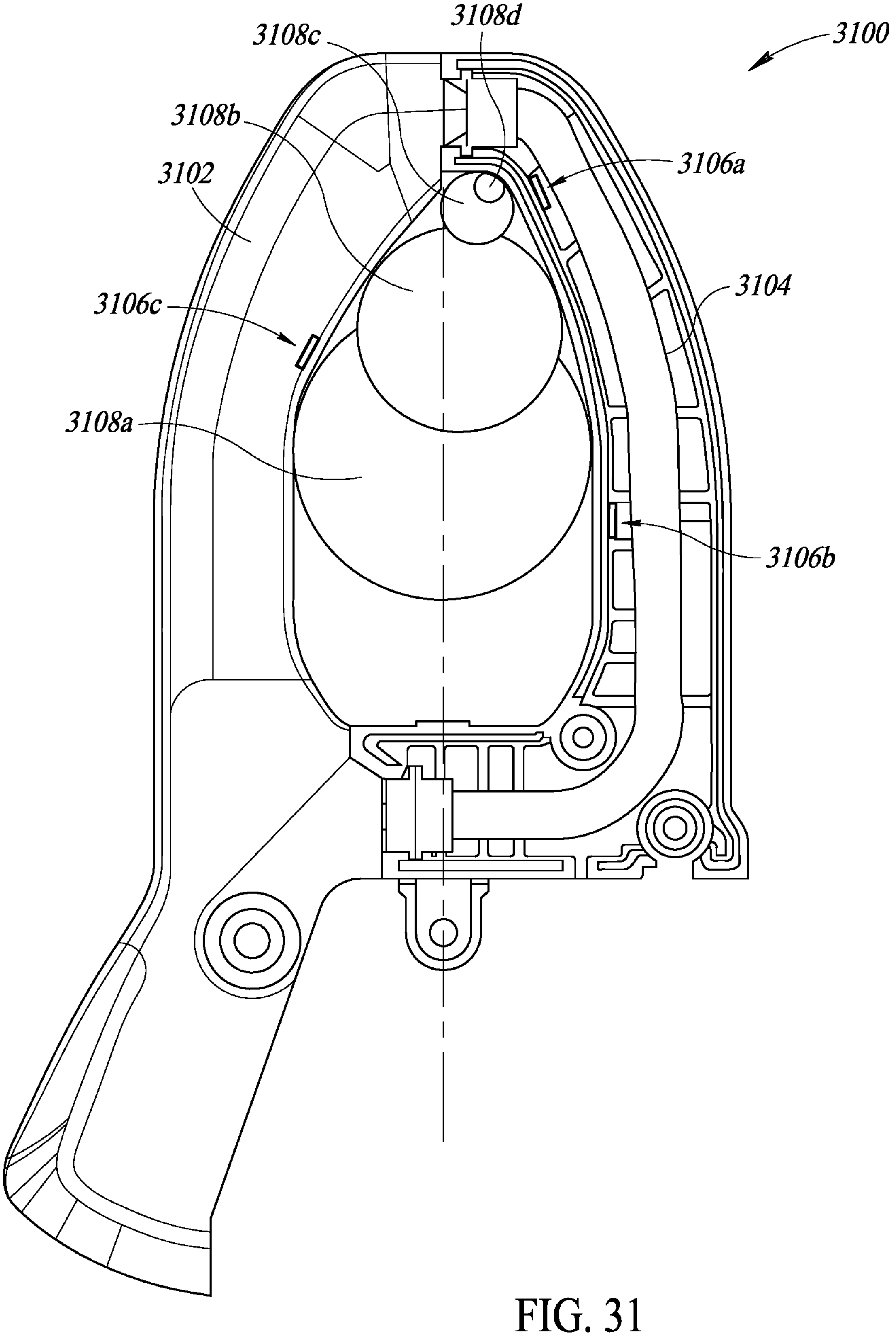
FIG. 31 is a pictorial diagram of a front end of a clamp meter, showing the position of three conductive sensors that may be used to determine the position of a conductor under test and/or to determine one or more calibration factors to be used to improve measurement accuracy, and showing three example conductors having different diameters, according to one non-limiting illustrated implementation.

FIG. 31 is a pictorial diagram of a front end 3100 of a clamp meter that includes a first clamp portion 3102 and a second clamp portion 3104 that selectively close to form an opening there between that is sized and dimensioned to receive a conductor under test, such as the example conductors 3108*a*, 3108*b*, and 3108*c* shown in FIG. 31. In this example, the front end 3100 includes three "point" sensors 3106*a*, 3106*b*, and 3106*c* that may be used to determine the precise location of the conductors 3108 under test, and/or to determine one or more calibration factors to apply to improve measurements of the clamp meter. In the illustrated implementation, the sensors 3106 may be relatively small (e.g., 3×3 mm), which provides a substantially radial variation of detected signals rather than the linear variation provided by the linear sensors 2604 and 2606 shown in FIGS. 26A and 26B. The sensors 3106 may be strategically positioned at locations where the position of a conductor under test may be most accurately determined. In at least some implementations, the sensor 3106*a* may be closest to the wire location at the narrow (top) end of the V-shaped front end 3100.

The –sweet spot area is defined by a maximum distance parameter away from the sensors. This area is the area that delivers a certain measurement accuracy and covers non-perpendicular wires and wires outside of the sweet spot position.

The sweet spot calibration depends on the capability to determine when the wire, which is of unknown diameter, is at the sweet spot. Considering a 3D-space defined by the reference current values of the three sensors, the sweet spot points for the various diameters form a curve in that space.

Below is a description of the math that may be used to implement the sweet spot algorithm, according to one non-limiting illustrated implementation. The calibration method uses three sensors in the illustrated embodiment. The area around sensor 3106*a* (FIG. 31) is referred to herein as the sweet spot area and a mechanical guiding shape leads the wire to a defined mechanical position, the "sweet spot." Due to the V-shape of the front end 3100, the wire position depends on the wire diameter, as shown in FIG. 31.

Because of various influence factors on the reference current (Iref), such as different wire angles from perpendicular, different electrical characteristics of wire insulation (e.g., permittivity), and other environmental effects (e.g., leakage currents), the wire position within the sweet spot area itself will not always deliver acceptable results. Thus, an area around the sweet spot position has to deliver reasonably accurate results.

The calibration algorithm may be based mainly on the different wire diameters located exactly at the sweet spot position creating different reference currents $I_R$. The reference current $I_R$ is defined only by the wire diameter D because position is fixed at the sweet spot position.

In at least some implementations, the range of reference current Iref bin values used may typically be between 20,000 and 2,000,000, for example. The full dynamic range with a Crest Factor CF=2 may be 400,000,000 ($2^{22}$). For a 14 bit ADC=±8192=$\pm 2^{13}$, with an FFT buffer size=$2^{10}$=1024 (512 symmetrical). Therefore absolute maximum bin value is $2^{13}\times 512\ (2^9)=2^{22}$.

It is noted that, in at least some implementations, the FFT algorithm employs a Hanning-windowing function, which already contains a normalizing factor to provide results as RMS values.

Figure 32:
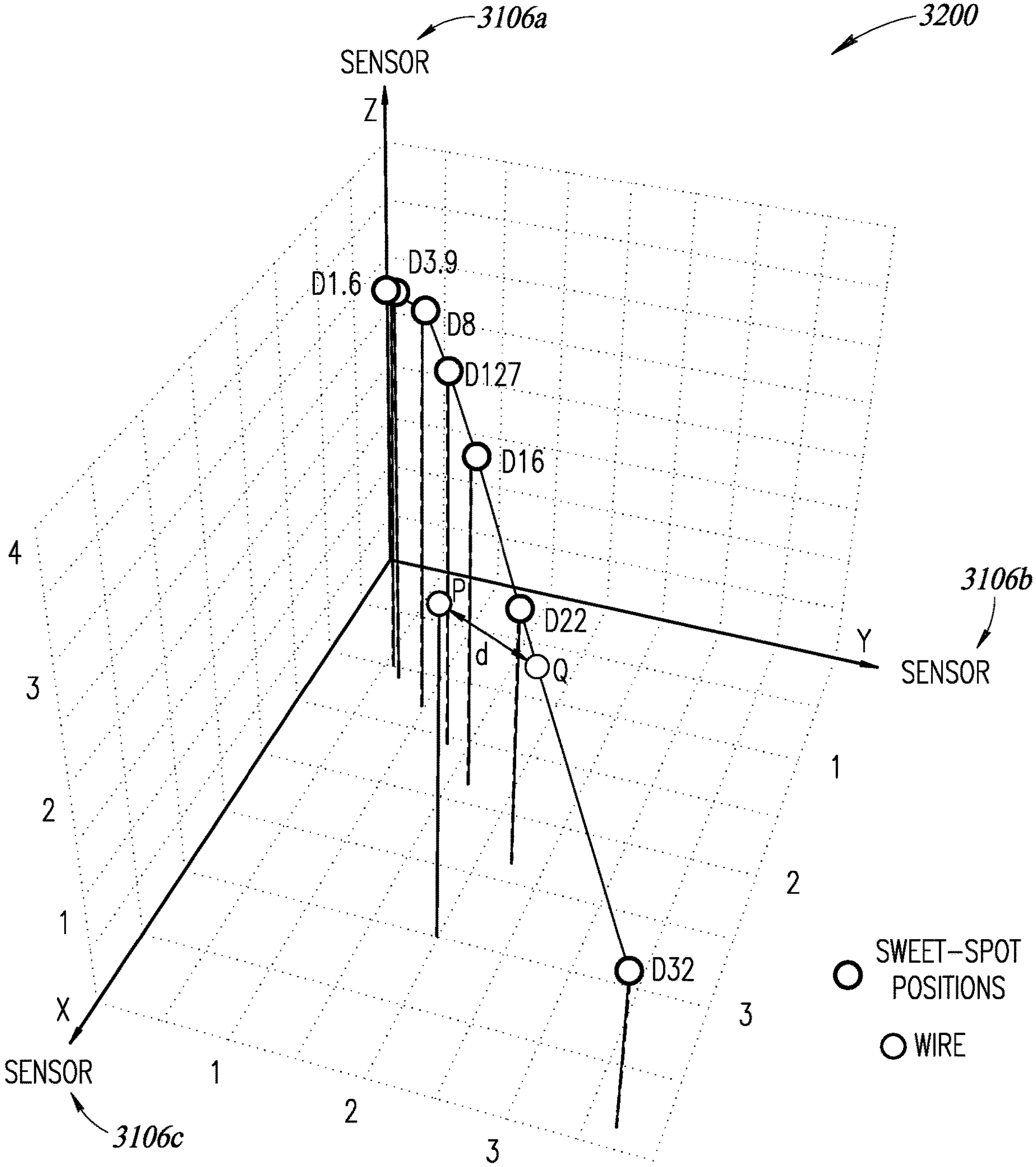
FIG. 32 shows a three dimensional graphical view of sensor signals that may be used for a "sweet spot" determination algorithm of the present disclosure.

For a visible presentation, a graph 3200 of FIG. 32 shows a transformed coordinate system with:

$$X=\ln[I_{ref}(sensor3106c)]-10,$$

$$Y=\ln[I_{ref}(sensor3106b)]-10 \text{ and}$$

$$Z=\ln[I_{ref}(sensor3106a)]-10.$$

The ln(20,000)~10 and the ln(2,000,000=221)~14. If 10 is subtracted, the origin is found (i.e., X=0, Y=0, Z=0).

The graph 3200 is in the form of a ln X/ln Y/ln Z plot. Close to the origin is the smallest wire diameter (D1.6 mm), whereas the point furthest from origin corresponds to 32 mm diameter (D32 mm). As a guide, vertical anchor lines (dashed) to the ground plane at ln(z)=10 have been included. The upper ends of these lines correspond to the sweet spot reference current values (dots) for wire diameters of 1.6 to 32 mm. The connections of the calibration sweet spots are shown with solid lines.

Any instrument reading is represented by a triple of reference current (Iref) values, as discussed above, corresponding to another point P in this 3D-ln sensor space. Math allows for calculation of the shortest distance between this measurement point P and the curve described above (i.e., the solid line between two wires of consecutive diameters). This calculation yields two values: the absolute distance d (P-line segment) to the curve and the base point Q along the curve. The shortest distance d is the line between points P and Q. Limiting this distance as well as requiring the base point to be located in proximity of the linear curve segment allows for definition of the extent of the sweet spot area. It is noted that the lines making up the segments of the curve are infinite. Even if a short distance can be derived, this may not be considered a valid solution if the base point Q is well outside the range of the defining curve points.

Due to the special shape of the front end 3100, wires larger than 8 mm in diameter, such as conductors 3108*a* and 3108*b* of FIG. 31, are forced to a greater distance from the sensor 3106*a* and closer to the sensors 3106*b* and 3106*c*.

Figure 33:
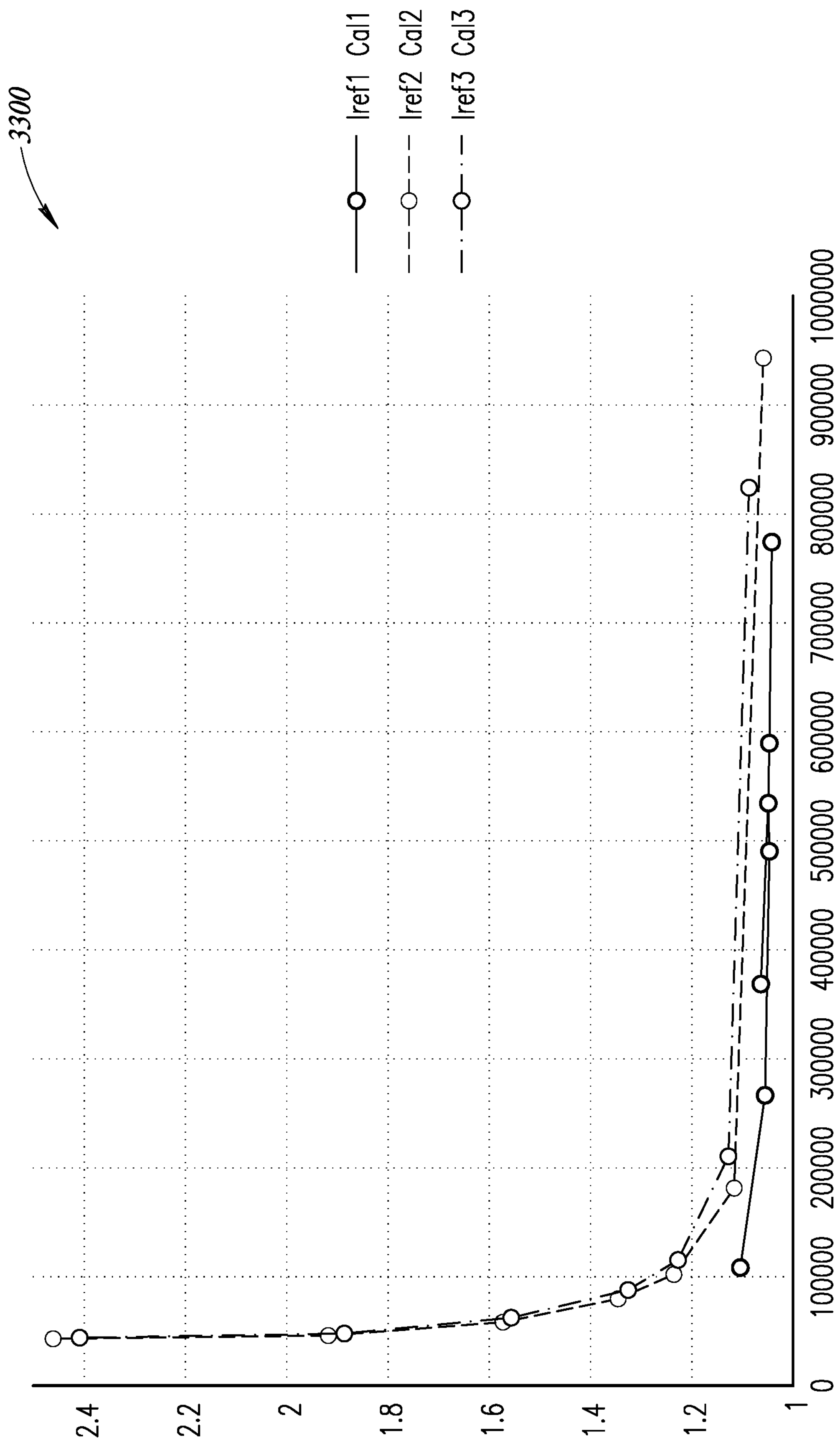
FIG. 33 shows a graph of calibration factors (Y-axis) for a range of reference currents (X-axis) for a plurality of sensors of a non-contact measurement device, according to one non-limiting illustrated implementation.
Figure 34:
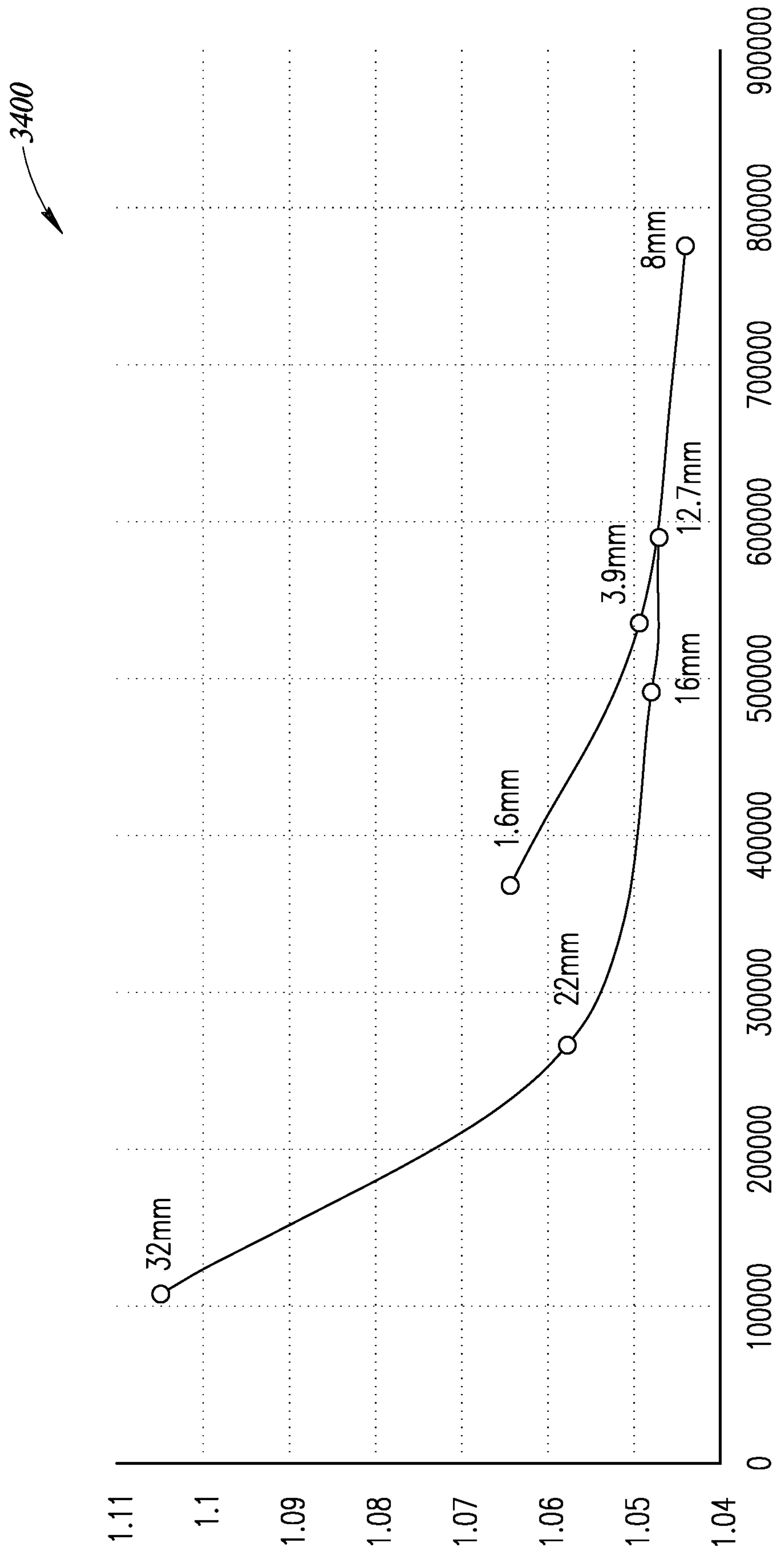
FIG. 34 shows a graph of calibration factors (Y-axis) for a sensor of a non-contact measurement device for a range of reference currents (X-axis) for wires having various diameters.

FIG. 33 shows a graph 3300 of the calibration factors (Y-axis) for a range of reference currents (X-axis) for the sensors 3106*a* (Cal1), 3106*b* (Cal2), and 3106*c* (Cal3). FIG. 34 shows a graph 3400 of calibration factors (Cal1, Y-axis) for the sensor 3106*a* for a range of reference currents (X-axis) for wires having diameters that range from 1.6 mm to 32 mm.

Figure 35:
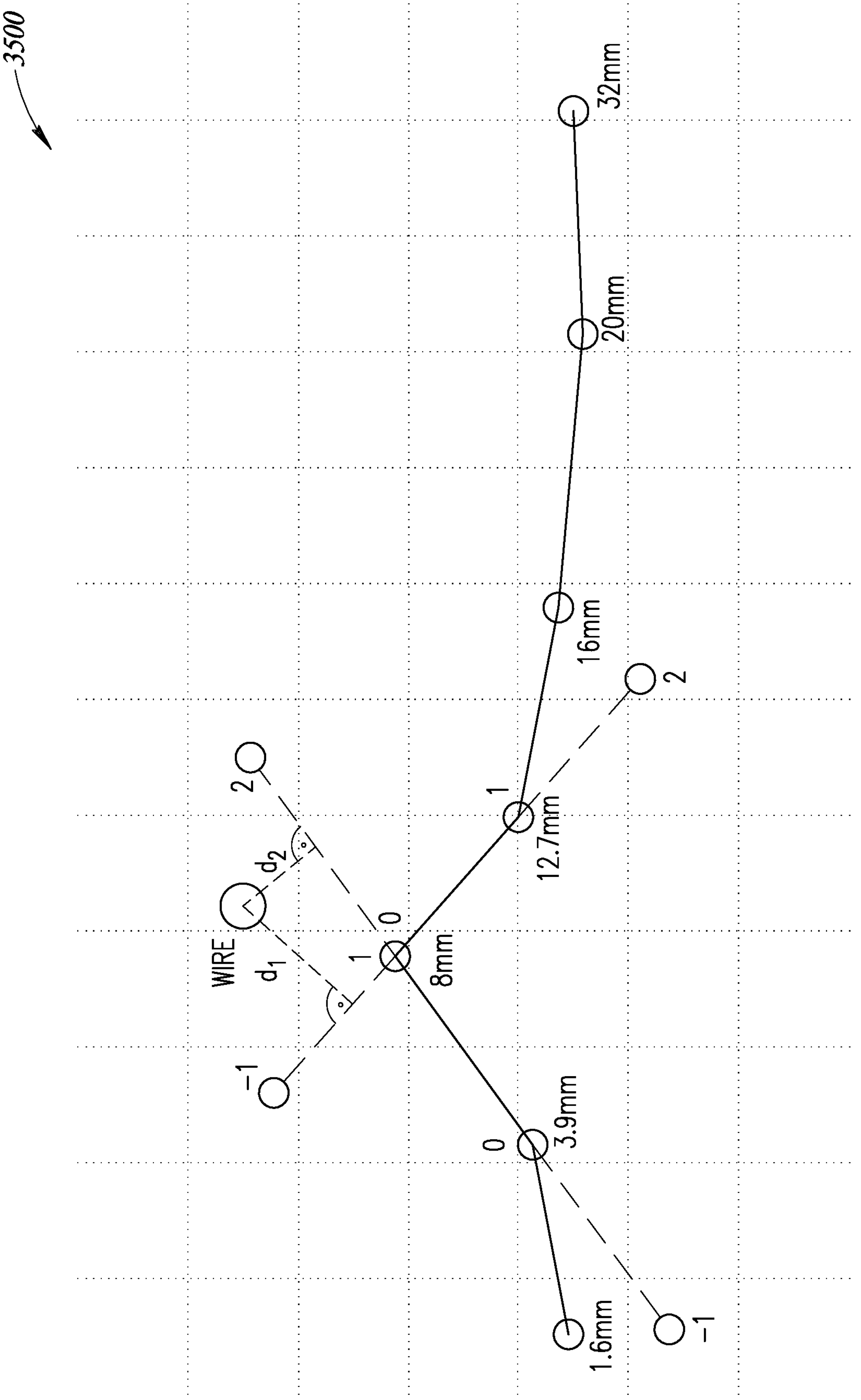
FIG. 35 illustrates a graph that shows the calculation of a shortest distance from a wire under test to calibration line segments, according to one non-limiting illustrated implementation.

FIG. 35 illustrates a graph 3500 that shows the calculation of the shortest distance from the wire under test to calibration line segments. A suitable distance algorithm uses the left and right side (as shown) of the sweet spot line segment (an artificial extension) 0-1. This length can be optimized by a factor between 0 and 1 of the length of the original line segment 0-1 and its extension line segments −1-0 on the left side and 1-2 on the right side, as shown in FIG. 35. The extension helps to obtain the shortest distance, such as $d_1$ or $d_2$, from the wire to the sweet spot calibration points.–.

Depending on the length of the extension, the suppression from external wires can be controlled, but also the sweet spot size will get smaller.

A distance parameter DST may be defined as 5×PQ/OQ, wherein PQ is the shortest distance from the wire to the curve, and OQ is the distance from the origin to the base point Q (FIG. 32). This distance parameter DST "normalizes" the distance for widely varying reference current $I_{ref}$ values and can be used as a metric for proximity to the sweet spot, in other words, the total sweet spot area.

Figure 36:
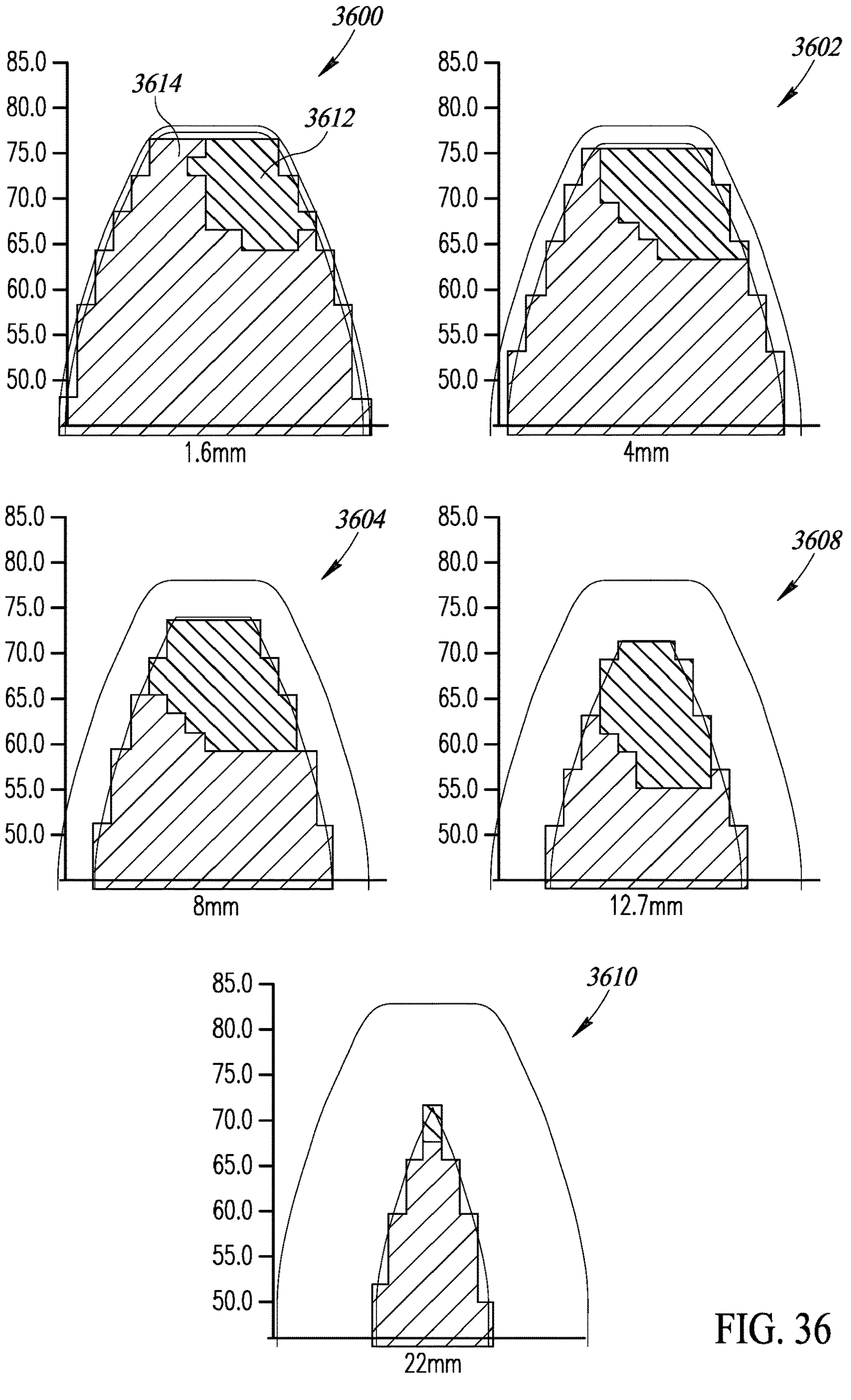
FIG. 36 shows a plurality of views of sweet spot areas and areas outside of sweet spot areas for a plurality of conductors under test having different diameters, according to one non-limiting illustrated implementation.

This algorithm is employed and shown in graphs 3600, 3602, 3604, 3608, and 3610 of FIG. 36, wherein non-sweet spot areas are marked in shading 3614 and do not provide any calculation results in this method.

The areas with shading 3612 constitute the output of the actual sweet spot calibration algorithm. Readings from all three sensors 3106 are combined with their respective calibration factors to produce a weighted overall result.

Having determined proximity to the sweet spot, an actual calibrated value is derived by applying a weighting factors for the three sensor results, favoring the sensor with the lowest distance (i.e., the highest reference current $I_{ref}$). To increase the dominance of the highest reference current $I_{ref}$, a square weighting function may be used:

$Sensor_{x\ result\ in\ [V]}$ is calibrated result for sensor x=1, 2, 3

$$W(calfx)=I_{refx}^2 \text{ the squared reference current for sensor } x=1,2,3=$$

-continued $$\text{weighted result }[V]=\frac{W(calf1)\cdot Sensor1_{result[V]}+W(calf2)\cdot Sensor2_{result[V]}+W(calf3)\cdot Sensor3_{result[V]}}{W(calf1)+W(calf2)+W(calf3)}$$

$$\text{with } W(calfx)=Iref_x^2 \text{ with } x=1,2,3$$

As an example, for the sweet spot method, the output for the different x/y positions is shown in a table 3700 of FIG. 37.

With a distance factor limit of dd=2.2. If the distance factor limit dd is greater than the limit, then the calset (T6 distance) algorithm may be used instead of the sweet spot algorithm, as shown in the table 3700.

Figure 38:
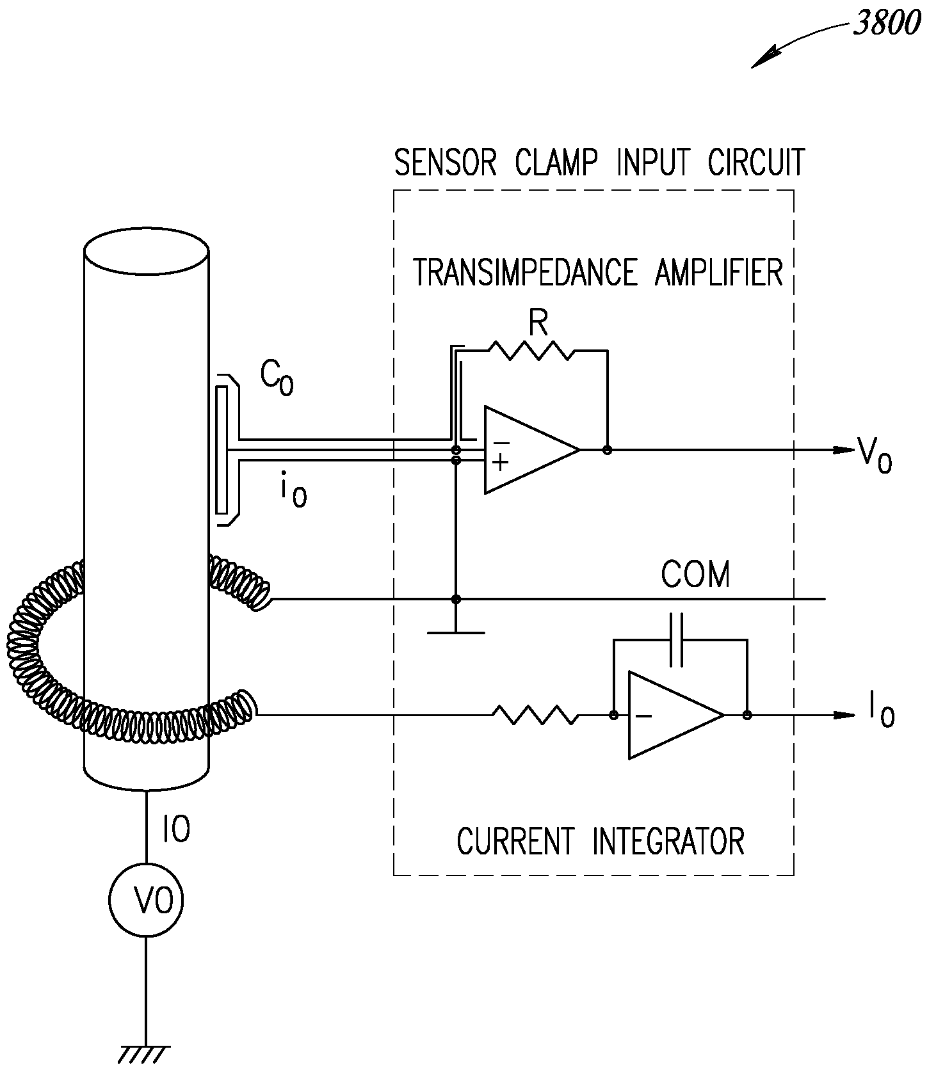
FIG. 38 is a schematic view of a sensor clamp input circuit that includes a transimpedance amplifier and a current integrator to measure the voltage and current, respectively, in a conductor under test.

Signal integration methods are now described with reference to FIGS. 38-40. FIG. 38 shows a sensor clamp input circuit 3800 that includes a transimpedance amplifier and a current integrator to measure the voltage and current, respectively, in a conductor or cable under test. As discussed above, a non-contact measurement method based on the formula for fundamental values:

$$\frac{V_0}{V_R}=\frac{I_0\times f_R}{I_R\times f_0}$$

$$V=\frac{Isignal(40-70\text{ Hz})}{Ireference(2419\text{ Hz})}\times\frac{\text{Frequency reference }(2419\text{ Hz})}{\text{Frequency input }(40-70\text{ Hz})}\times Ureference\ (8V_{pp})$$

This formula inherently produces an input current signal multiplied by frequency due to the capacitive coupling of the signals and is converted to a voltage by the transimpedance input amplifier. Also, a Rogowski coil coupled to the current integrator generates a frequency proportional signal for the current with 90° phase shift.

Furthermore, integration for Rogowski coils may be done with a hardware integrator to determine the current signal and produces a phase shift with respect to the voltage signal by approximately 90°, due to this analog integrator and no further calculation is needed for the regeneration of the original current waveform from the ADC samples.

Integration of the voltage signal eliminates the scaling with frequency and introduces a similar 90° shift, correctly aligning voltage and current signals again. Due to the filtering, the voltage signal may have a small phase shift (e.g., less than 10°), which needs to be compensated by introducing a phase shift interpolation.

The following section explains a procedure to preserve absolute scaling when performing integration, yielding the "true" voltage result as a final output.

It is assumed to have a voltage signal with the magnitude parameter $A=V_{sig}$ containing the proper voltage scaling based on the normalized 50 Hz frequency, of the form:

$$V'_{sig}(t)=V_{sig}(t)\cdot\frac{f_{sig}}{50}=A\cdot\frac{f_{sig}}{50}\cdot\sin(2\pi f_{sig}t)$$

Integration yields, eliminating the proportionality to frequency as expected:

$$\int V'_{sig}dt=\int A\cdot\frac{f_{sig}}{50}\cdot\sin(2\pi f_{sig}t)dt=-A\cdot\frac{1}{100\pi}\cdot\cos(2\pi f_{sig}t)$$

However, the desired result is $A\cdot\cos(2\pi f_{sig}t)$, which is the correctly scaled and phase shifted signal. Furthermore, we substitute numerical integration by a simple summing of individual ADC results, determined by collecting N samples at $f_{sample}$ frequency and therefore a "strip-width" per sample of $1/f_{sample}$. Other numerical algorithms may be used, such as Gauss-Legendre quadrature, for example.

$$\begin{aligned}A\cdot\cos(2\pi f_{sig}t)&=-100\pi\cdot\int V'_{sig}dt\\&\cong-100\pi\cdot\sum_{i=0}^{N-1}ADC_i\cdot\frac{1}{f_{sample}}\\&=\frac{-100\pi}{f_{sample}}\cdot\sum_{i=0}^{N-1}ADC_i\end{aligned}$$

$$\text{with } ADC_i=A\cdot\frac{f_{sig}}{50}\cdot\sin\left(2\pi f_{sig}\frac{i}{f_{sample}}\right)$$

The resulting integrated waveform may be determined as individual points by evaluating the sum indicated above, up to the desired sampling point j as $$\text{VOLT\_integrated}_j\cong\frac{-100\pi}{f_{sample}}\cdot\sum_{i=0}^{j-1}ADC_i$$

Though it may be assumed that, for full cycle periodic signals, the summing of sampling points representing a step function is sufficiently accurate, compensating errors from rising slope sections on the falling slope sections, this may not be true for partial cycle or non-periodic signals. Thus, more elaborate methods may be used to minimize errors introduced by numerical integration.

Example calibration processes are discussed below with reference to FIGS. 39 and 40. The term "calibration" is used herein to indicate traditional calibration against an outside standards as well as correction of influence factors.

Calibration may comprise adjustment of gain correction factors for all input channels to allow smooth transition from the high sensitive input (i.e., low voltage range, generally 4.2 times more sensitive) to the low sensitive input channel (high voltage range). For the dual current channels, the difference in sensitivity may generally be approximately 10×.

Furthermore, calibration may include the adjustment of the Vref correction factor to make the $V_{RMS}$ reading of the reference signal output coincide with the instrument's internal determination of Vref. Essentially, this is a calibration of the gain network in the Vref signal input path. All voltage readings may be based on this calibration against an absolute outside voltage measurement.

With the formula described under the non-contact method discussed above, the output value depends on the ratio $I_{SIGNAL}/I_{REF}$ ($I_O/I_R$), apart from the signal frequency, discussed further below. With varying diameter of the conductor under test and varying distance from the sensor, the reference current $I_{REF}$ as well as the signal current $I_{SIGNAL}$ change, but the ratio stays approximately the same for a given voltage. "Approximately" sums up a number of influence terms such as stray fields, sensor coverage by wire, etc. Generally, the signal current $I_{SIGNAL}$ drops off faster than the reference current $I_{REF}$ because the latter is "boosted" by, among other things, stray fields with increasing distance and shrinking reference current $I_{REF}$. This can be largely corrected by a table of correction factors (also referred to herein as a reference current $I_{REF}$ calibration table) to enhance the ratio by a specific value, dependent on the reference current $I_{REF}$, as discussed elsewhere herein.

Figure 39:
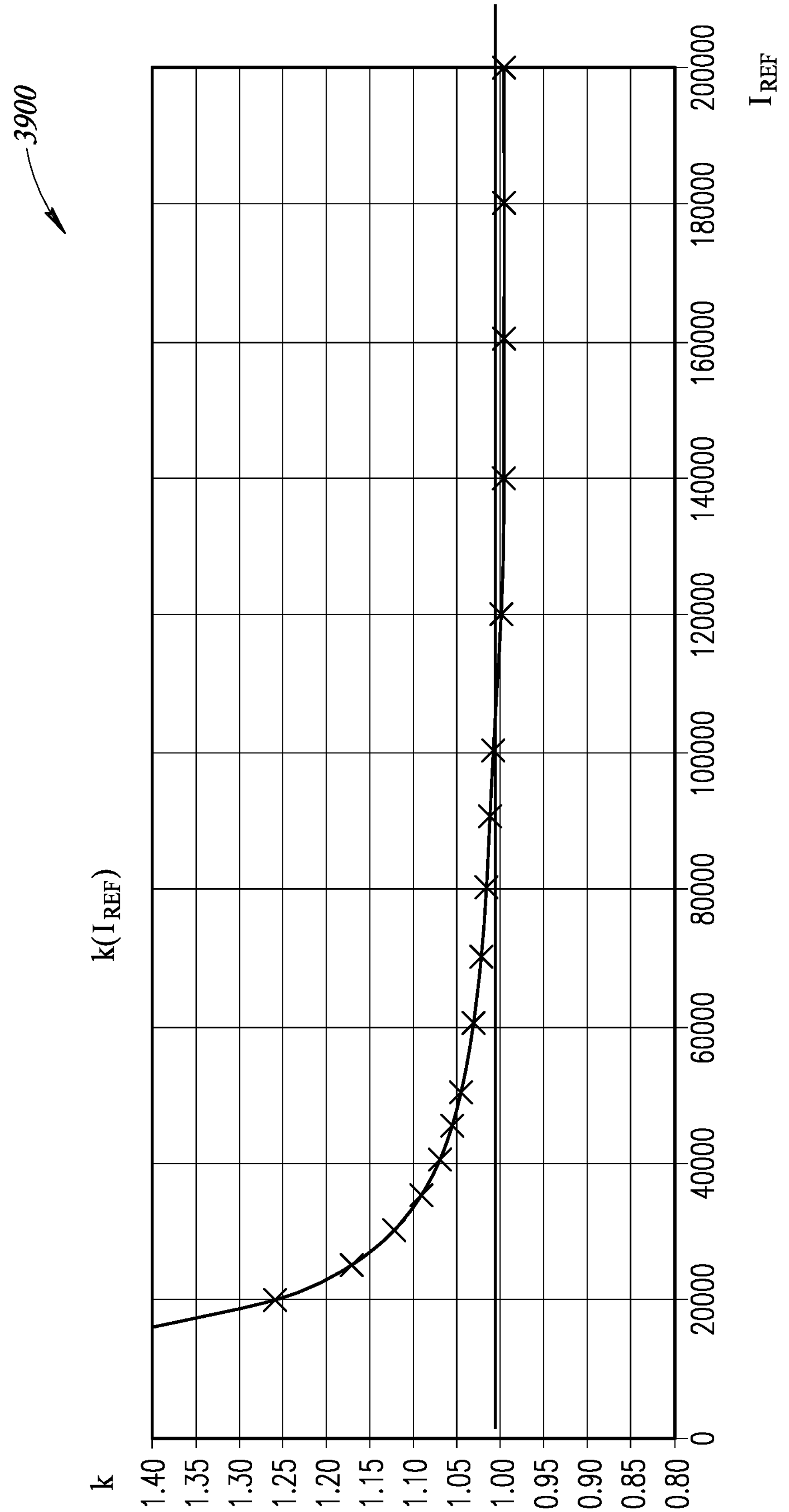
FIG. 39 shows a graph that illustrates a characteristic dependence of a correction factor k on a reference current signal.

FIG. 39 shows a graph 3900 that illustrates the characteristic dependence of a correction factor k on the reference current $I_{REF}$.

Frequency may be a different concern. The non-contact measurement method implicitly scales the input signal proportionally with frequency, wherefore the term $f_{REF}/f_{SIGNAL}$ appears in the formula. The reference frequency $f_{REF}$ can be considered a constant for the present discussion. The division of the reference frequency by the signal frequency $f_{SIGNAL}$ can be applied in at least two ways: (1) determination of FFT content (e.g., square peak sum) of a single frequency of interest (fundamental of signal) and division by center frequency ($f_{SIGNAL}$); or (2) normalization of the entire frequency spectrum by multiplying all FFT-bins with nominal_frequency/bin_frequency. The nominal_frequency can be chosen (e.g., 50 Hz, 60 Hz).

However, due to windowing of the original signal (application of the cosine bell Hanning window function before calculating the FFT), a slight error is introduced. Assume evaluation of a single frequency signal centered at an arbitrary FFT-bin. Subsequent to above discussion, this would require a single normalization with the factor of nominal_frequency/bin_frequency. However, windowing causes this signal to appear in the adjacent frequency bins with an approximate ratio of 1:2:1. The neighboring bins, resulting from the same single frequency source, will receive a different normalization factor based on their respective center bin frequencies, as opposed to treating all components originating from the source signal with a single correction factor. The deviation introduced depends on the signal frequency in relation to the frequency step between bins. With a bin interval of 10 Hz, for example, the frequency difference in neighboring bins amounts to 1% at 1000 Hz signal frequency (neighboring bins at 990 and 1010 Hz), but it grows to a 20% difference at 50 Hz (neighboring bins at 40 and 60 Hz).

Figure 40:
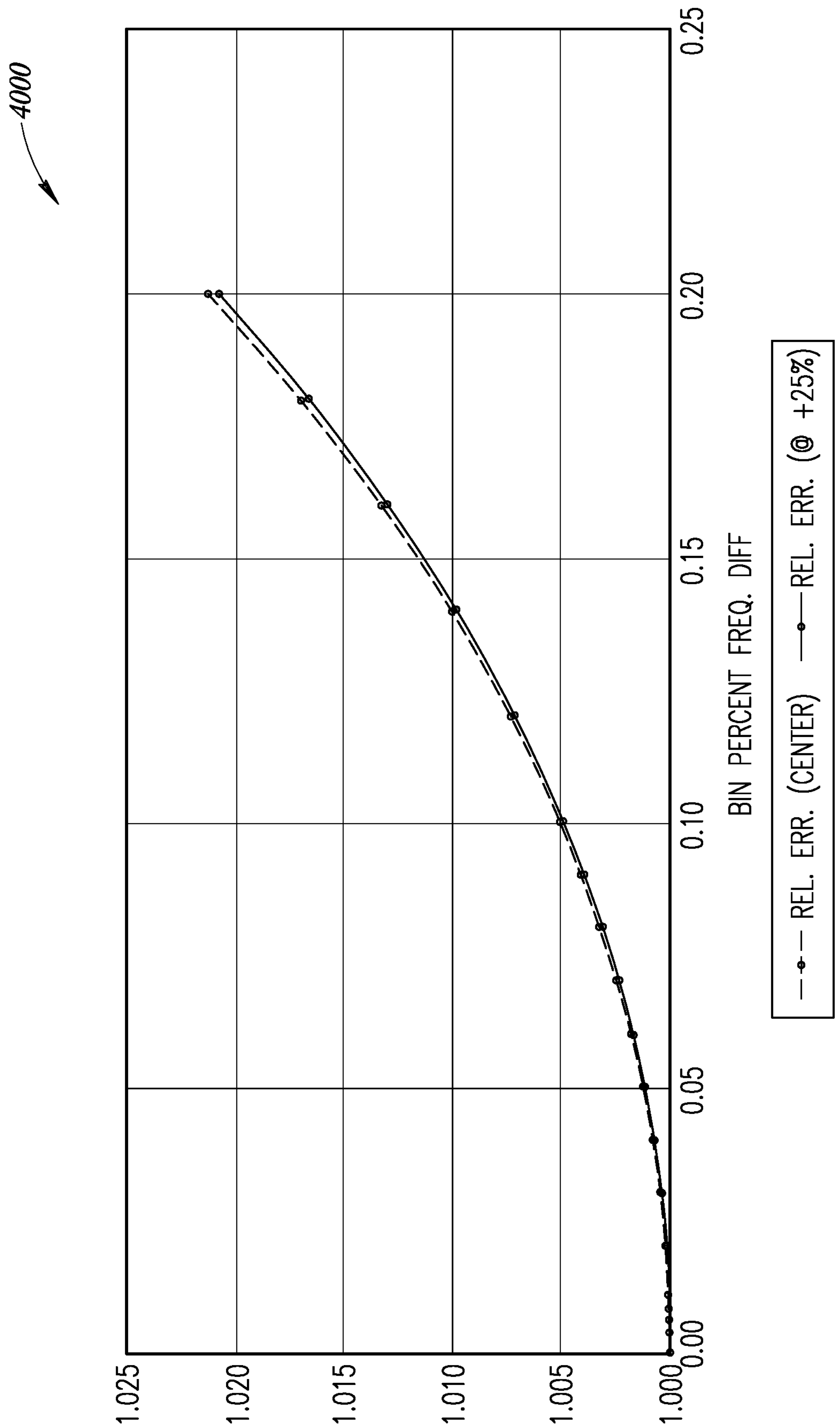
FIG. 40 shows a graph that illustrates the relative error introduced after RMS summing of normalized FFT bins in relation to a single correction factor approach, according to one non-limiting illustrated implementation.

FIG. 40 is a graph 4000 that shows the relative error introduced after RMS summing of the appropriately normalized bins in relation to the "single correction factor" approach. As shown, the relative error does not exceed 2.1% at the maximum deviation of 20% at 50 Hz (for 10 Hz bin difference), as indicated by the dashed line.

If the signal frequency is not centered at a bin, but falls at 25% of the bin interval (e.g. 52.5 Hz for a 10 Hz bin interval), the solid line results. Slight differences result from the modified distribution of energy in the bins and the different applicable normalization factors. Based on signal frequency and bin interval, which is based on actual sampling frequency, this correction can be applied as well to mitigate the effects of windowing and uniform normalization of nominal_frequency/bin_frequency.

An example calibration procedure involves determination of the fundamental signal frequency and evaluating the signal magnitude and reference magnitude at their respective frequencies for the overall result below:

$$V_{sig} = V_{ref} \cdot \frac{pk_{sig}}{pk_{ref}} \cdot \frac{\frac{f_{ref}}{50}}{\frac{f_{sig}}{50}} \cdot k_{pk_{ref}}$$

$V_{ref}$ and $f_{ref}$ may be assumed to be constant, with $k_{pkref}$ being the correction factor discussed above.

For a single signal frequency, if it is accepted that the output signal scales proportionally with frequency, then it follows that:

$$V'_{sig} = V_{sig} \cdot \frac{f_{sig}}{50} = \frac{pk_{sig}}{pk_{ref}} \cdot V_{ref} \cdot \frac{f_{ref}}{50} \cdot k_{pk_{ref}} = \frac{pk_{sig}}{pk_{ref}} \cdot c,$$

$$c = V_{ref} \cdot \frac{f_{ref}}{50} \cdot k_{pk_{ref}}$$

As shown above, $V'_{sig}$ essentially depends on the ratio of $pk_{sig}/pk_{ref}$ only, combining all other factors in the constant c. However, we may be interested in transmitting the ADC waveform's data and need to find the scaling factor such that:

$$V''_{sig+ref} = ADC_{RMStotal} \cdot \text{scaling\_factor}$$

whereby $ADC_{RMStotal}$ indicates the RMS value of the ADC waveform including the reference frequency. It is noted that the constant c characterizes the reference peak as "seen" by the instrument in volts (V).

$V''_{sig+ref}$ indicates the resultant voltage after considering both the signal and reference RMS component. It is noted that RMS values can be summed quadratically as:

$$\text{sum}_{RMS} = \sqrt{a_{RMS}^2 + b_{RMS}^2}$$

In ADC units, we take note of the identity (expressed in peak values instead of RMS):

$$ADC_{RMStotal} \cdot \sqrt{2} = \sqrt{pk_{sig}^2 + pk_{ref}^2} \; \frac{ADC_{RMStotal} \cdot \sqrt{2}}{pk_{ref}} \cdot c = \sqrt{\left(\frac{pk_{sig}}{pk_{ref}} \cdot c\right)^2 + \left(\frac{pk_{ref}}{pk_{ref}} \cdot c\right)^2} = \sqrt{\left(V'_{sig}\right)^2 + \left(V'_{sigref}\right)^2}$$

where the right hand side characterizes the RMS summing for the signal and reference in volts (V), yielding:

$$\text{scaling\_factor} = \frac{\sqrt{2}}{pk_{ref}} \cdot c = \frac{\sqrt{2}}{pk_{ref}} \cdot V_{ref} \cdot \frac{f_{ref}}{50} \cdot k_{pk_{ref}}$$

This scaling factor depends on $pk_{ref}$, with $k_{pkref}$ also depending on $pk_{ref}$ and provides the conversion from ADC units to Volts for the ADC waveform such that:

$$V_{ADC,i} = (\text{value}_i - \text{DC}_{offset}) \cdot \text{scaling\_factor}$$

The reference component of a signal in volts (V) may easily be obtained with the following equation:

$$V'_{sigref} = c = \text{scaling\_factor} \cdot \frac{pk_{ref}}{\sqrt{2}}, \; V'_{sig} = \sqrt{(V'_{RMStotal})^2 - \left(V'_{sigref}\right)^2}$$

A non-limiting example of the calculation is provided below for the following parameters:

$$V_{ref} = 1.1749V,$$

$$f_{ref} = 2343.75 \text{ Hz},$$

$$k_{pkref} = 1.0;$$

$$c = 55.07344;$$

$$pk_{sig} = 4000,$$

$$\text{pk}_{ref} = 1000,$$

$$f_{sig} = 50 \text{ Hz}.$$

$$V'_{sig} = 4000/1000 \times c = 2202938V;$$

$$V'_{sig+ref} = sqrt(220^2 + 55^2) = 227.0736V$$

$$ADC_{RMStotal} = 2916;$$

$$ADC_{RMStotal} \times sqrt2 \times c / pk_{ref} = 2916 \times 1.4142 \times 55.07344/1000 = 227.1144\ V.$$

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

In view of the foregoing disclosure, various examples of an electrical parameter measurement device, may include any one or combination of the following features: a front end that includes an opening that is sized and dimensioned to receive a conductor under test, a plurality of magnetic field sensors disposed on a support member around the opening, and control circuitry. The plurality of magnetic field sensors comprises a first set of equally spaced apart magnetic field sensors positioned at a first radial distance from a center of the opening, and a second set of equally spaced apart magnetic field sensors positioned a second radial distance from the center of the opening. The second radial distance is greater than the first radial distance. Each magnetic field sensor in the first set is radially aligned with a corresponding magnetic field sensor in the second set. The control circuitry is operatively coupled to the plurality of magnetic field sensors. The control circuitry is configured to receive sensor signals from the plurality of magnetic field sensors, determine a physical position of the conductor under test based at least in part on the sensor signals or using mechanical means, and determine a current parameter of the conductor based at least in part on the sensor signals and the physical position.

The electrical parameter measurement device may further include another feature, such as the physical position of the conductor under test is determined by triangulation of at least three (or exactly sensor signals) received from at least three (or exactly three) magnetic field sensors. Alternatively, the physical position of the conductor under test is determined by triangulation of two sensor signals received from two magnetic field sensors.

The electrical parameter measurement device may further include another feature, such as the current parameter comprises alternating current (AC) or direct current (DC).

The electrical parameter measurement device may further include yet another feature, such as each of the plurality of magnetic field sensors comprises at least one of an anisotropic magnetoresistance (AMR) sensor, a giant magnetoresistance (GMR) sensor, a Hall effect sensor, a fluxgate sensor, or a coil.

The electrical parameter measurement device may further include yet another feature, such as the control circuitry being configured to determine the physical position of the conductor under test using sensor signals from exactly two of the magnetic field sensors.

The electrical parameter measurement device may further include yet another feature, such as at least one of the plurality of magnetic field sensors comprises a first sub-sensor and a second sub-sensor arranged at a 90 degree angle relative to the first sub-sensor.

The electrical parameter measurement device may further include yet another feature, such as each of the plurality of magnetic field sensors is formed in an integrated circuit that includes at least one of the other of the magnetic field sensors.

The electrical parameter measurement device may further include yet another feature, such as each magnetic field sensor of the first set is formed in an integrated circuit with its corresponding, radially aligned magnetic field sensor of the second set.

The electrical parameter measurement device may further include yet another feature, such as each of the magnetic field sensors of the first set of magnetic field sensors are coupled in series with each other, and each of the magnetic field sensors of the second set of magnetic field sensors are coupled in series with each other.

The electrical parameter measurement device may further include yet another feature, such as each of the magnetic field sensors is separately coupled to the control circuitry.

The electrical parameter measurement device may further include yet another feature, such as the plurality of magnetic field sensors comprises a third set of equally spaced apart magnetic field sensors positioned a third radial distance from the center of the opening that is great than the second radial distance. The control circuitry is operative to determine that at least one of the magnetic field sensors of the first set of magnetic field sensors is saturated due to the amount of current in the conductor under test, and determine the current parameter of the conductor based at least in part on sensor signals from the second and third sets of the magnetic field sensors.

The electrical parameter measurement device may further include yet another feature, such as to determine the current parameter of the conductor, the control circuitry is configured to apply a calibration factor that is dependent on the physical position of the conductor under test.

The electrical parameter measurement device may further include yet another feature, such as wherein the control circuitry is configured to determine that at least one of the magnetic field sensors is saturated, and to ignore the sensor signal from the at least one magnetic field sensor to determine the current parameter of the conductor under test.

The electrical parameter measurement device may further include yet another feature, such as the control circuitry being configured to determine that at least one of the magnetic field sensors is saturated, and responsive to the determination, to replace the sensor signal for the saturated magnetic field sensor with an interpolated sensor signal obtained using sensor signals from magnetic field sensors positioned adjacent the saturated magnetic field sensor.

The electrical parameter measurement device may further include yet another feature, such as a plurality of non-contact voltage sensors operatively coupled to the control circuitry, wherein the control circuitry determines the physical position of the conductor under test based at least in part on sensor signals received from the plurality of non-contact voltage sensors.

The electrical parameter measurement device may further include yet another feature, such as the control circuitry being configured to determine a voltage parameter of the conductor under test based at least in part on sensor signals received from the plurality of non-contact voltage sensors.

The electrical parameter measurement device may further include yet another feature, such as each of the plurality of magnetic field sensors is operative to determine a direction of a magnetic field generated by the conductor under test.

The electrical parameter measurement device may further include yet another feature, such as the control circuitry applies a unique calibration factor for each of the plurality of magnetic field sensors.

In view of the foregoing disclosure, at least one example is directed to a non-transitory computer-readable medium on which a computer program is stored, wherein the computer program, when executed by a processor, implements operations, comprising: sensing, by a device, one or more electrical parameters of a conductor under test; determining a physical position of the conductor under test relative to the device based at least in part on sensor signals related to the conductor under test from a plurality of magnetic field sensors in the device; and computing a current parameter of the conductor based at least in part on the one or more electrical parameters and the physical position of the conductor under test relative to the device.

In view of the foregoing disclosure, various examples of methods of operating an electrical parameter measurement device, may include any one or combination of the following features: placing a conductor under test in an opening of a support member of the electrical parameter measurement device and sensing one or more electrical parameters of the conductor under test. The sensing comprises using a plurality of magnetic field sensors comprising a first set of equally spaced apart magnetic field sensors positioned at a first radial distance from a center of the opening, and a second set of equally spaced apart magnetic field sensors positioned a second radial distance from the center of the opening, the second radial distance being greater than the first radial distance, and each magnetic field sensor in the first set is radially aligned with a corresponding magnetic field sensor in the second set. The method further includes receiving sensor signals from the plurality of magnetic field sensors, determining a physical position of the conductor under test based at least in part on the sensor signals or a mechanical means; and determining a current parameter of the conductor based at least in part on the one or more electrical parameters sensed and the physical position.

The method may further include yet another feature, such as determining the physical position of the conductor under test comprises using sensor signals from exactly two (or exactly three) of the magnetic field sensors.

The method may further include yet another feature, such as determining a direction of a magnetic field generated by the conductor under test.

The method may further include yet another feature, such as determining the physical position of the conductor under test comprises determining a direction of a magnetic field generated by the conductor under test by at least three (or at least two) of the plurality of magnetic field sensors.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An electrical parameter measurement device, comprising:

a front end that includes an opening that is sized and dimensioned to receive a conductor under test;

a plurality of magnetic field sensors disposed around the opening, the plurality of magnetic field sensors comprising a first set of magnetic field sensors positioned at a first radial distance from a center of the opening, and a second set of magnetic field sensors positioned a second radial distance from the center of the opening, the second radial distance being greater than the first radial distance; and control circuitry operatively coupled to the plurality of magnetic field sensors, the control circuitry being configured to:

determine a physical position of the conductor under test within the opening of the front end based at least in part on sensor signals received from at least one of the plurality of magnetic field sensors;

determine a position-dependent calibration factor based at least in part on the physical position of the conductor under test within the opening of the front end of the electrical parameter measurement device; and apply the position-dependent calibration factor to determine a current parameter of the conductor based at least in part on the physical position of the conductor under test and sensor signals received from at least one of the plurality of magnetic field sensors.

2. The electrical parameter measurement device of claim 1, wherein the physical position of the conductor under test is determined by triangulation of at least three sensor signals received from at least three magnetic field sensors.

3. The electrical parameter measurement device of claim 1, wherein the physical position of the conductor under test is determined at least in part by mechanical means.

4. The electrical parameter measurement device of claim 1, wherein the control circuitry is configured to determine the physical position of the conductor under test using sensor signals from exactly three of the magnetic field sensors.

5. The electrical parameter measurement device of claim 1, wherein each of the plurality of magnetic field sensors comprises a first sub-sensor and a second sub-sensor, the second sub-sensor being arranged at a 90 degree angle relative to the first sub-sensor.

6. The electrical parameter measurement device of claim 1 wherein each of the plurality of magnetic field sensors of the first set is formed in an integrated circuit that includes a respective one of the plurality of magnetic field sensors of the second set.

7. The electrical parameter measurement device of claim 1, wherein each of the plurality of magnetic field sensors of the first set is mounted to a support with a corresponding, radially aligned magnetic field sensor of the second set.

8. The electrical parameter measurement device of claim 1, wherein the magnetic field sensors of the first set of magnetic field sensors are coupled in a first series, and the magnetic field sensors of the second set of magnetic field sensors are coupled in a second series.

9. The electrical parameter measurement device of claim 1, wherein each of the plurality of magnetic field sensors is separately coupled to the control circuitry.

10. The electrical parameter measurement device of claim 1, wherein the plurality of magnetic field sensors comprises a third set of magnetic field sensors positioned a third radial distance from the center of the opening that is greater than the second radial distance, and the control circuitry is operative to:

- determine that at least one of the magnetic field sensors of the first set of magnetic field sensors is saturated due to an amount of current in the conductor under test; and
- determine the current parameter of the conductor based at least in part on sensor signals from the second and third sets of the magnetic field sensors.

11. The electrical parameter measurement device of claim 1, wherein determining a position-dependent calibration factor comprises utilizing a lookup table.

12. The electrical parameter measurement device of claim 1, wherein the control circuitry is configured to determine that at least one of the plurality of magnetic field sensors is saturated, and to ignore the at least one of the plurality of magnetic field sensors in determining the current parameter of the conductor under test.

13. The electrical parameter measurement device of claim 1, further comprising a plurality of non-contact voltage sensors operatively coupled to the control circuitry, wherein the control circuitry determines the physical position of the conductor under test based at least in part on sensor signals received from the plurality of non-contact voltage sensors.

14. The electrical parameter measurement device of claim 1, wherein each of the plurality of magnetic field sensors is operative to determine a direction of a magnetic field generated by the conductor under test.

15. The electrical parameter measurement device of claim 1, wherein the control circuitry applies a unique calibration factor for each of the plurality of magnetic field sensors.

16. An electrical parameter measurement device, comprising:

- a front end that includes an opening that is sized and dimensioned to receive a conductor under test;
- a plurality of magnetic field sensors disposed around the opening, the plurality of magnetic field sensors comprising a first set of magnetic field sensors positioned at a first radial distance from a center of the opening, and a second set of magnetic field sensors positioned a second radial distance from the center of the opening, the second radial distance being greater than the first radial distance;
- a plurality of non-contact voltage sensors positioned on the front end of the electrical parameter measurement device proximate to the opening; and
- control circuitry operatively coupled to the plurality of magnetic field sensors and the plurality of non-contact voltage sensors, the control circuitry being configured to:
  - receive sensor signals from at least one of the plurality of magnetic field sensors;
  - receive sensor signals from at least one of the plurality of non-contact voltage sensors;
  - determine a physical position of the conductor under test within the opening of the front end based at least in part on the sensor signals received from the at least one of the plurality of non-contact voltage sensors;
  - determine a position-dependent calibration factor based at least in part on the physical position of the conductor under test within the opening of the front end of the electrical parameter measurement device; and
  - apply the position-dependent calibration factor to determine a current parameter of the conductor based at least in part on the physical position of the conductor under test and the sensor signals received from the at least one of the plurality of magnetic field sensors.

17. The electrical parameter measurement device of claim 16, wherein the control circuitry is configured to determine a voltage parameter of the conductor under test based at least in part on sensor signals received from the plurality of non-contact voltage sensors.

18. A method of operating an electrical parameter measurement device, the method comprising:

- placing a conductor under test in an opening of a support member of the electrical parameter measurement device;
- sensing one or more electrical parameters of the conductor under test, wherein the sensing comprises using a plurality of magnetic field sensors comprising a first set of magnetic field sensors positioned at a first radial distance from a center of the opening, and a second set of magnetic field sensors positioned at a second radial distance from the center of the opening, the second radial distance being greater than the first radial distance;
- determining a physical position of the conductor under test within the opening of the support member, wherein the determining is performed based at least in part on sensor signals received from at least one of the plurality of magnetic field sensors;

determining a position-dependent calibration factor based at least in part on the physical position of the conductor under test within the opening of the electrical parameter measurement device; and applying the position-dependent calibration factor to determine a current parameter of the conductor based at least in part on the physical position of the conductor and the sensor signals received from the at least one of the plurality of magnetic field sensors.

19. The method of claim 18, wherein determining the physical position of the conductor under test comprises using sensor signals from exactly three of the magnetic field sensors.

20. The method of claim 18, wherein determining the physical position of the conductor under test comprises determining a direction of a magnetic field generated by the conductor under test by at least three of the plurality of magnetic field sensors.

* * * * *